(12) United States Patent
Smythe, III et al.

(10) Patent No.: US 11,329,051 B2
(45) Date of Patent: May 10, 2022

(54) GATE DIELECTRIC REPAIR ON THREE-NODE ACCESS DEVICE FORMATION FOR VERTICAL THREE-DIMENSIONAL (3D) MEMORY

(71) Applicant: Micron Technology, Inc., Boise, ID (US)

(72) Inventors: John A. Smythe, III, Boise, ID (US); Gurtej S. Sandhu, Boise, ID (US); Armin Saeedi Vahdat, Boise, ID (US); Si-Woo Lee, Boise, ID (US); Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 78 days.

(21) Appl. No.: 17/005,862

(22) Filed: Aug. 28, 2020

(65) Prior Publication Data

US 2022/0068933 A1 Mar. 3, 2022

(51) Int. Cl.
*H01L 27/108* (2006.01)
*G11C 11/4097* (2006.01)
*G11C 8/14* (2006.01)

(52) U.S. Cl.
CPC .......... *H01L 27/10847* (2013.01); *G11C 8/14* (2013.01); *G11C 11/4097* (2013.01)

(58) Field of Classification Search
CPC .. H01L 27/10847; G11C 8/14; G11C 11/4097
See application file for complete search history.

(56) References Cited

U.S. PATENT DOCUMENTS 10,607,995 B2    3/2020 Roberts et al.
10,726,891 B1 *  7/2020 Prakash ............. G11C 16/3427
(Continued)

OTHER PUBLICATIONS

U.S. Appl. No. 16/204,224, entitled, "Memory Arrays," filed Nov. 29, 2018, 43 pages.

*Primary Examiner* — Edward Chin
(74) *Attorney, Agent, or Firm* — Brooks, Cameron & Huebsch, PLLC

(57) ABSTRACT

Systems, methods and apparatus are provided for a three-node access device in vertical three-dimensional (3D) memory. An example method includes a method for forming arrays of vertically stacked memory cells, having horizontally oriented access devices and vertically oriented access lines. The method includes depositing alternating layers of a dielectric material and a sacrificial material to form a vertical stack. Forming a plurality of first vertical openings to form elongated vertical, pillar columns with sidewalls in the vertical stack. Conformally depositing a gate dielectric in the plurality of first vertical openings. Forming a conductive material on the gate dielectric. Removing portions of the conductive material to form a plurality of separate, vertical access lines. Repairing a first side of the gate dielectric exposed where the conductive material was removed. Forming a second vertical opening to expose sidewalls adjacent a first region of the sacrificial material. Selectively removing the sacrificial material in the first region to form first horizontal openings. Repairing a second side of the gate dielectric exposed where the sacrificial material was removed in the first region. Depositing a first source/drain region, a channel region, and a second source/drain region in the first horizontal openings.

23 Claims, 42 Drawing Sheets

(ALONG CUT-LINE B-B' IN FIG 8A)

(56) References Cited

U.S. PATENT DOCUMENTS

| | | |
|---|---|---|
| 2018/0323200 A1 | 11/2018 | Tang et al. |
| 2019/0103406 A1 | 4/2019 | Tang et al. |
| 2019/0164985 A1 | 5/2019 | Lee et al. |
| 2019/0318784 A1* | 10/2019 | Lee .................. G11C 11/5628 |
| 2019/0371402 A1* | 12/2019 | Lin ..................... G11C 5/063 |
| 2020/0006374 A1* | 1/2020 | Rabkin ............ H01L 29/42352 |
| 2020/0350203 A1* | 11/2020 | Fratin .................... H01L 45/06 |

\* cited by examiner

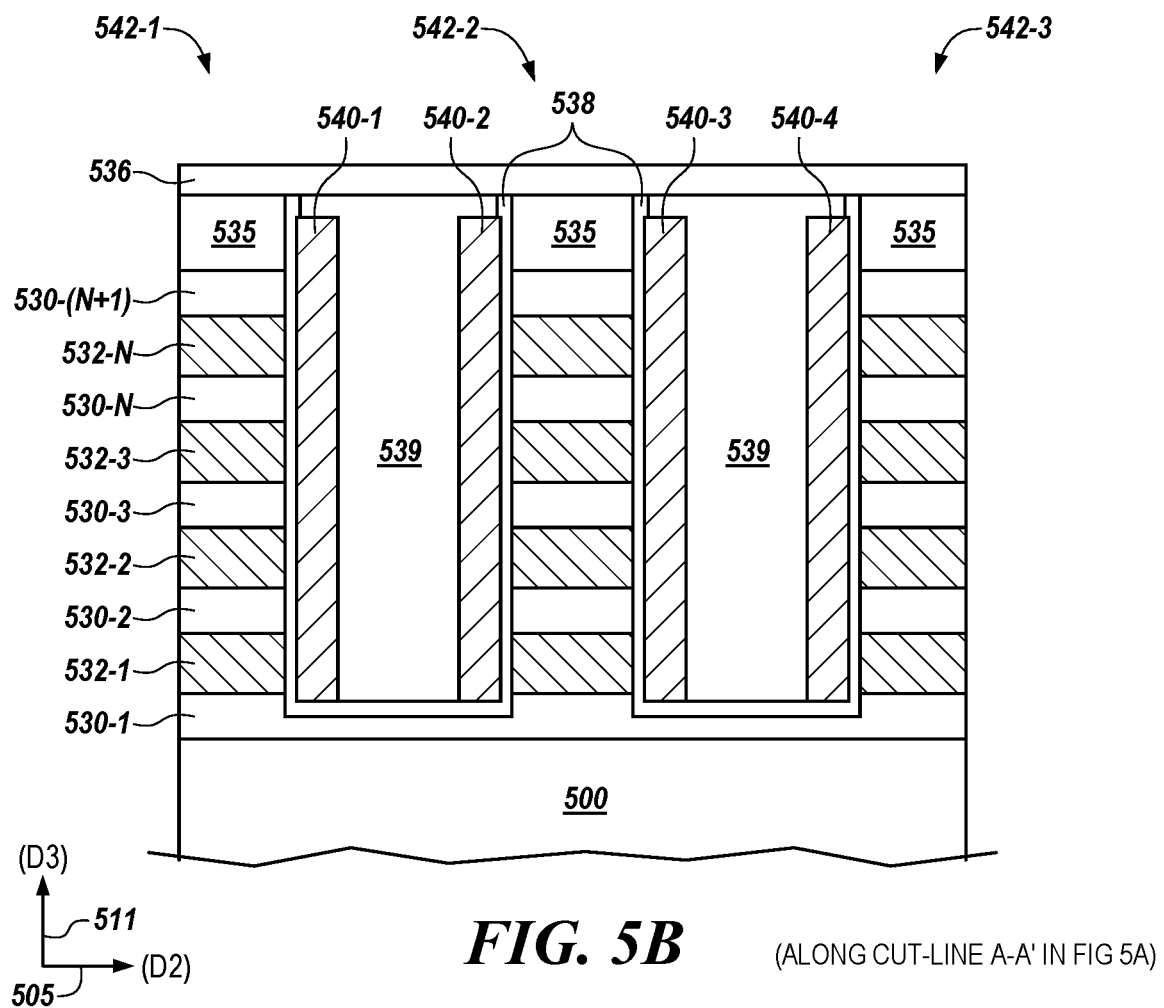
FIG. 5B (ALONG CUT-LINE A-A' IN FIG 5A)

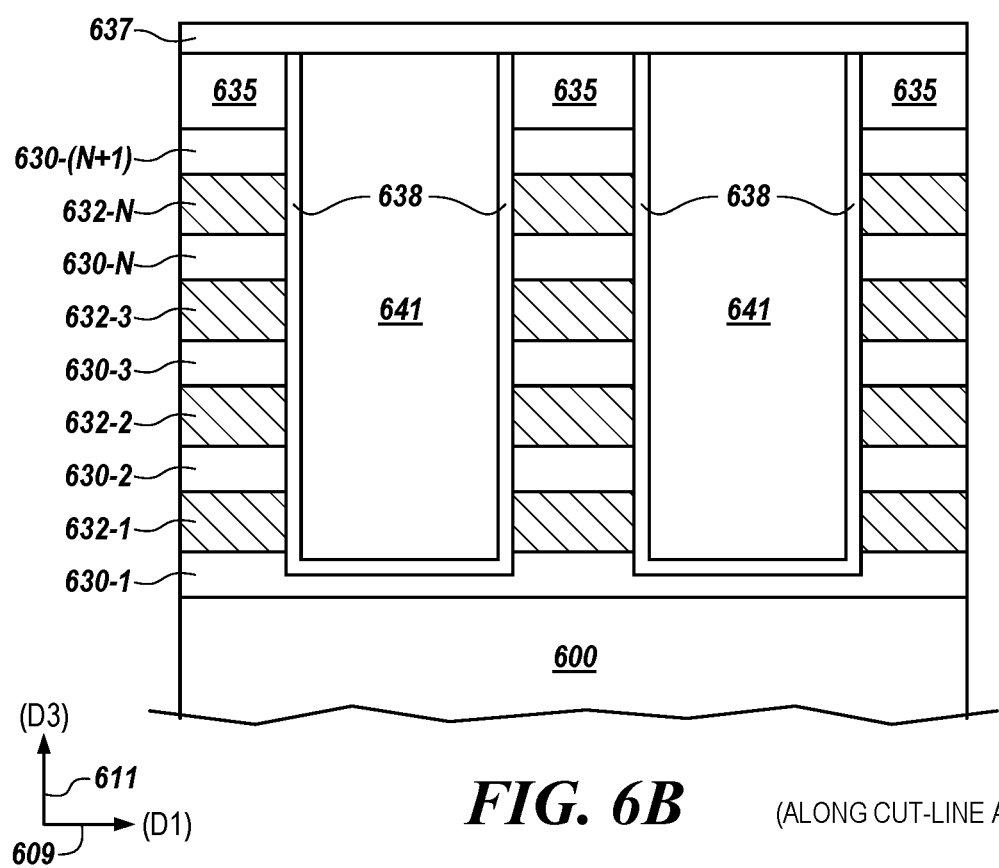
FIG. 6B (ALONG CUT-LINE A-A' IN FIG 6A)

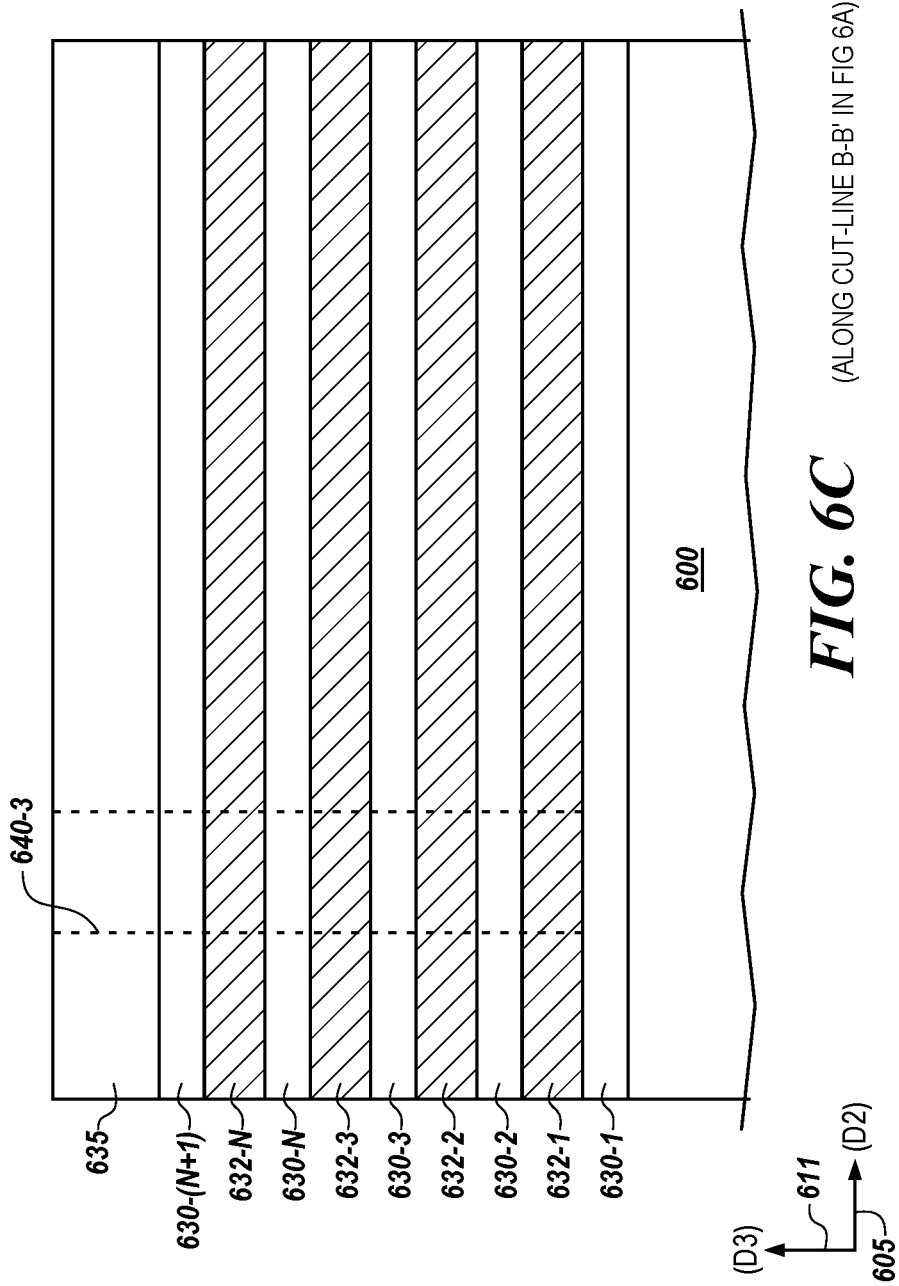

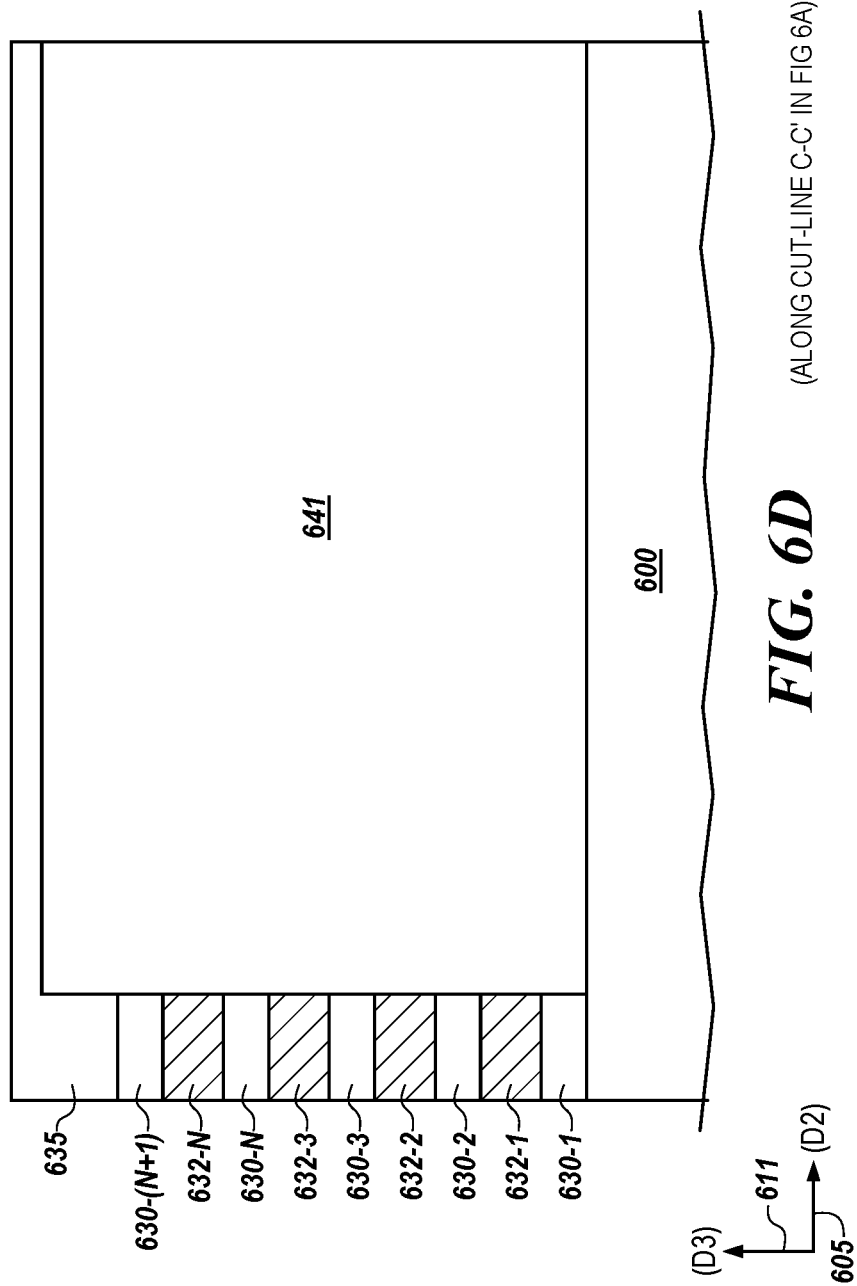
FIG. 6D (ALONG CUT-LINE C-C' IN FIG 6A)

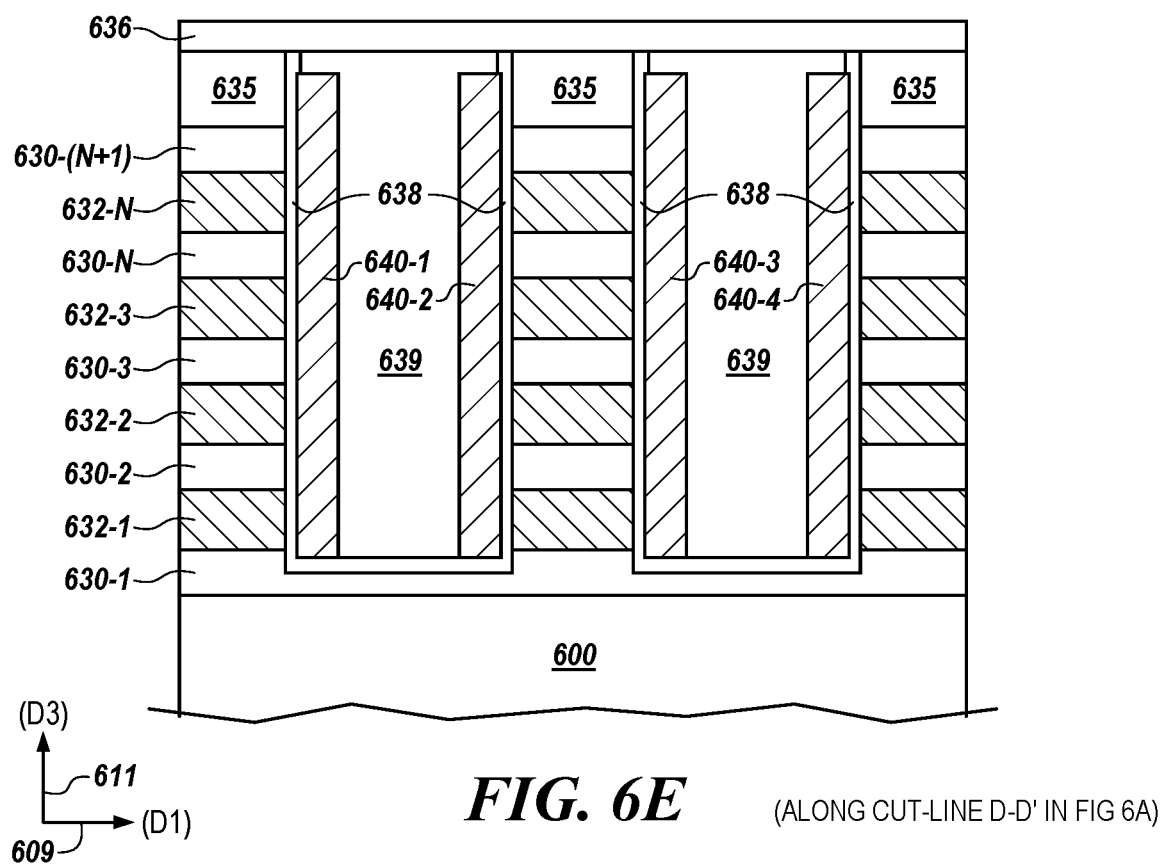
FIG. 6E (ALONG CUT-LINE D-D' IN FIG 6A)

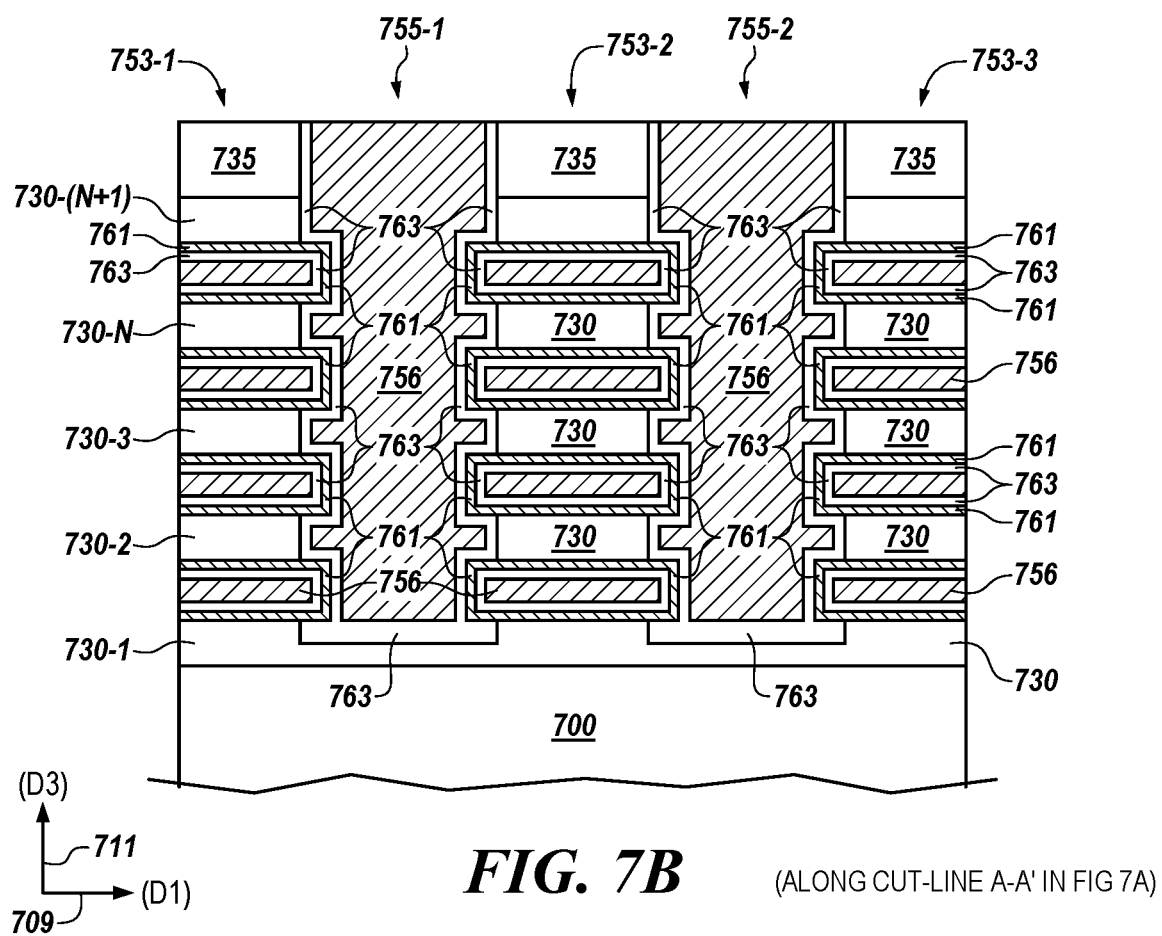
FIG. 7B (ALONG CUT-LINE A-A' IN FIG 7A)

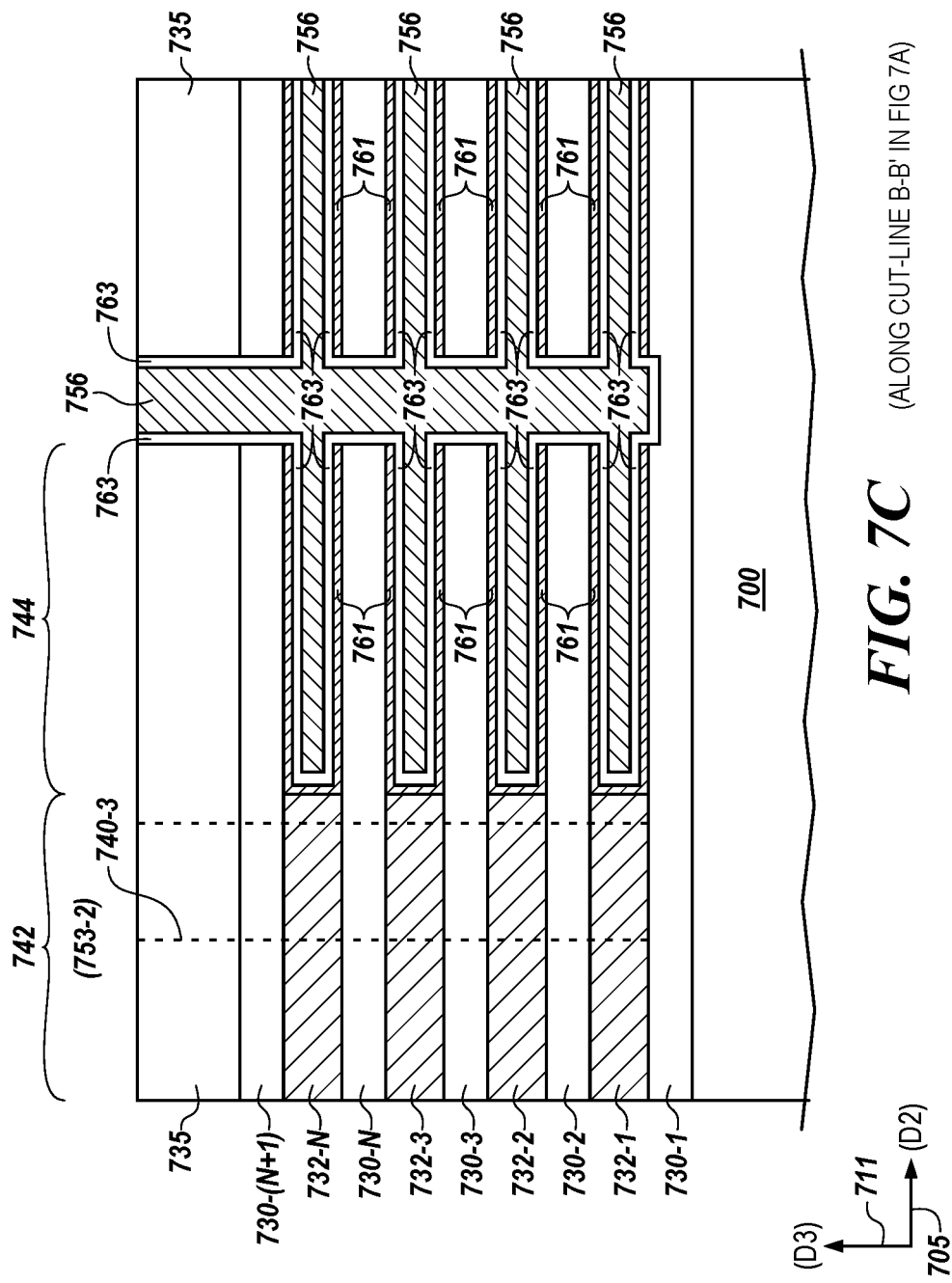
FIG. 7C (ALONG CUT-LINE B-B' IN FIG 7A)

(ALONG CUT-LINE C-C' IN FIG 7A)

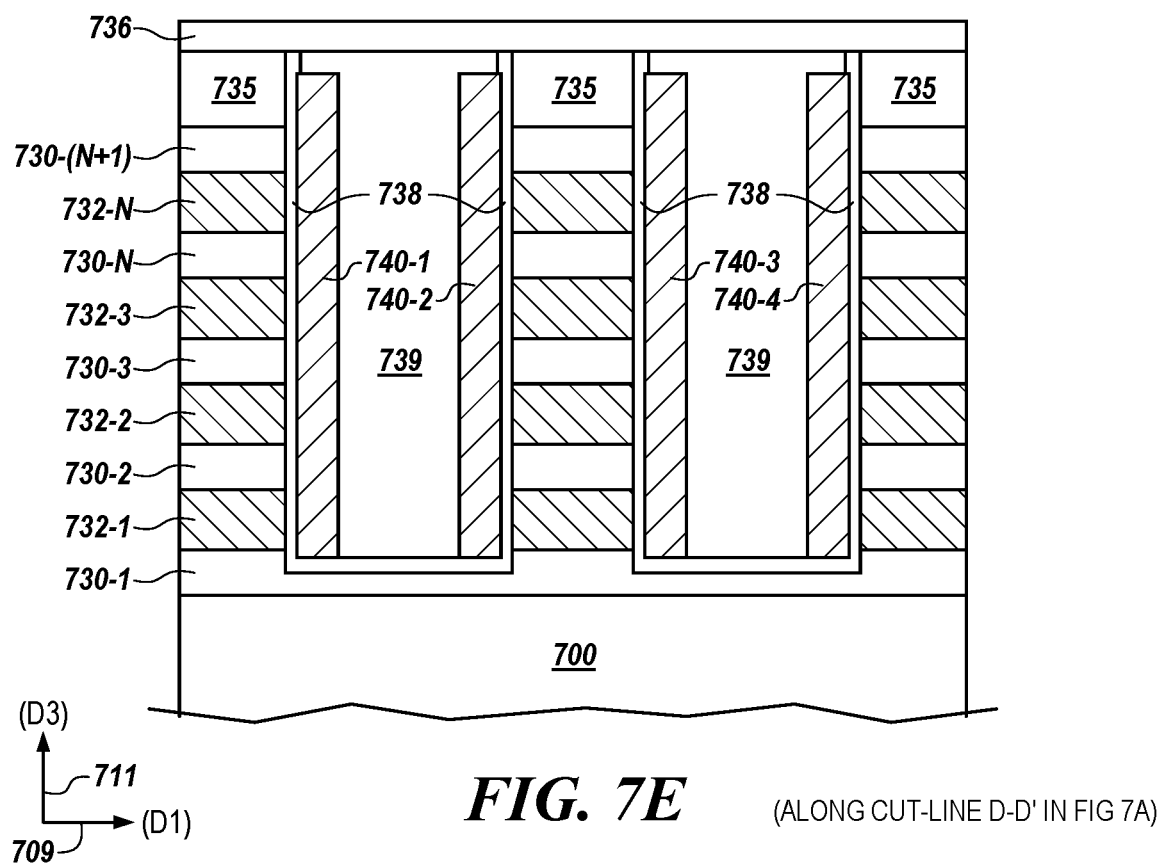
FIG. 7E (ALONG CUT-LINE D-D' IN FIG 7A)

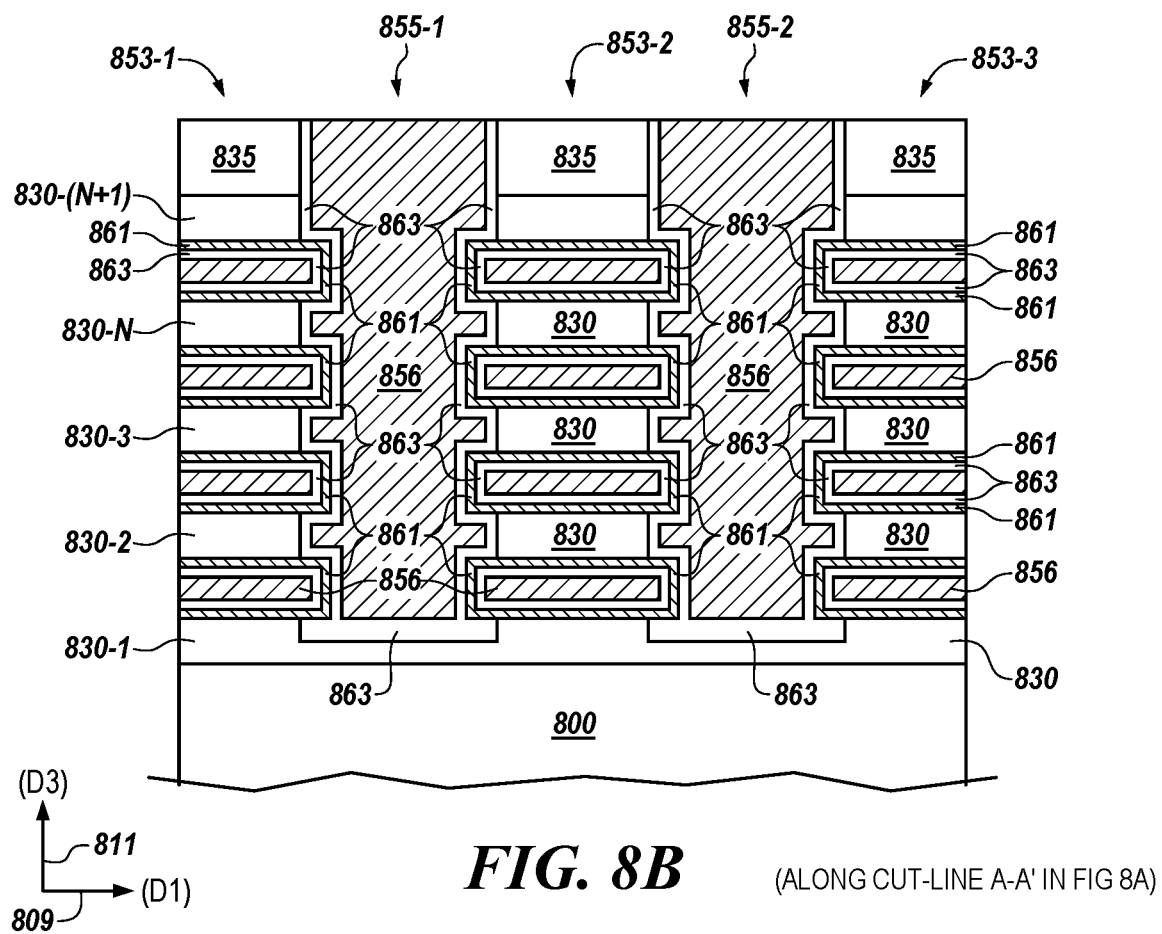
FIG. 8B (ALONG CUT-LINE A-A' IN FIG 8A)

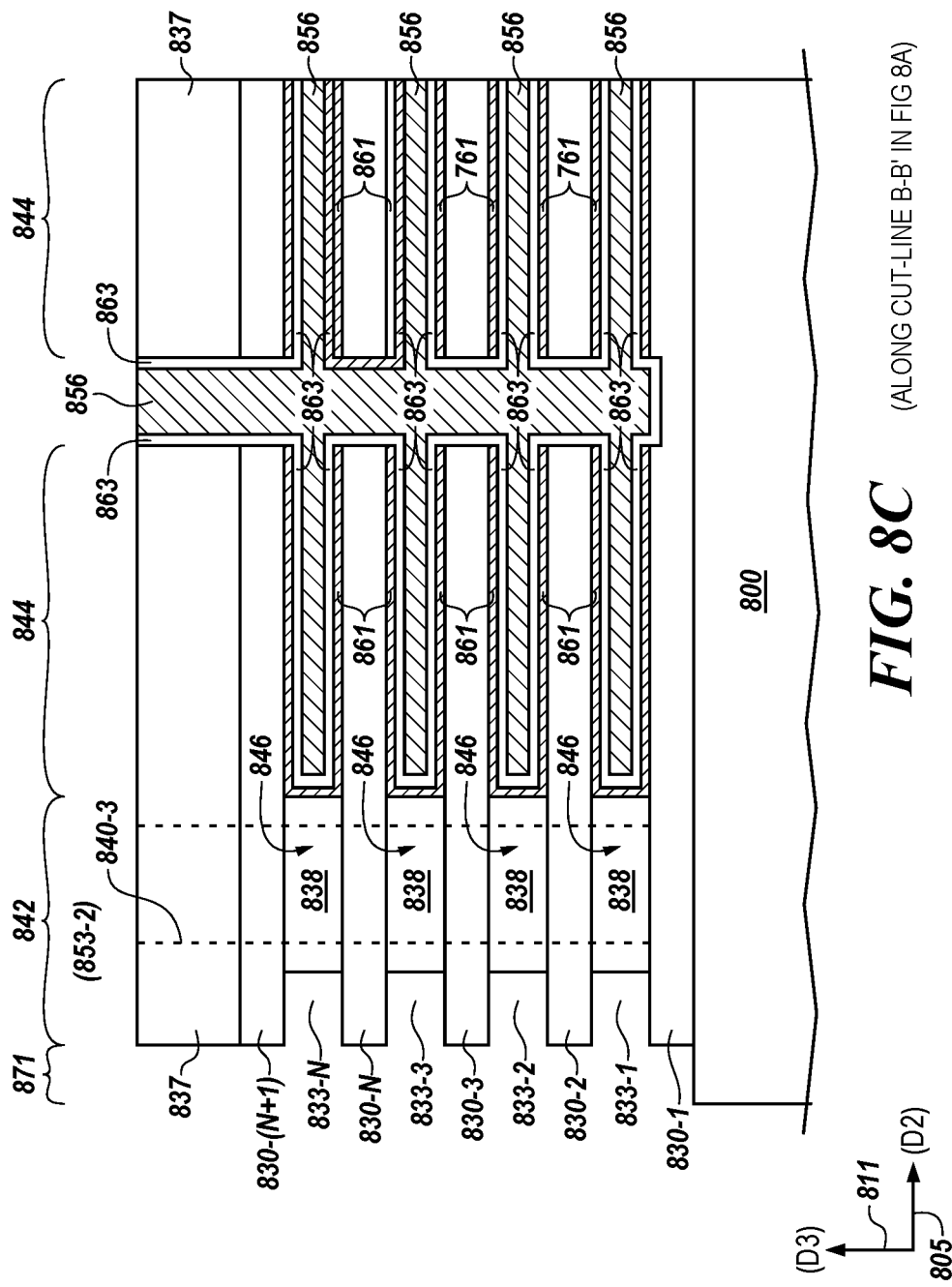
FIG. 8C (ALONG CUT-LINE B-B' IN FIG 8A)

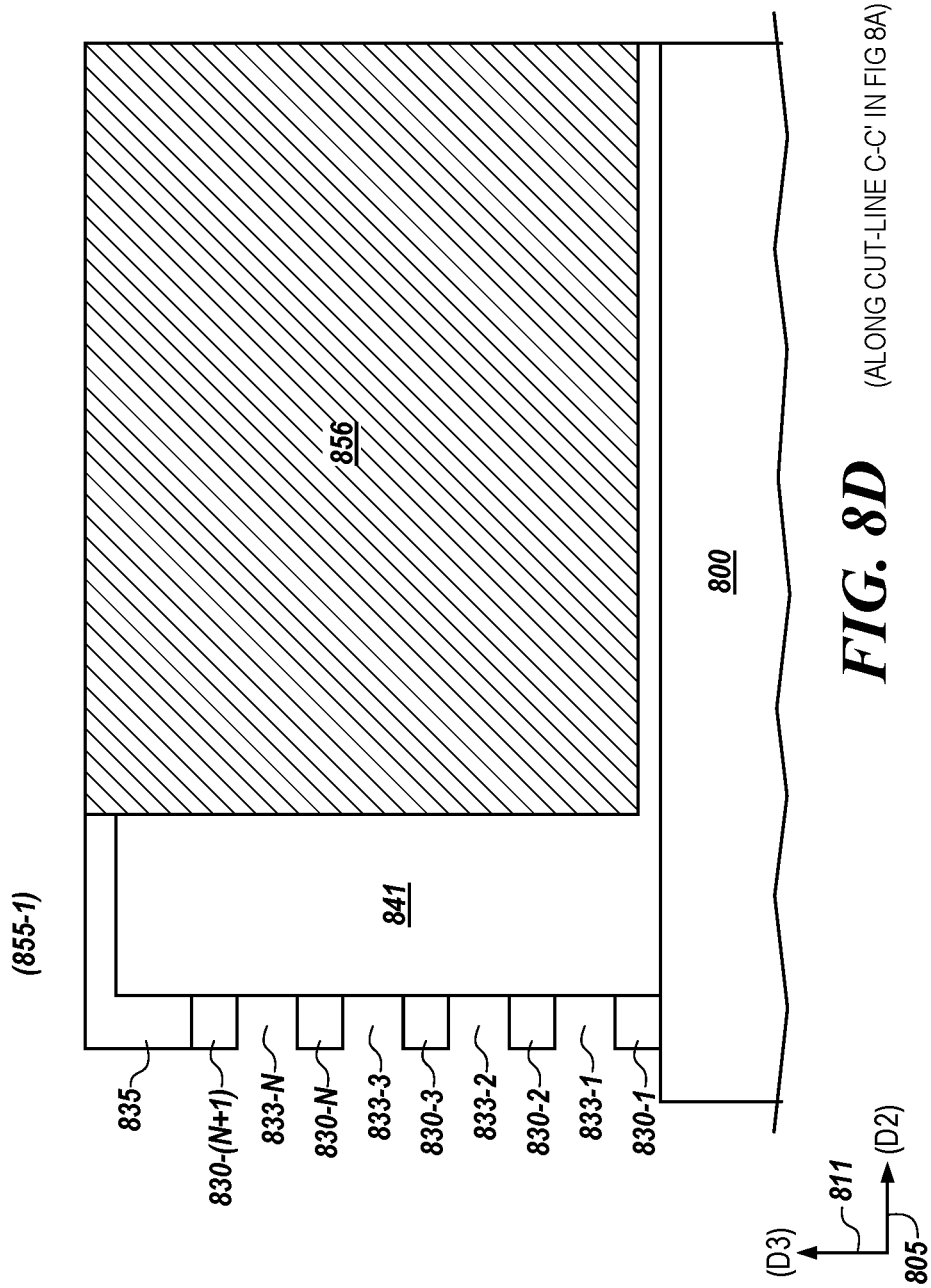
FIG. 8D (ALONG CUT-LINE C-C' IN FIG 8A)

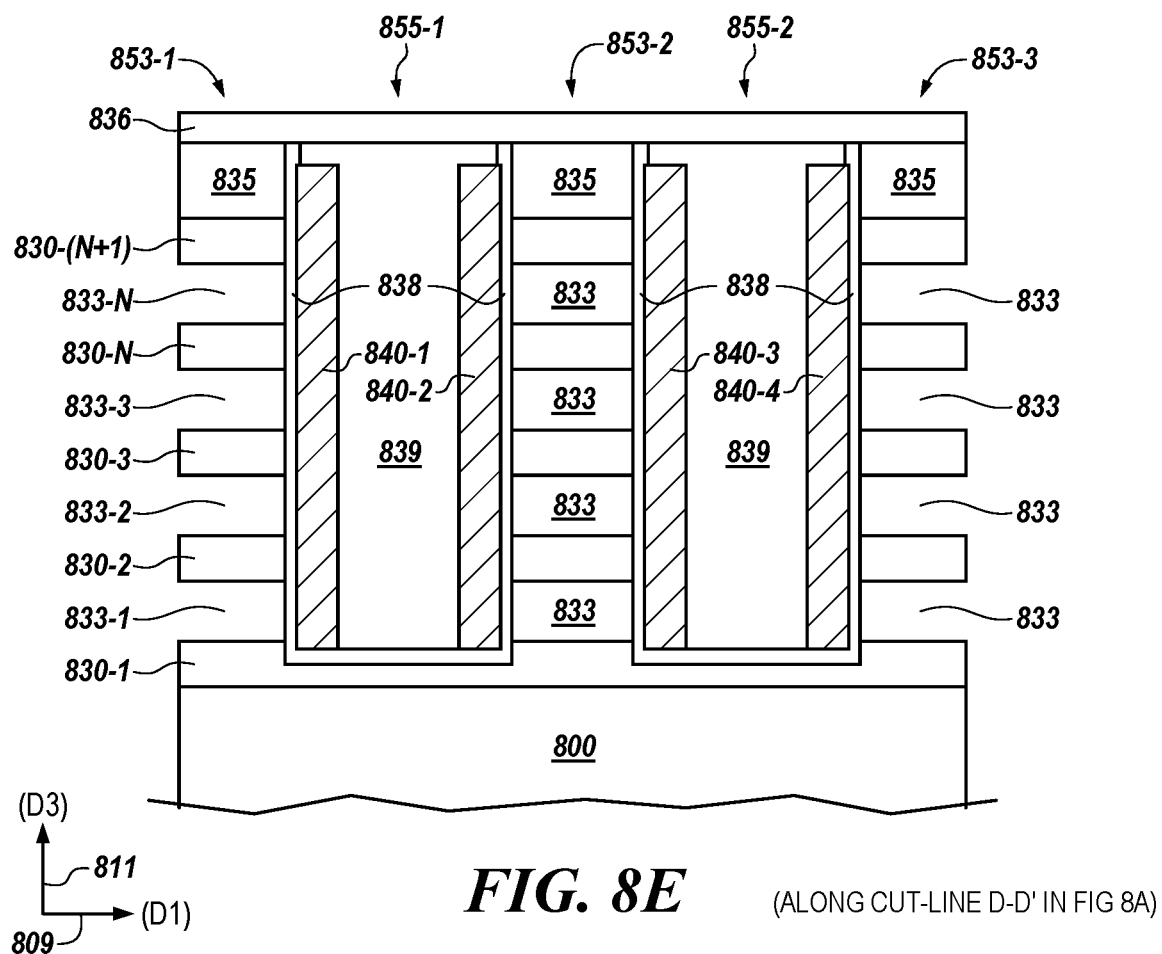
FIG. 8E (ALONG CUT-LINE D-D' IN FIG 8A)

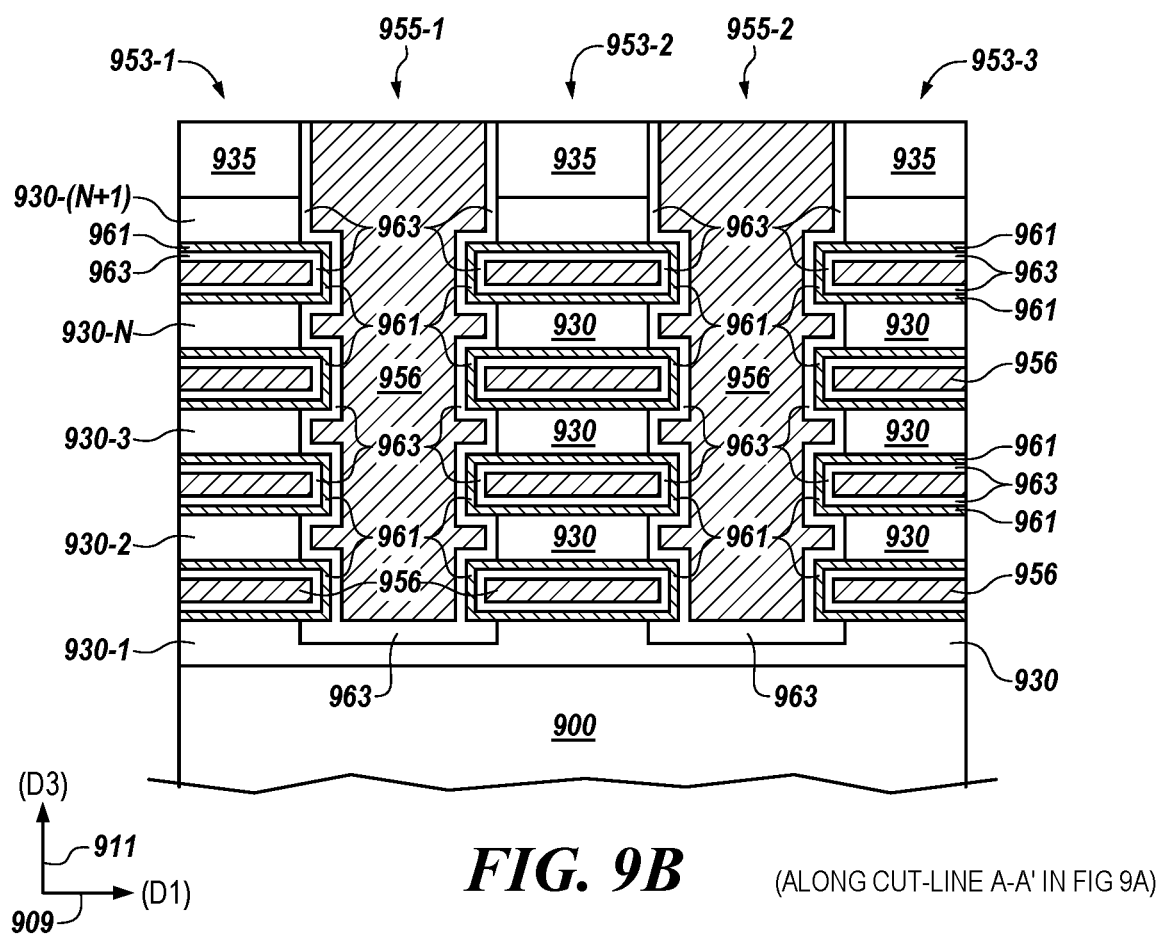
FIG. 9B (ALONG CUT-LINE A-A' IN FIG 9A)

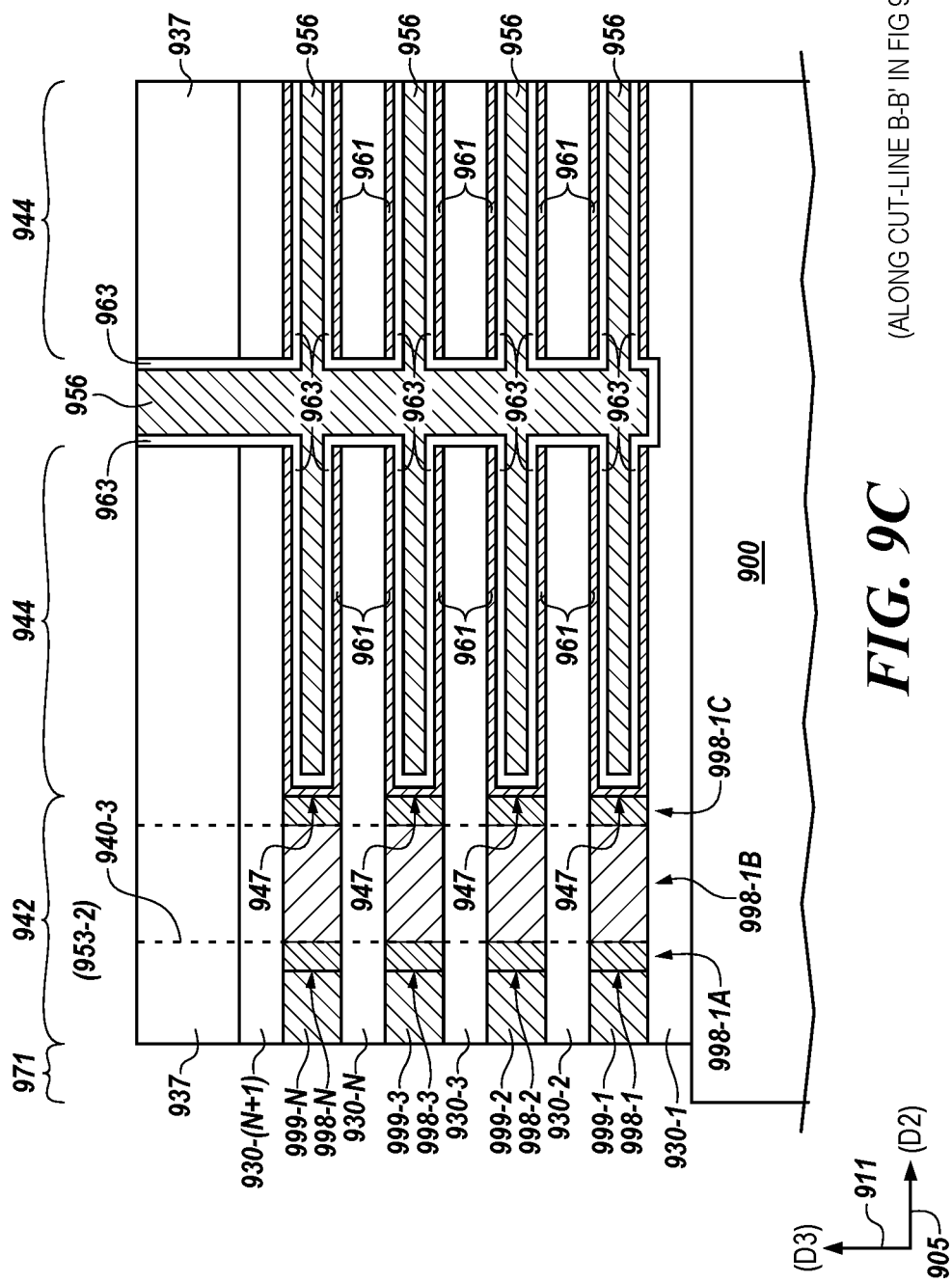
FIG. 9C (ALONG CUT-LINE B-B' IN FIG 9A)

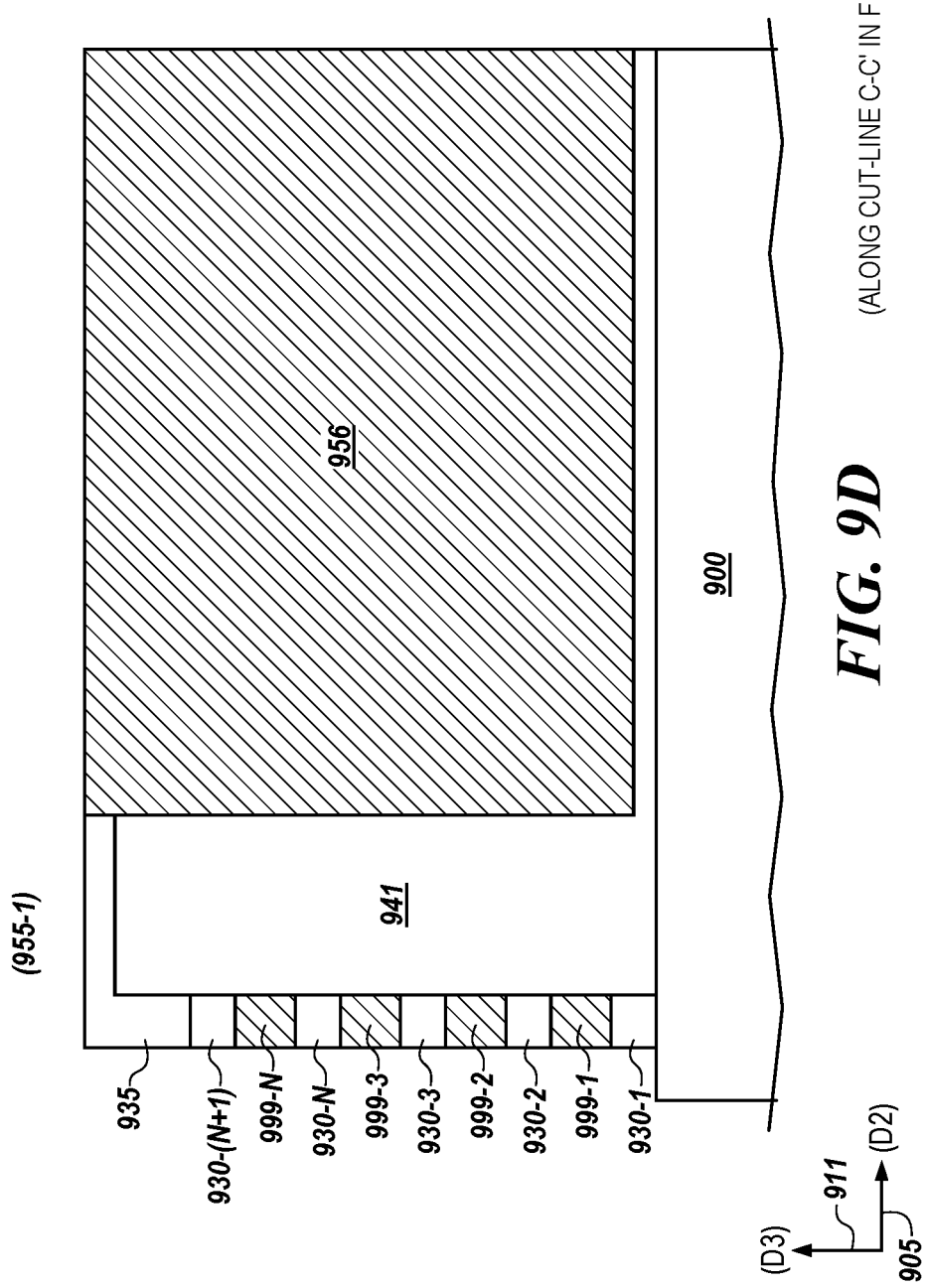

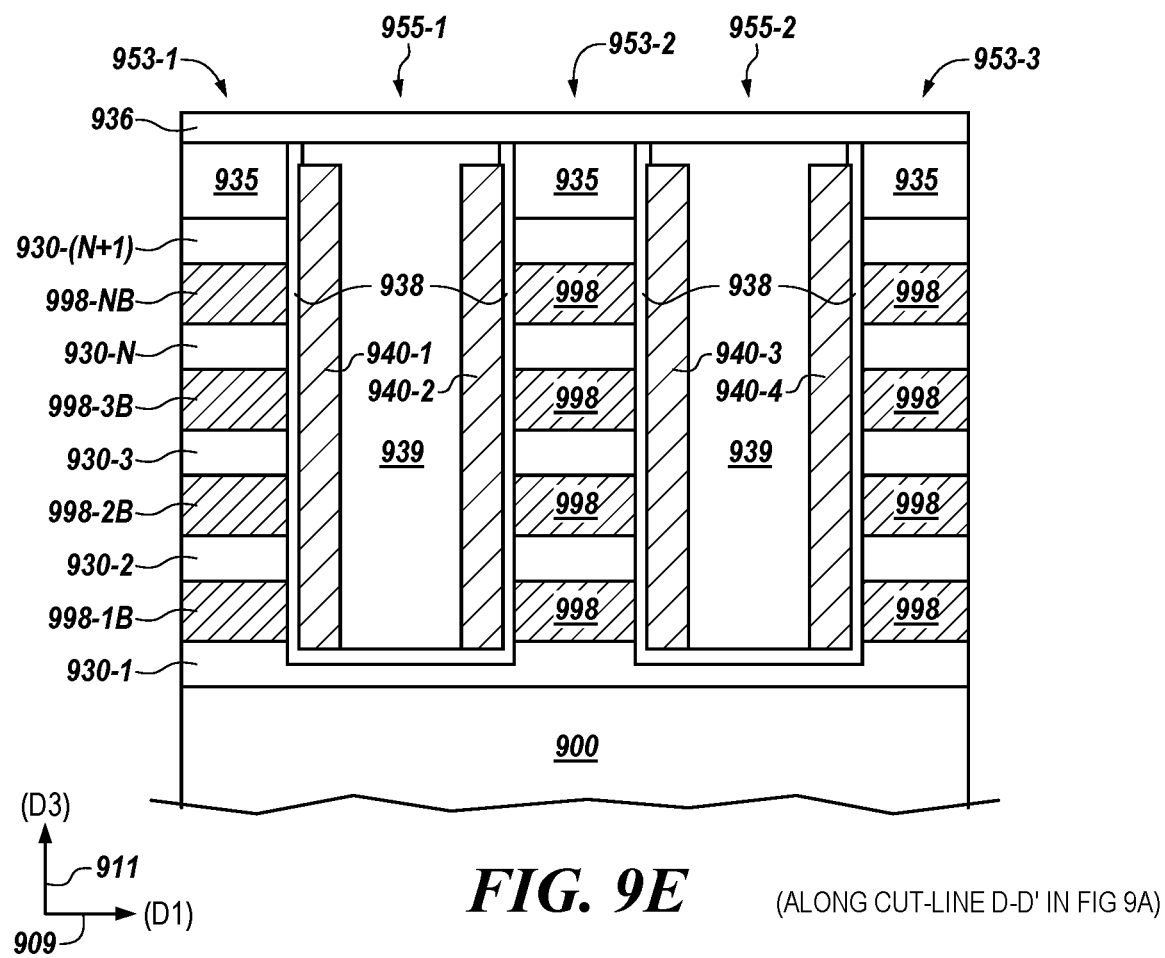
FIG. 9E (ALONG CUT-LINE D-D' IN FIG 9A)

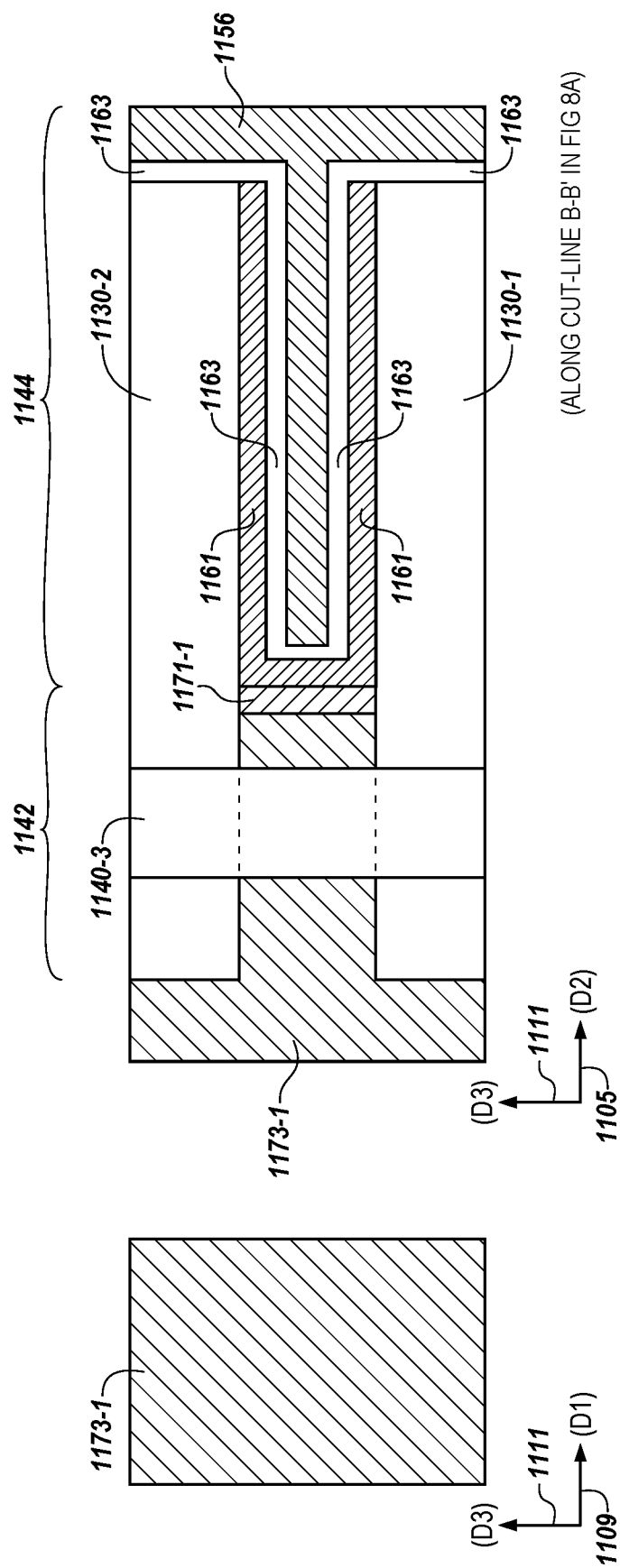

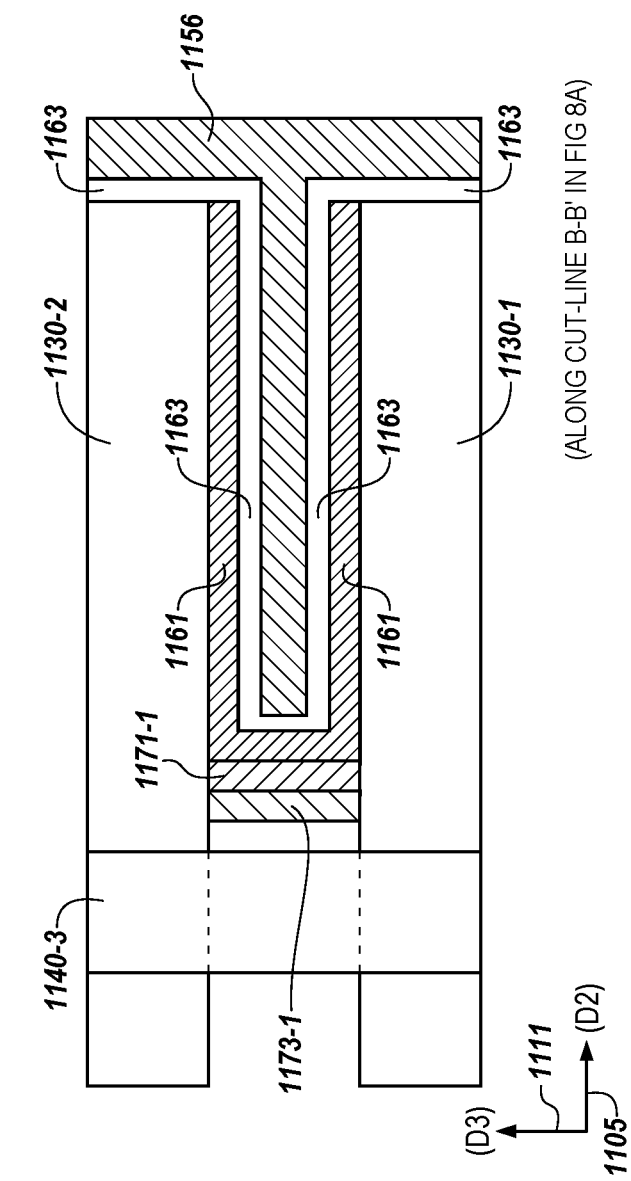
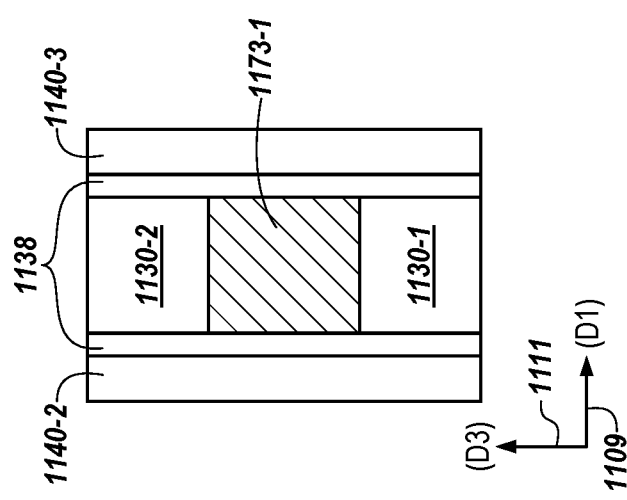
FIG. 11C
FIG. 11D

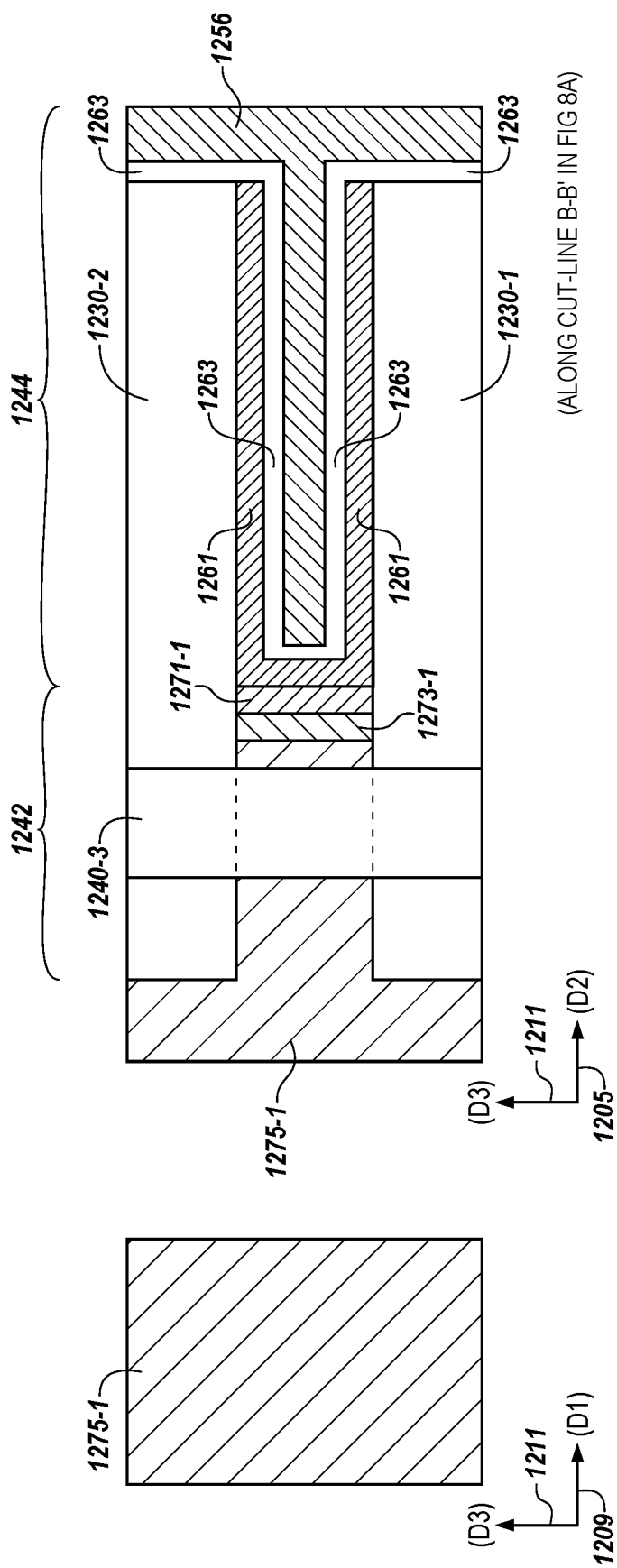

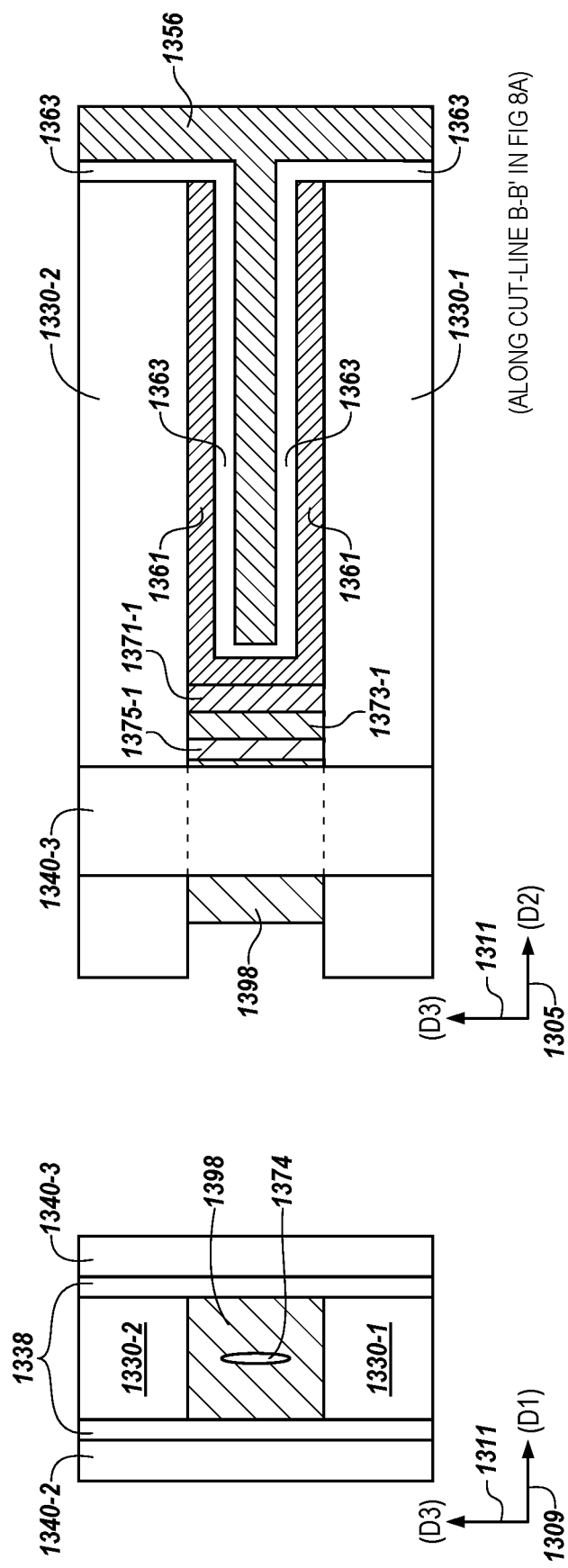

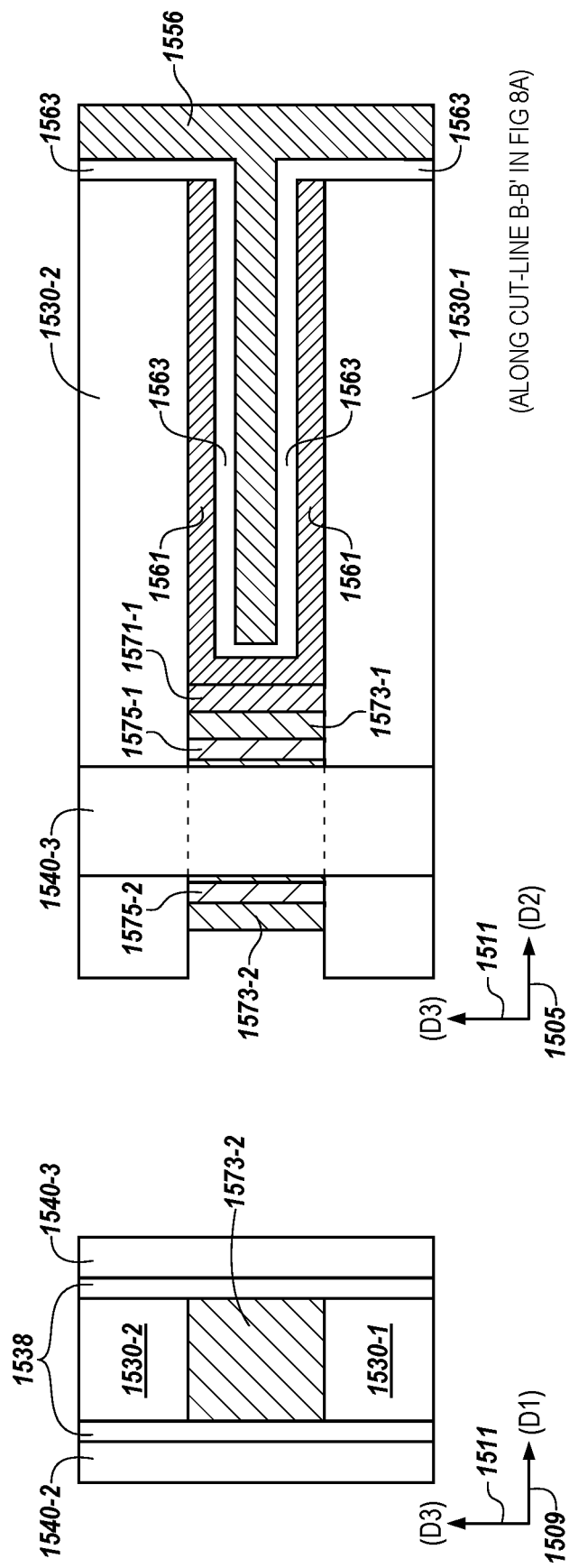

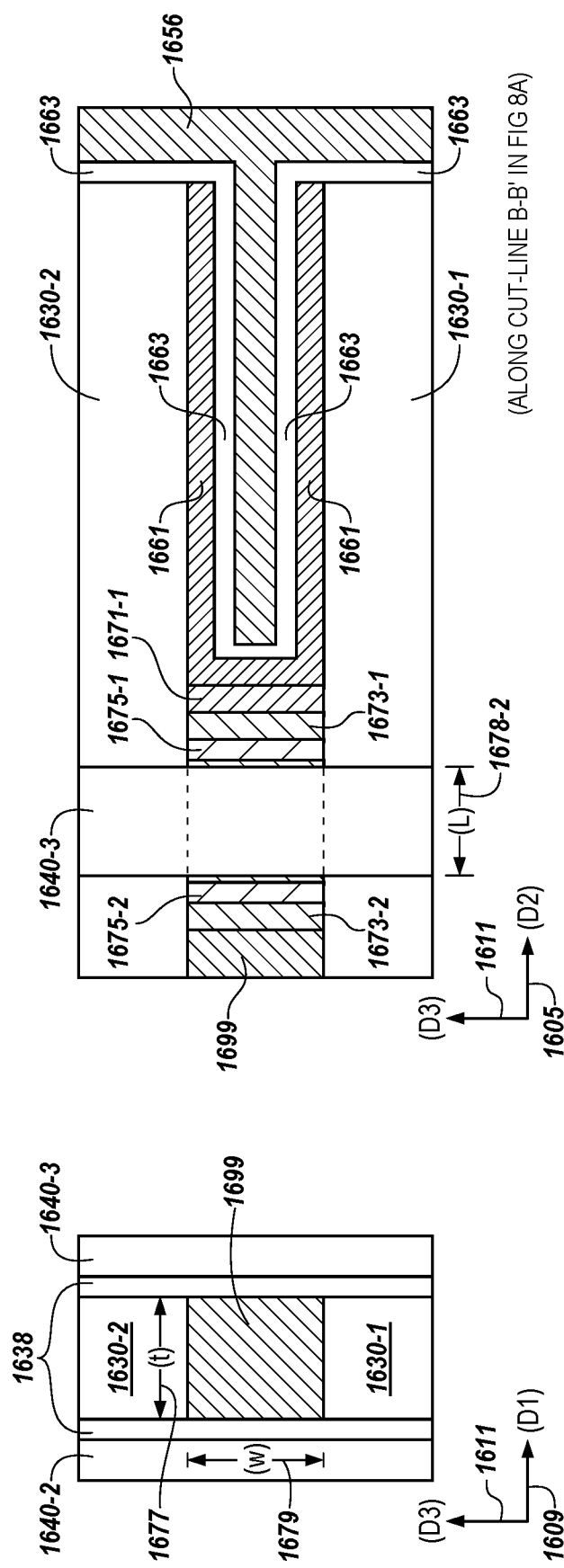

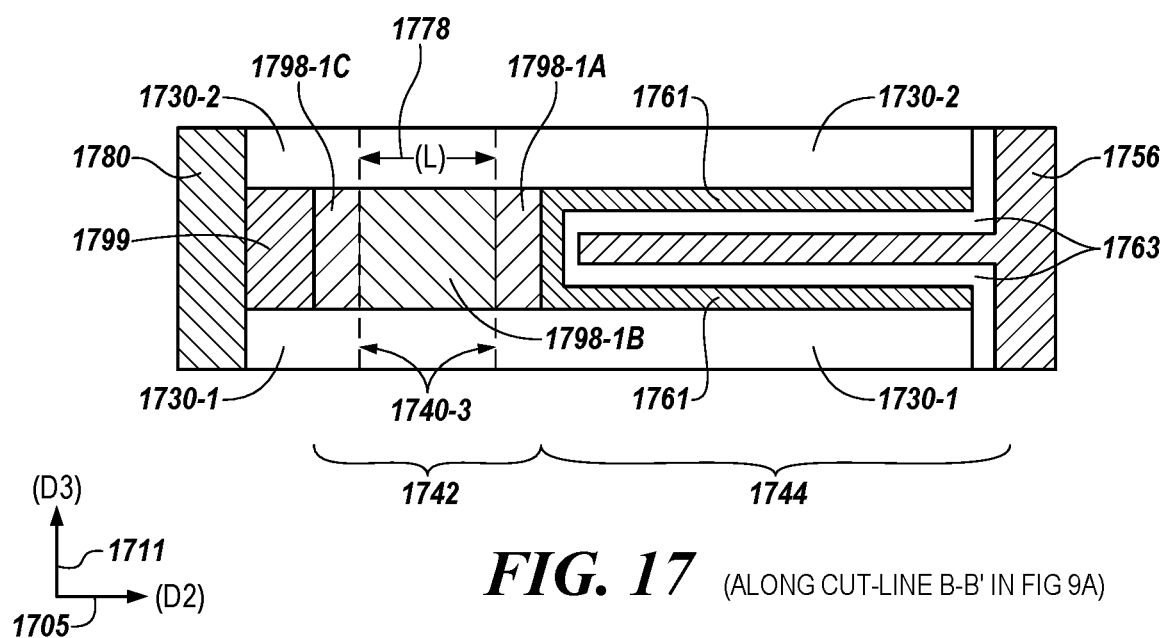
FIG. 17 (ALONG CUT-LINE B-B' IN FIG 9A)

GATE DIELECTRIC REPAIR ON THREE-NODE ACCESS DEVICE FORMATION FOR VERTICAL THREE-DIMENSIONAL (3D) MEMORY

TECHNICAL FIELD

The present disclosure relates generally to memory devices, and more particularly, to gate dielectric repair on three-node access device formation for vertical three-dimensional (3D) memory.

BACKGROUND

Memory is often implemented in electronic systems, such as computers, cell phones, hand-held devices, etc. There are many different types of memory, including volatile and non-volatile memory. Volatile memory may require power to maintain its data and may include random-access memory (RAM), dynamic random-access memory (DRAM), static random-access memory (SRAM), and synchronous dynamic random-access memory (SDRAM). Non-volatile memory may provide persistent data by retaining stored data when not powered and may include NAND flash memory, NOR flash memory, non-volatile read only memory (NROM), phase-change memory (e.g., phase-change random access memory), resistive memory (e.g., resistive random-access memory), cross-point memory, ferroelectric random-access memory (FeRAM), or the like.

As design rules shrink, less semiconductor space is available to fabricate memory, including DRAM arrays. A respective memory cell for DRAM may include an access device, e.g., transistor, having a first and a second source/drain regions separated by a channel region. A gate may oppose the channel region and be separated therefrom by a gate dielectric. An access line, such as a word line, is electrically connected to the gate of the DRAM cell. A DRAM cell can include a storage node, such as a capacitor cell, coupled by the access device to a digit line. The access device can be activated (e.g., to select the cell) by an access line coupled to the access transistor. The capacitor can store a charge corresponding to a data value of a respective cell (e.g., a logic "1" or "0").

BRIEF DESCRIPTION OF THE DRAWINGS

FIGS. 5A-5B illustrate an example method, at another stage of a semiconductor fabrication process, for forming arrays of vertically stacked memory cells, having three-node horizontally oriented access devices and vertically oriented access lines, in accordance with a number of embodiments of the present disclosure.

FIGS. 6A-6E illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

FIGS. 7A-7E illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

FIGS. 8A-8E illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

FIGS. 9A-9E illustrate an example method, at another stage of a semiconductor fabrication process, for forming arrays of vertically stacked memory cells, having three-node, horizontally oriented access devices and vertically oriented access lines, in accordance with a number of embodiments of the present disclosure.

FIGS. 11A-11D illustrate an example method for source/drain integration in a three-node horizontally oriented access device, at a particular point in time in a semiconductor fabrication process, in accordance with a number of embodiments of the present disclosure.

FIGS. 12A-12D illustrate an example method for source/drain integration in three-node horizontally oriented access device, at a particular point in time in a semiconductor fabrication process, in accordance with a number of embodiments of the present disclosure.

FIGS. 13A-13D illustrate an example method for source/drain integration in three-node horizontally oriented access device, at a particular point in time in a semiconductor fabrication process, in accordance with a number of embodiments of the present disclosure.

FIGS. 15A-15D illustrate an example method for source/drain integration in three-node horizontally oriented access device, at a particular point in time in a semiconductor fabrication process, in accordance with a number of embodiments of the present disclosure.

FIGS. 16A-16D illustrate an example method for source/drain integration in three-node horizontally oriented access device, at a particular point in time in a semiconductor fabrication process, in accordance with a number of embodiments of the present disclosure.

FIG. 17 illustrates an example of a three-node horizontally oriented access device coupled to a horizontally oriented storage node and coupled to vertically oriented access lines and horizontally oriented digit lines, in accordance with a number of fabrication techniques described herein.

DETAILED DESCRIPTION

Figure 1:
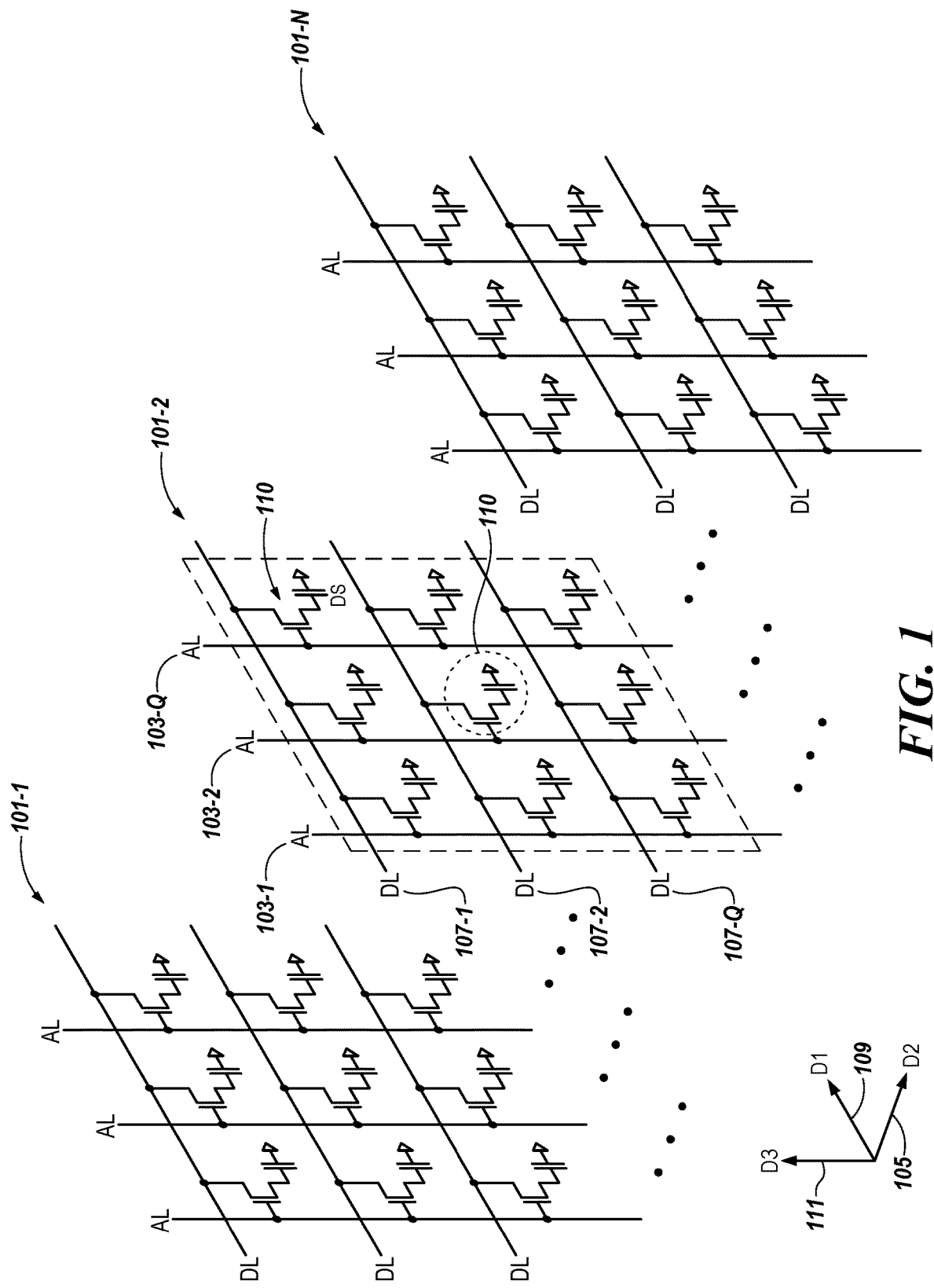
FIG. 1 is a schematic illustration of a vertical three-dimensional (3D) memory in accordance a number of embodiments of the present disclosure.

Embodiments of the present disclosure describe a three-node access device for vertical three-dimensional (3D) memory with gate dielectric repair. Three-node horizontal access devices are formed without body region contacts. As used herein, three-node is intended to refer to an access device comprising (1) a first source/drain region and (2) a second source/drain region separated by a channel region, and (3) one or more gates(s) opposing the channel region. In the three-node access device, there is no direct, electrical contact from a body contact line to a body region and/or channel of the access device to control the body region or channel of the access device. As a result, semiconductor fabrication process overhead is reduced by not having to form such a body contact.

The three-node horizontal access devices are integrated with vertical access lines and integrated with horizontal digit lines. According to embodiments, the three-node horizontal access devices may be formed with gate dielectric repair to improve gate dielectric quality and horizontal, three-node access device performance. Further, a replacement channel may provide a channel region that has fewer, e.g., may operate free of, minority carriers thus removing the need to control a body potential to a body region of the access device. The first source/drain region and the second source/drain region may be formed using methods and material constructions such that the contact with other nodes and the replacement channel material minimizes injection barriers, reduces contact resistance, and can increase output drive of the access device, e.g., thin film transistor (TFT). Dopant and silicide layer formation in the source/drain region formation process may also be avoided. Processes are provided to repair and/or improve gate dielectric formation. The repair and/or improved gate dielectric formation may be performed in the current process flow for three-node access device formation for vertical three-dimensional (3D) memory. Advantages to the structure and process described herein can include a lower off-current (Ioff) for the access devices, as compared to silicon based (Si-based) access devices, and/or reduced gate/drain induced leakage (GIDL) for the access devices, and increase drive current and current drain to source (IDS) induction input (IDS-Lin) at low applied drain to source gate potential (VDS) conditions.

In some embodiments channel and/or source/drain region replacement fabrication steps may be performed after a capacitor cell formation process, thus reducing a thermal budget. The digit line integration may be more easily achieved in the fabrication process since a body contact to a body region of the access device is not used. Additionally, the embodiments described herein may achieve a better lateral scaling path than achieved with doped polysilicon based channel regions due to less channel length and lower source/drain semiconductor fabrication process overhead. A shorter access line, e.g., word line (WL), length (L) may also be achieved due to the lower off-current (Ioff). A further benefit is the avoidance, e.g., no use of, gas phase doping (GPD) in the formation of the source/drain regions.

The figures herein follow a numbering convention in which the first digit or digits correspond to the figure number of the drawing and the remaining digits identify an element or component in the drawing. Similar elements or components between different figures may be identified by the use of similar digits. For example, reference numeral 104 may reference element "04" in FIG. 1, and a similar element may be referenced as 204 in FIG. 2. Multiple analogous elements within one figure may be referenced with a reference numeral followed by a hyphen and another numeral or a letter. For example, 302-1 may reference element 302-1 in FIGS. 3 and 302-2 may reference element 302-2, which may be analogous to element 302-1. Such analogous elements may be generally referenced without the hyphen and extra numeral or letter. For example, elements 302-1 and 302-2 or other analogous elements may be generally referenced as 302.

FIG. 1 is a block diagram of an apparatus in accordance a number of embodiments of the present disclosure. FIG. 1 illustrates a circuit diagram showing a cell array of a three-dimensional (3D) semiconductor memory device according to embodiments of the present disclosure. FIG. 1 illustrates a cell array may have a plurality of sub cell arrays 101-1, 101-2, . . . , 101-N. The sub cell arrays 101-1, 101-2, . . . , 101-N may be arranged along a second direction (D2) 105. Each of the sub cell arrays, e.g., sub cell array 101-2, may include a plurality of access lines 103-1, 103-2, . . . , 103-Q (which also may be referred to a word lines). Also, each of the sub cell arrays, e.g., sub cell array 101-2, may include a plurality of digit lines 107-1, 107-2, . . . , 107-P (which also may be referred to as bit lines, data lines, or sense lines). In FIG. 1, the digit lines 107-1, 107-2, . . . , 107-P are illustrated extending in a first direction (D1) 109 and the access lines 103-1, 103-2, . . . , 103-Q are illustrated extending in a third direction (D3) 111. According to embodiments, the first direction (D1) 109 and the second direction (D2) 105 may be considered in a horizontal ("X-Y") plane. The third direction (D3) 111 may be considered in a vertical ("Z") plane. Hence, according to embodiments described herein, the access lines 103-1, 103-2, . . . , 103-Q are extending in a vertical direction, e.g., third direction (D3) 111.

A memory cell, e.g., 110, may include an access device, e.g., access transistor, and a storage node located at an intersection of each access line 103-1, 103-2, . . . , 103-Q and each digit line 107-1, 107-2, . . . , 107-P. Memory cells may be written to, or read from, using the access lines 103-1, 103-2, . . . , 103-Q and digit lines 107-1, 107-2, . . . , 107-P. The digit lines 107-1, 107-2, . . . , 107-P may conductively interconnect memory cells along horizontal columns of each sub cell array 101-, 101-2, . . . , 101-N, and the access lines 103-1, 103-2, . . . , 103-Q may conductively interconnect memory cells along vertical rows of each sub cell array 101-, 101-2, . . . , 101-N. One memory cell, e.g. 110, may be located between one access line, e.g., 103-2, and one digit line, e.g., 107-2. Each memory cell may be uniquely addressed through a combination of an access line 103-1, 103-2, . . . , 103-Q and a digit line 107-1, 107-2, . . . , 107-P.

The digit lines 107-1, 107-2, . . . , 107-P may be or include conducting patterns (e.g., metal lines) disposed on and spaced apart from a substrate. The digit lines 107-1, 107-2, . . . , 107-P may extend in a first direction (D1) 109. The digit lines 107-1, 107-2, . . . , 107-P in one sub cell array, e.g., 101-2, may be spaced apart from each other in a vertical direction, e.g., in a third direction (D3) 111.

The access lines 103-1, 103-2, . . . , 103-Q may be or include conductive patterns (e.g., metal lines) extending in a vertical direction with respect to the substrate, e.g., in a third direction (D3) 111. The access lines in one sub cell array, e.g., 101-2, may be spaced apart from each other in the first direction (D1) 109.

A gate of a memory cell, e.g., memory cell 110, may be connected to an access line, e.g., 103-2, and a first conductive node, e.g., first source/drain region, of an access device, e.g., transistor, of the memory cell 110 may be connected to a digit line, e.g., 107-2. Each of the memory cells, e.g., memory cell 110, may be connected to a storage node, e.g., capacitor. A second conductive node, e.g., second source/drain region, of the access device, e.g., transistor, of the memory cell 110 may be connected to the storage node, e.g., capacitor. While first and second source/drain region reference are used herein to denote two separate and distinct source/drain regions, it is not intended that the source/drain region referred to as the "first" and/or "second" source/drain regions have some unique meaning. It is intended only that one of the source/drain regions is connected to a digit line, e.g., 107-2, and the other may be connected to a storage node.

Figure 2:
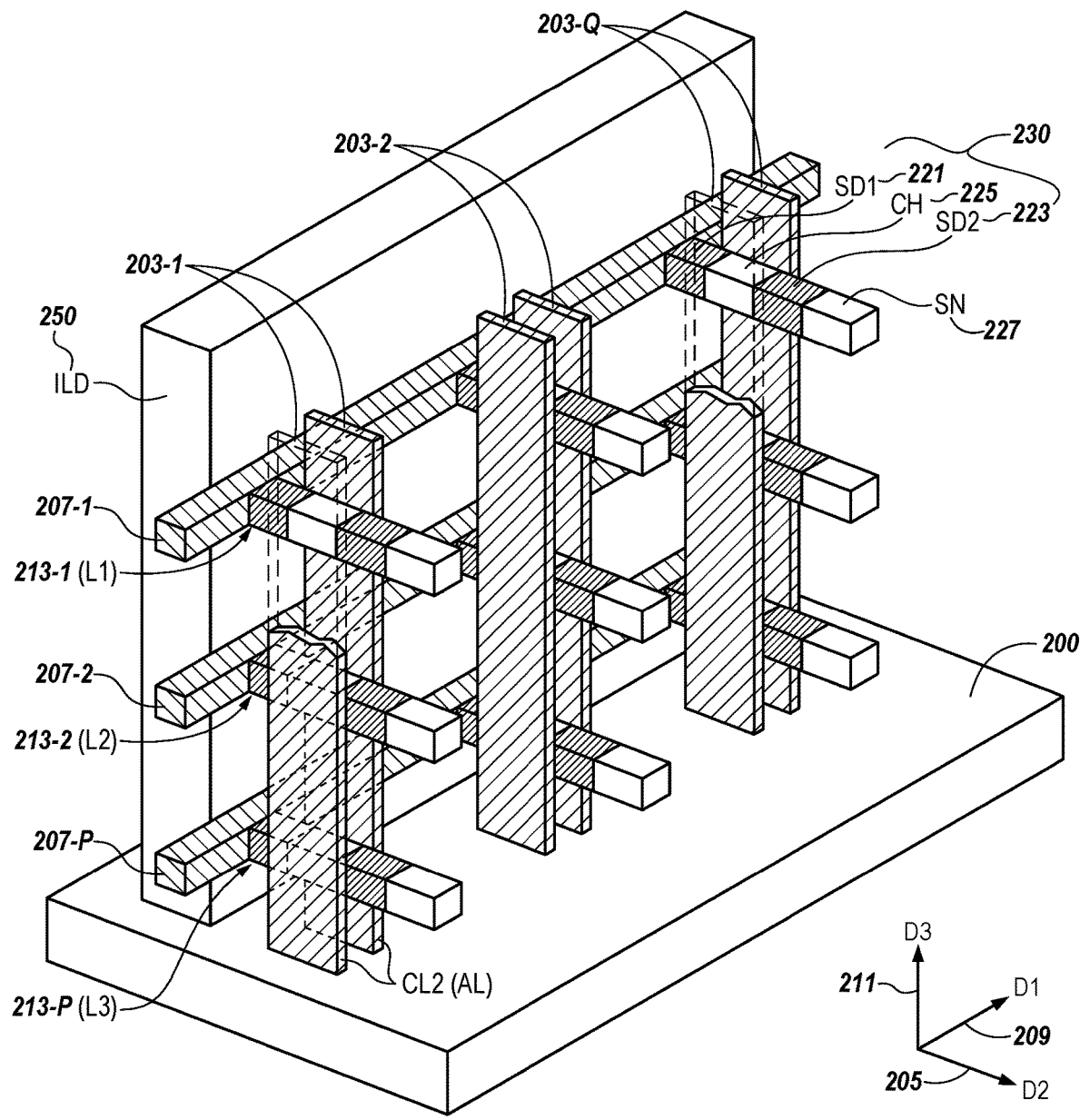
FIG. 2 is a perspective view illustrating a portion of a three-node access device in a vertical three-dimensional (3D) memory array in accordance with a number of embodiments of the present disclosure.
Figure 3:
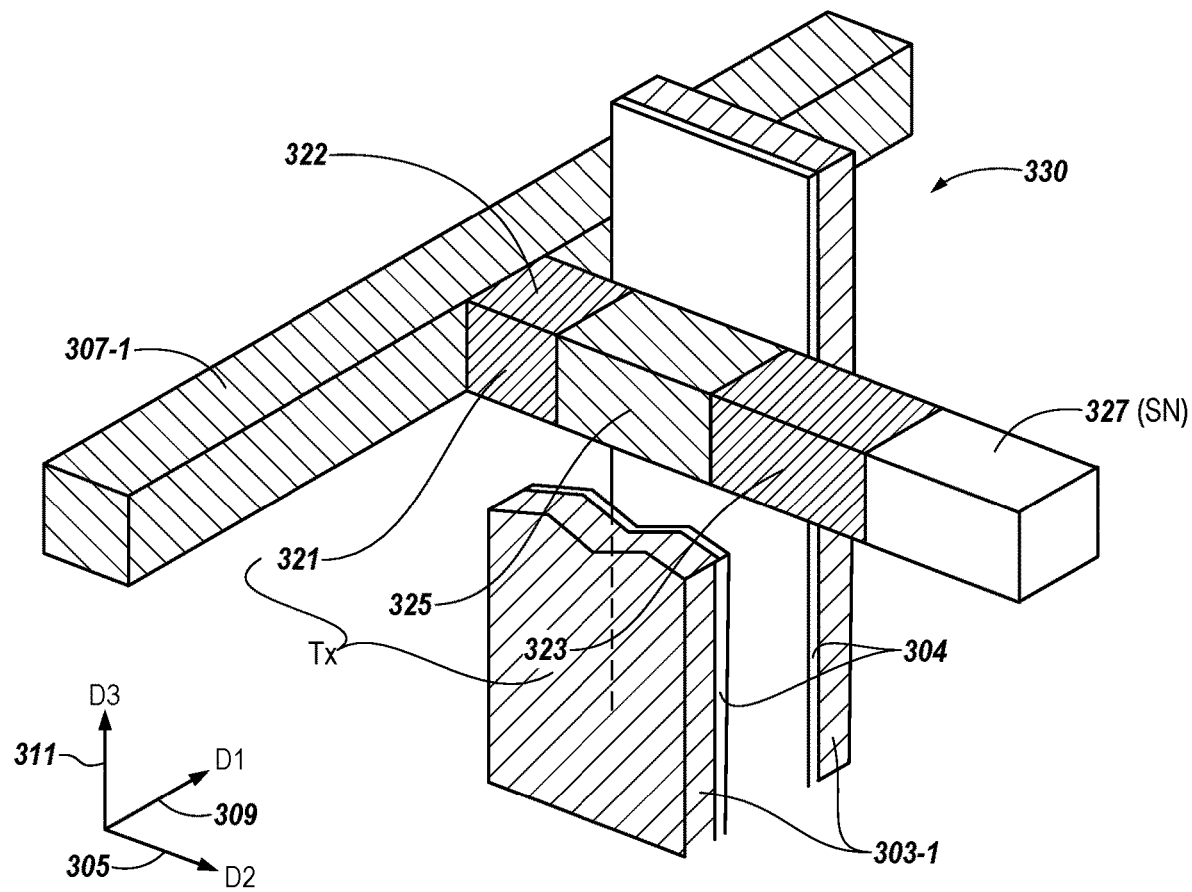
FIG. 3 is a perspective view illustrating a portion of a three-node access device in a vertical three-dimensional (3D) memory cell in accordance with a number of embodiments of the present disclosure.

FIG. 2 illustrates a perspective view showing a three-dimensional (3D) semiconductor memory device, e.g., a portion of a sub cell array 101-2 shown in FIG. 1 as a vertically oriented stack of memory cells in an array, according to some embodiments of the present disclosure. FIG. 3 illustrates a perspective view showing unit cell, e.g., memory cell 110 shown in FIG. 1, of the 3D semiconductor memory device shown in FIG. 2.

As shown in FIG. 2, a substrate 200 may have formed thereon one of the plurality of sub cell arrays, e.g., 101-2, described in connection with FIG. 1. For example, the substrate 200 may be or include a silicon substrate, a germanium substrate, or a silicon-germanium substrate, etc. Embodiments, however, are not limited to these examples.

As shown in the example embodiment of FIG. 2, the substrate 200 may have fabricated thereon a vertically oriented stack of memory cells, e.g., memory cell 110 in FIG. 1, extending in a vertical direction, e.g., third direction (D3) 211. According to some embodiments the vertically oriented stack of memory cells may be fabricated such that each memory cell, e.g., memory cell 110 in FIG. 1, is formed on plurality of vertical levels, e.g., a first level (L1), a second level (L2), and a third level (L3). The repeating, vertical levels, L1, L2, and L3, may be arranged, e.g., "stacked", a vertical direction, e.g., third direction (D3) 211 shown in FIG. 1. Each of the repeating, vertical levels, L1, L2, and L3 may include a plurality of discrete components, e.g., regions, to the laterally oriented access devices 230, e.g., transistors, and storage nodes, e.g., capacitors, including access line 103-1, 103-2, . . . , 103-Q connections and digit line 107-1, 107-2, . . . , 107-P connections. The plurality of discrete components to the horizontally oriented, three-node access devices, e.g., transistors 110 in FIG. 1, may be formed in a plurality of iterations of vertically, repeating layers within each level, as described in more detail below in connection with FIG. 4 et. seq., and may extend horizontally in the second direction (D2) 205, analogous to second direction (D2) 105 shown in FIG. 1.

The plurality of discrete components to the horizontally oriented three-node access devices 230, e.g., transistors, may include a first source/drain region 221 and a second source/drain region 223 separated by a channel region 225, extending laterally in the second direction (D2) 205. In some embodiments, the channel region 225 may include silicon, germanium, silicon-germanium, and/or indium gallium zinc oxide (IGZO). In some embodiments, the first and the second source/drain regions, 221 and 223, can include an n-type dopant region, e.g., semiconductor material, formed adjacent to a p-type doped channel region, e.g., semiconductor material, of the access device to form an n-type conductivity transistor. In some embodiments, the first and the second source/drain regions, 221 and 223, may include a p-type conductivity, e.g., doped semiconductor material, formed adjacent to an n-type conductivity channel region, e.g., doped semiconductor material, of the access device to form a p-type conductivity transistor. By way of example, and not by way of limitation, the n-type dopant may include Phosphorous (P) atoms and the p-type dopant may include atoms of Boron (B) formed in an oppositely doped body region of polysilicon semiconductor material. Embodiments, however, are not limited to these examples.

The storage node 227, e.g., capacitor, may be connected to one respective end of the access device. As shown in FIG. 2, the storage node 227, e.g., capacitor may be connected to the second source/drain region 223 of the access device. The storage node may be or include memory elements capable of storing data. Each of the storage nodes may be a memory element using one of a capacitor, a magnetic tunnel junction pattern, and/or a variable resistance body which includes a phase change material, etc. Embodiments, however, are not limited to these examples. In some embodiments, the storage node associated with each access device of a unit cell, e.g., memory cell 110 in FIG. 1, may similarly extend in the second direction (D2) 205, analogous to second direction (D2) 105 shown in FIG. 1.

As shown in FIG. 2 a plurality of horizontally oriented digit lines 207-1, 207-2, . . . , 207-P extend in the first direction (D1) 209, analogous to the first direction (D1) 109 in FIG. 1. The plurality of horizontally oriented digit lines 207-1, 207-2, . . . , 207-P may be analogous to the digit lines 107-1, 107-2, . . . , 107-P shown in FIG. 1. The plurality of horizontally oriented digit lines 207-1, 207-2, . . . , 207-P may be arranged, e.g., "stacked", along the third direction (D3) 211. The plurality of horizontally oriented digit lines 207-1, 207-2, . . . , 207-P may include a conductive material. For example, the conductive material may include one or more of a doped semiconductor, e.g., doped silicon, doped germanium, etc., a conductive metal nitride, e.g., titanium nitride, tantalum nitride, etc., a metal, e.g., tungsten (W), titanium (Ti), tantalum (Ta), etc., and/or a metal-semiconductor compound, e.g., tungsten silicide, cobalt silicide, titanium silicide, etc. Embodiments, however, are not limited to these examples.

Among each of the vertical levels, (L1) 213-1, (L2) 213-2, and (L3) 213-M, the horizontally oriented memory cells, e.g., memory cell 110 in FIG. 1, may be spaced apart from one another horizontally in the first direction (D1) 209. However, as described in more detail below in connection with FIG. 4 et. seq., the plurality of discrete components to the laterally oriented access devices 230, e.g., first source/drain region 221 and second source/drain region 223 separated by a channel region 225, extending laterally in the second direction (D2) 205, and the plurality of horizontally oriented digit lines 207-1, 207-2, . . . , 207-P extending laterally in the first direction (D1) 209, may be formed within different vertical layers within each level. For example, the plurality of horizontally oriented digit lines 207-1, 207-2, . . . , 207-P, extending in the first direction (D1) 209, may be disposed on, and in electrical contact with, top surfaces of first source/drain regions 221 and orthogonal to laterally oriented access devices 230, e.g., transistors, extending in laterally in the second direction (D2) 205. In some embodiments, the plurality of horizontally oriented digit lines 207-1, 207-2, . . . , 207-P, extending in the first direction (D1) 209 are formed in a higher vertical layer, farther from the substrate 200, within a level, e.g., within level (L1), than a layer in which the discrete components, e.g., first source/drain region 221 and second source/drain region 223 separated by a channel region 225, of the laterally oriented access device are formed. In some embodiments, the plurality of horizontally oriented digit lines 207-1, 207-2, . . . , 207-P, extending in the first direction (D1) 209, may be connected to the top surfaces of the first source/drain regions 221 directly and/or through additional contacts including metal silicides.

As shown in the example embodiment of FIG. 2, the access lines, 203-1, 203-2, . . . , 203-Q, extend in a vertical direction with respect to the substrate 200, e.g., in a third direction (D3) 211. Further, as shown in FIG. 2, the access lines, 203-1, 203-2, . . . , 203-Q, in one sub cell array, e.g., sub cell array 101-2 in FIG. 1, may be spaced apart from each other in the first direction (D1) 209. The access lines, 203-1, 203-2, . . . , 203-Q, may be provided, extending vertically relative to the substrate 200 in the third direction (D3) 211 between a pair of the horizontally oriented, three-node access devices 230, e.g., transistors, extending laterally in the second direction (D2) 205, but adjacent to each other on a level, e.g., first level (L1), in the first direction (D1) 209. Each of the access lines, 203-1, 203-2, . . . , 203-Q, may vertically extend, in the third direction (D3), on sidewalls of respective ones of the plurality of horizontally oriented, three-node access devices 230, e.g., transistors, that are vertically stacked.

For example, and as shown in more detail in FIG. 3, a first one of the vertically extending access lines, e.g., 203-1, may be adjacent a sidewall of a channel region 225 to a first one of the horizontally oriented, three-node access devices 230, e.g., transistors, in the first level (L1) 213-1, a sidewall of a channel region 225 of a first one of the horizontally oriented, three-node access devices 230, e.g., transistors, in the second level (L2) 213-2, and a sidewall of a channel region 225 a first one of the horizontally oriented, three-node access devices 230, e.g., transistors, in the third level (L3) 213-M, etc. Similarly, a second one of the vertically extending access lines, e.g., 203-2, may be adjacent a sidewall to a channel region 225 of a second one of the horizontally oriented, three-node access devices 230, e.g., transistors, in the first level (L1) 213-1, spaced apart from the first one of horizontally oriented, three-node access devices 230, e.g., transistors, in the first level (L1) 213-1 in the first direction (D1) 209. And the second one of the vertically extending access lines, e.g., 203-2, may be adjacent a sidewall of a channel region 225 of a second one of the horizontally oriented, three-node access devices 230, e.g., transistors, in the second level (L2) 213-2, and a sidewall of a channel region 225 of a second one of the horizontally oriented, three-node access devices 230, e.g., transistors, in the third level (L3) 213-M, etc. Embodiments are not limited to a particular number of levels.

The vertically extending access lines, 203-1, 203-2, . . . , 203-Q, may include a conductive material, such as, for example, one of a doped semiconductor material, a conductive metal nitride, metal, and/or a metal-semiconductor compound. The access lines, 203-1, 203-2, . . . , 203-Q, may correspond to word lines (WL) described in connection with FIG. 1.

As shown in the example embodiment of FIG. 2, an insulating layer dielectric (ILD) 250 may be formed extending in the first direction (D1) 209 along an end surface of the horizontally oriented, three-node access devices 230, e.g., transistors, in each level (L1) 213-1, (L2) 213-2, and (L3) 213-M above the substrate 200. The ILD 250 may isolate and separate the arrays of vertically stacked memory cells, e.g., 101-1, 101-2, . . . , 101-N in FIG. 1, along the second direction (D2) 205. The ILD 250 may include an insulating material, e.g., dielectric material, such as, for example, one of an oxide material, silicon oxide ($SiO_2$) material, silicon nitride (SiN) material, silicon oxynitride material, and/or combination thereof, etc.

Although not shown in FIG. 2, an insulating material may fill other spaces in the vertically stacked array of memory cells. For example, the insulating material may include one or more of a silicon oxide material, a silicon nitride material, and/or a silicon oxynitride material, etc. Embodiments, however, are not limited to these examples.

FIG. 3 illustrates in more detail a unit cell, e.g., memory cell 110 in FIG. 1, of the vertically stacked array of memory cells, e.g., within a sub cell array 101-2 in FIG. 1, according to some embodiments of the present disclosure. As shown in FIG. 3, the first and the second source/drain regions, 321 and 323, may be impurity doped regions to the horizontally oriented, three-node access devices 330, e.g., transistors. The first and the second source/drain regions, 321 and 323, may also comprise a metal, and/or metal composite materials containing ruthenium (Ru), molybdenum (Mo), nickel (Ni), titanium (Ti), copper (Cu), a highly doped degenerate semiconductor material, and/or at least one of indium oxide ($In_2O_3$), or indium tin oxide ($In_{2-x}Sn_xO_3$), formed using an atomic layer deposition process, etc. Embodiments, however, are not limited to these examples. As used herein, a degenerate semiconductor material is intended to mean a semiconductor material, such as polysilicon, containing a high level of doping with significant interaction between dopants, e.g., phosphorous (P), boron (B), etc. Non-degenerate semiconductors, by contrast, contain moderate levels of doping, where the dopant atoms are well separated from each other in the semiconductor host lattice with negligible interaction. The first and the second source/drain regions, 321 and 323, may be analogous to the first and the second source/drain regions 221 and 223 shown in FIG. 2.

The first and the second source/drain regions may be separated by a channel 325, e.g., channel region, of the horizontally oriented, three-node access devices 330, e.g., transistors. The channel 325 may be a low-doped (p-) polysilicon material. In some embodiments, the channel 325 may be a low-doped (p-) poly-germanium (Ge) material. In some embodiments, the channel 325 may be a low doped (p-) poly-silicon-germanium (poly-SiGe) material. However, in some embodiments the channel 325 may be comprised of a semiconductor oxide (also referred to herein as an "oxide semiconductor" or "oxide semiconductor material"). The semiconductor oxide may comprise any suitable composition; and in some embodiments may include one or more of indium, zinc, tin and gallium. Examples of oxide semiconductor materials and/or compositions, as used herein, including one or more of indium, zinc, tin and gallium may include such materials as $ZnO_x$, $InO_x$, $SnO_2$, $Zn_xO_yN$, $Mg_xZn_yO_z$, $In_xZn_yO_z$, $In_xZn_yO_z$, $In_xGa_yZn_zO_a$, $In_x\text{-}Ga_ySi_zO_a$, $Zr_xIn_yZn_zO_a$, $Hf_xIn_yZn_zO_a$, $Sn_xIn_yZn_zO_a$, $Al_xSn_y\text{-}In_zZn_aO_b$, $Si_xIn_yZn_zO_a$, $Zn_xSn_yO_z$, $Al_xZn_ySn_zO_a$, $Ga_xZn_ySn_zO_a$, and $Zr_xZn_ySn_zO_a$.

In additional embodiments, the channel 325 may be comprised of a two-dimensional (2D) material. The 2D material may comprise any suitable composition; and in some embodiments may include one or more of a transition metal dichalcogenide, including molybdenum disulfide ($MoS_2$), molybdenum diselenide ($MoSe_2$), molybdenum ditelluride (MoTe$_2$), tungsten sulfide (WS$_2$), and tungsten selenide (WSe$_2$). Embodiments, however, are not limited to these examples.

In some embodiments the channel 325 may comprise a composite material such as an indium gallium zinc oxide (In$_2$Ga$_2$ZnO$_7$) material (also referred to herein as "IGZO"). In some embodiments, the channel 325 is a multi-layer IGZO channel material that is indium (In) rich in a first layer, closest to a surface of the channel opposing a gate dielectric, relative to the multiple layers. In some embodiments the channel 325 is a multi-layer IGZO channel material that is gallium (Ga) rich in an outer layer, farthest from a surface opposing a gate dielectric, relative to the multiple layers. In some the channel 325 is a multi-layer IGZO channel material that is that is zinc (Zn) rich in an outer layer, farthest from a surface opposing a gate dielectric, relative to the multiple layers, etc. Embodiments, however, are not limited to these examples.

A digit line, e.g., 307-1, analogous to the digit lines 207-1, 207-2, . . . , 207-P in FIGS. 2 and 107-1, 107-2, . . . , 107-P shown in FIG. 1, may be formed in electrical contact with the first source/drain region 321. As used herein, the "first" and "second" source/drain labels only intend that they are separate and distinct source/drain regions, one connected to a digit line and the other to a storage node. As shown in the example embodiment of FIG. 3, an access line, e.g., 303-1, analogous to the access lines 203-1, 203-2, . . . , 203-Q in FIGS. 2 and 103-1, 103-2, . . . , 103-Q in FIG. 1, may be vertically extending in the third direction (D3) 311 adjacent sidewall of the channel region 325 of the horizontally oriented, three-node access devices 330, e.g., transistors horizontally conducting between the first and the second source/drain regions 321 and 323 along the second direction (D2) 305. A gate dielectric material 304 may be interposed between the access line 303-1 (a portion thereof forming a gate to the horizontally oriented, three-node access devices 330, e.g., transistors) and the channel region 325. The gate dielectric material 304 may include, for example, a high-k dielectric material, a silicon oxide material, a silicon nitride material, a silicon oxynitride material, etc., or a combination thereof. In some embodiments, the high-k dielectric material examples of the gate dielectric material 304 may include one or more of hafnium, aluminium, scandium, lanthanum, zirconium, bismuth, niobium having a metal oxide structure. The gate dielectric material 304 may be formed by atomic layer deposition with distinct metal-oxidizer cycles that may sequence metal-metal-oxidizers at temperatures ranging from about 25 degrees Celsius (° C.) to about 500° C., preferably from about 200° C. to about 350° C. Embodiments are not so limited. For example, in high-k dielectric material examples the gate dielectric material 304 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc.

Figure 4:
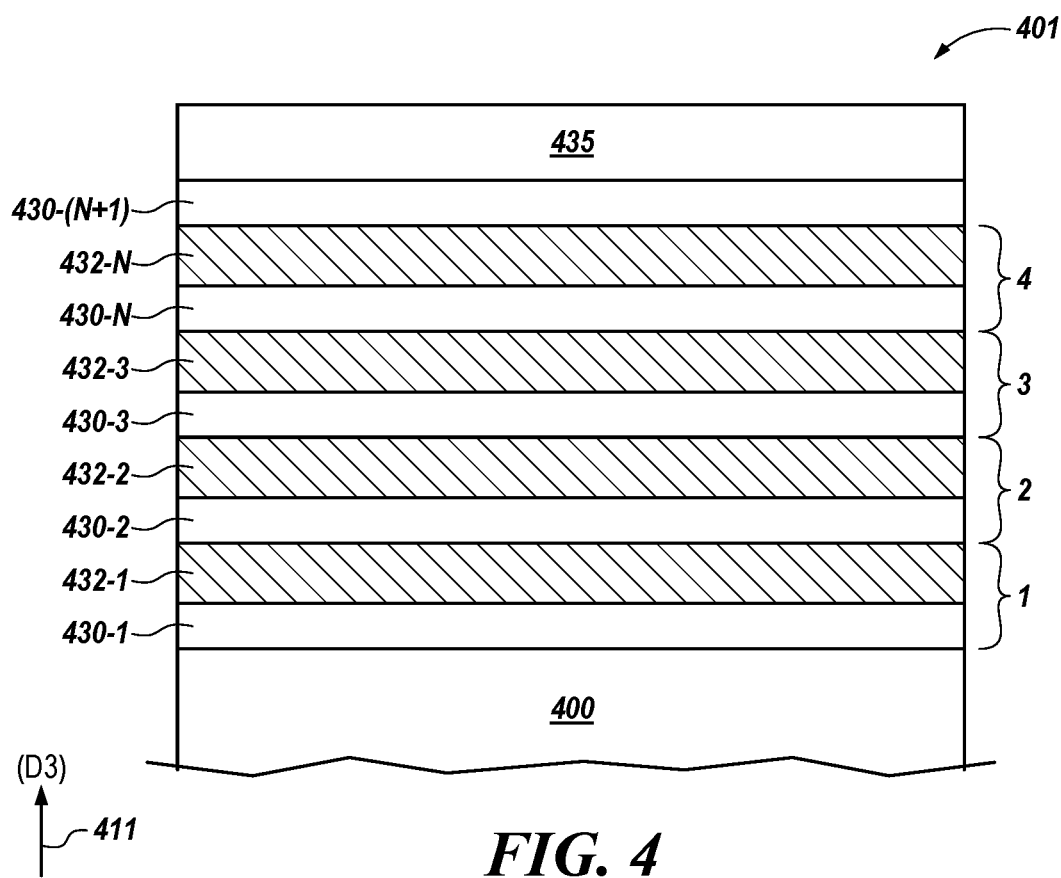
FIG. 4 illustrates an example method for forming arrays of vertically stacked memory cells, at one stage of a semiconductor fabrication process, to form three-node access devices in accordance with a number of embodiments of the present disclosure.

FIG. 4 illustrates an example method, at one stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. In the example embodiment shown in the example of FIG. 4, the method comprises depositing alternating layers of a dielectric material, 430-1, 430-2, . . . , 430-N (also referred to herein independently and/or collectively as "430"), and a sacrificial material, 432-1, 432-2, . . . , 432-N (also referred to herein independently and/or collectively as "432"), in repeating iterations to form a vertical stack 401 on a working surface of a semiconductor substrate 400. In one embodiment, the dielectric material 430 can be deposited to have a thickness, e.g., vertical height in the third direction (D3), in a range of twenty (20) nanometers (nm) to sixty (60) nm. In one embodiment, the sacrificial material 432 can be deposited to have a thickness, e.g., vertical height, in a range of twenty (20) nm to one hundred (100) nm. Embodiments, however, are not limited to these examples.

In one example, the sacrificial material, 432-1, 432-2, . . . , 432-N, can comprise a sacrificial semiconductor material such as polycrystalline silicon (Si), silicon nitride (SiN), or even an oxide-based semiconductor composition. While the discussion herein will refer to a sacrificial semiconductor material example, embodiments are not limited to this example. It is intended that the sacrificial material may be selectively etched relative to the alternating layer of dielectric material, 430-1, 430-2, . . . , 430-N.

As shown in FIG. 4, a vertical direction 411 is illustrated as a third direction (D3), e.g., z-direction in an x-y-z coordinate system, analogous to the third direction (D3), among first, second and third directions, shown in FIGS. 1-3. In the example of FIG. 4, four tiers, numbered 1, 2, 3, and 4, of the repeating iterations of the vertical stack 401 are shown. Embodiments, however, are not limited to this example and more or fewer repeating iterations may be included. A photolithographic hard mask (HM) layer 435 may be deposited as a top layer on the repeating iterations of the vertical stack 401.

In some embodiments, the dielectric material, 430-1, 430-2, . . . , 430-N, may be an interlayer dielectric (ILD). By way of example, and not by way of limitation, the dielectric material, 430-1, 430-2, . . . , 430-N, may comprise a silicon dioxide (SiO$_2$) material. In another example the dielectric material, 430-1, 430-2, . . . , 430-N, may comprise a silicon nitride (Si$_3$N$_4$) material (also referred to herein a "SiN"). In another example the dielectric material, 430-1, 430-2, . . . , 430-N, may comprise a silicon oxy-carbide (SiO$_x$C$_y$) material (also referred to herein as "SiOC"). In another example the dielectric material, 430-1, 430-2, . . . , 430-N, may include silicon oxy-nitride (SiO$_x$N$_y$) material (also referred to herein as "SiON"), and/or combinations thereof. Embodiments are not limited to these examples. In some embodiments the sacrificial semiconductor material, 432-1, 432-2, . . . , 432-N, may comprise a silicon (Si) material in a polycrystalline and/or amorphous state. In another example the sacrificial semiconductor material, 432-1, 432-2, . . . , 432-N, may comprise a silicon nitride (SiN) material. Embodiments, however, are not limited to these examples.

The repeating iterations of alternating dielectric material, 430-1, 430-2, . . . , 430-N, layers and sacrificial semiconductor material, 432-1, 432-2, . . . , 432-N, layers may be deposited according to a semiconductor fabrication process such as chemical vapor deposition (CVD) in a semiconductor fabrication apparatus. Embodiments, however, are not limited to this example and other suitable semiconductor fabrication techniques may be used to deposit the alternating layers of a dielectric material, 430-1, 430-2, . . . , 430-N, and a sacrificial semiconductor material, 432-1, 432-2, . . . , 432-N, in repeating iterations to form a vertical stack 401, as shown in FIG. 4.

Figure 5A:
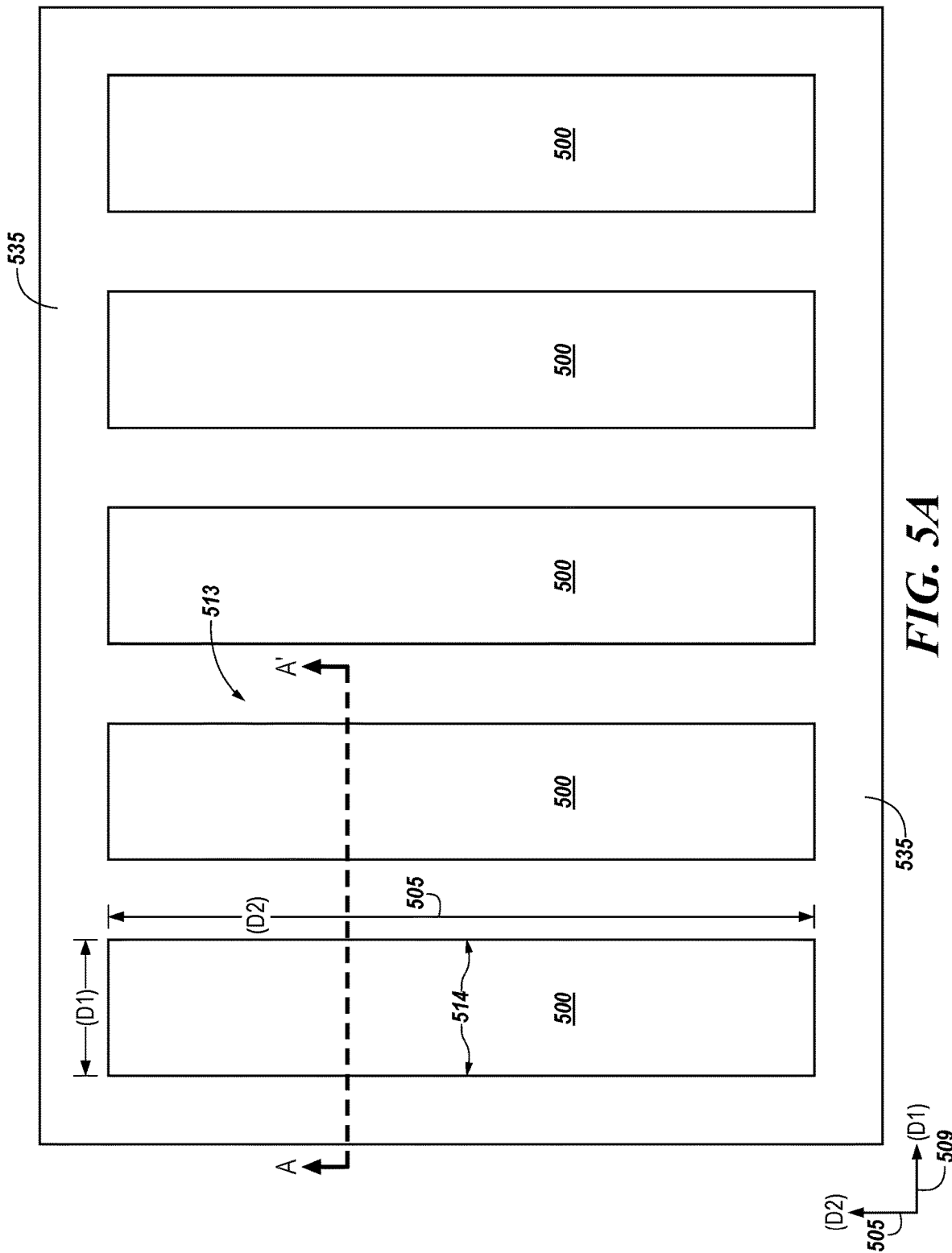

FIG. 5A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 5A illustrates a top down view of a semiconductor structure, at a particular point in time, in a semiconductor fabrication process, according to one or more embodiments. In the example embodiment shown in the example of FIG. 5A, the method comprises using an etchant process to form a plurality of access line vertical openings 500, (also referred to herein as "first" vertical openings) having a first horizontal direction (D1) 509 and a second horizontal direction (D2) 505, through the vertical stack to the substrate. In one example, as shown in FIG. 5A, the plurality of first vertical openings 500 are extending predominantly in the second horizontal direction (D2) 505 and may form elongated vertical, pillar columns 513 with sidewalls 514 in the vertical stack. The plurality of first vertical openings 500 may be formed using photolithographic techniques to pattern a photolithographic mask 535, e.g., to form a hard mask (HM), on the vertical stack prior to etching the plurality of first vertical openings 500.

FIG. 5B is a cross sectional view, taken along cut-line A-A' in FIG. 5A, showing another view of the semiconductor structure at a particular time in the semiconductor fabrication process. FIG. 5B illustrates that a conductive material, 540-1, 540-2, . . . , 540-4, may be formed on a gate dielectric material 538 in the plurality of first vertical openings 500, shown in FIG. 5A. By way of example and not by way of limitation, a gate dielectric material 538 may be conformally deposited in the plurality of first vertical openings 500 using a chemical vapor deposition (CVD) process, plasma enhanced CVD (PECVD), atomic layer deposition (ALD), or other suitable deposition process, to cover a bottom surface and the vertical sidewalls of the plurality of first vertical openings. The gate dielectric 538 may be deposited to a particular thickness (t1) as suited to a particular design rule, e.g., a gate dielectric thickness of approximately 10 nanometers (nm). Embodiments, however, are not limited to this example. By way of example, and not by way of limitation, the gate dielectric 538 may comprise a silicon dioxide ($SiO_2$) material, aluminum oxide ($Al_2O_3$) material, high dielectric constant (k), e.g., high-k, dielectric material, and/or combinations thereof as also described in FIG. 3.

Further, as shown in FIG. 5B, a conductive material, 540-1, 540-2, . . . , 540-4, may be conformally deposited in the plurality of first vertical openings 500 on a surface of the gate dielectric material 538. By way of example, and not by way of limitation, the conductive material, 540-1, 540-2, . . . , 540-4, may be conformally deposited in the plurality of first vertical openings 500 on a surface of the gate dielectric material 538 using a chemical vapor deposition process (CVD), plasma enhanced CVD (PECVD), atomic layer deposition (ALD), or other suitable deposition process, to cover a bottom surface and the vertical sidewalls of the plurality of first vertical openings over the gate dielectric 538. The conductive material, 540-1, 540-2, . . . , 540-4, may be conformally deposited to a particular thickness (t2) to form vertically oriented access lines, such as shown as access lines 103-1, 103-2, . . . , 103-Q (which also may be referred to a word lines) shown in FIG. 1, et. seq., and as suited to a particular design rule. For example, the conductive material, 540-1, 540-2, . . . , 540-4, may be conformally deposited to a thickness of approximately 20 nanometers (nm). Embodiments, however, are not limited to this example. By way of example, and not by way of limitation, the conductive material, 540-1, 540-2, . . . , 540-4, may be comprise a metal such as tungsten (W), metal composition, titanium nitride (TiN), doped polysilicon, and/ or some other combination thereof as also described in FIG. 3.

As shown in FIG. 5B, the conductive material, 540-1, 540-2, . . . , 540-4, may be recessed back to remain only along the vertical sidewalls of the elongated vertical, pillar columns, now shown as 542-1, 542-2, and 542-3 in the cross-sectional view of FIG. 5B. The plurality of separate, vertical access lines formed from the conductive material, 540-1, 540-2, . . . , 540-4, may be recessed back by using a suitable selective, anisotropic etch process remove the conductive material, 540-1, 540-2, . . . , 540-4, from a bottom surface of the first vertical openings, e.g., 500 in FIG. 5A, exposing the gate dielectric 538 on the bottom surface to form separate, vertical access lines, 540-1, 540-2, . . . , 540-4. As shown in FIG. 5B, a dielectric material 539, such as an oxide or other suitable spin on dielectric (SOD), may then be deposited in the first vertical openings 500, using a process such as CVD, to fill the first vertical openings 500. The dielectric may be planarized to a top surface of the hard mask 535 of the vertical semiconductor stack, e.g., 401 as shown in FIG. 4, using chemical mechanical planarization (CMP) or other suitable semiconductor fabrication technique. A subsequent photolithographic material 536, e.g., hard mask, may be deposited using CVD and planarized using CMP to cover and close the first vertical openings 500 over the separate, vertical access lines, 540-1, 540-2, . . . , 540-4. Similar semiconductor process techniques may be used at other points of the semiconductor fabrication process described herein.

Figure 6A:
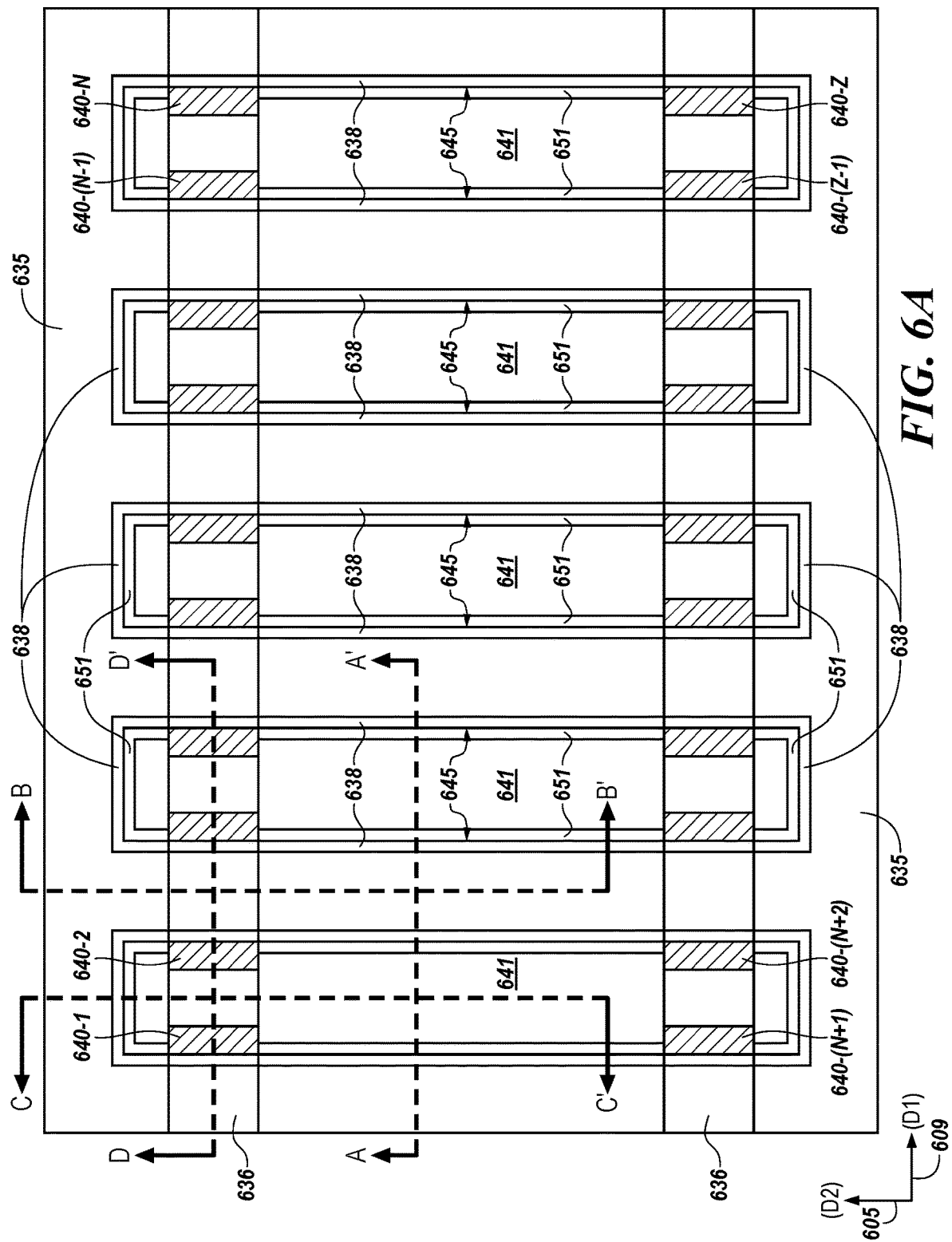

FIG. 6A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 6A illustrates a top down view of a semiconductor structure, at a particular point in time, in a semiconductor fabrication process, according to one or more embodiments. In the example embodiment of FIG. 6A, the method comprises using a photolithographic process to pattern the photolithographic mask 636, 536 in FIG. 5B. The method in FIG. 6A, further illustrates using a selective, isotropic etchant process remove portions of the exposed conductive material, 540-1, 540-2, . . . , 540-4 in FIG. 5B, to separate and individually form the plurality of separate, vertical access lines, 640-1, 640-2, . . . , 640-N, 640-(N+1), . . . , 640-(Z-1), and 640-Z, e.g., access lines 103-1, 103-2, . . . , 103-Q in FIG. 1, et. seq. Hence the plurality of separate, vertical access lines, 640-1, 640-2, . . . , 640-N, 640-(N+1), . . . , 640-(Z-1), and 640-Z, are shown along the sidewalls of the elongated vertical, pillar columns, e.g., along sidewalls of the elongated vertical, pillar columns 542-1, 542-2, and 542-3 in the cross-sectional view of FIG. 5B.

As shown in the example of FIG. 6A, the exposed conductive material, 540-1, 540-2, . . . , 540-4 in FIG. 5B, may be removed back to the gate dielectric 638 in the first vertical openings, e.g., 500 in FIG. 5A, using a suitable selective, isotropic etch process. As shown in FIG. 6A, a subsequent dielectric material 641, such as an oxide or other suitable spin on dielectric (SOD), may then be deposited to fill the remaining openings from where the exposed conductive material, 540-1, 540-2, . . . , 540-4 in FIG. 5B, was removed using a process such as CVD, or other suitable technique. The dielectric material 641 may be planarized to a top surface of the previous hard mask 635 of the vertical semiconductor stack, e.g., 401 as shown in FIG. 4, using a process such as CMP, or other suitable technique. In some embodiments, a subsequent photolithographic material 537, e.g., hard mask, may be deposited using CVD and planarized using CMP to cover and close the plurality of separate, vertical access lines, 640-1, 640-2, . . . , 640-N, 640-(N+1), . . . , 640-(Z−1), and 640-Z, over a working surface of the vertical semiconductor stack, 401 in FIG. 4, leaving the plurality of separate, vertical access lines, 640-1, 640-2, . . . , 640-N, 640-(N+1), . . . , 640-(Z−1), and 640-Z, protected along the sidewalls of the elongated vertical, pillar columns. Embodiments, however, are not limited to these process examples.

In some embodiments, when portions of the exposed conductive material, 540-1, 540-2, . . . , 540-4 in FIG. 5B are removed, damage to the gate dielectric 638 may occur. For example, the gate dielectric 638 may be exposed to the same selective, isotropic etchant process used to remove the conductive material, 540-1, 540-2, . . . , 540-4 in FIG. 5B. Exposing the gate dielectric 638 to the selective, isotropic etchant process may damage the gate dielectric 638 on a first side 645, e.g., region in the vertical access line trenches 500 in FIG. 5B, where the plurality of separate, vertical access lines, 640-1, 640-2, . . . , 640-N, 640-(N+1), . . . , 640-(Z−1), and 640-Z are formed. In some embodiments, the damaged caused to the gate dielectric 638 may be repaired by providing a treatment to heal the damage portions of the gate dielectric 638 and restore the insulative properties of the gate dielectric 638.

In some embodiments, atomic layer deposition (ALD) of a liner 651 may be used to initiate the repair of the gate dielectric 638. Embodiments, however, are not limited to these examples. For example, deposition of a dielectric liner 651 may comprise a repair using remote ionization, oxygen, or oxygen containing species or mixes of gases in ratios that preferentially repair the gate dielectric 638 while minimizing oxidation of the plurality of separate, vertical access lines, 640-1, 640-2, . . . , 640-N, 640-(N+1), . . . , 640-(Z−1), and 640-Z. Combinations that provide a mix of molecular oxygen and ionized species may be formed most effectively in temperatures ranging from about 150 degrees Celsius (° C.) to 600° C. Short pulses of a metal atom, e.g., hafnium (Hf), aluminum (Al), scandium (Sc), lanthanum (La), zirconium (Zr), etc., in precursor form, of the gate dielectric 638 may be included to return the first side 645, e.g., region, of the gate dielectric 638 to an intended stoichiometry. For example, ozone may be a treatment, limited by a degree of interaction with the gate electrode material, e.g., tantalum (Ta), titanium (Ti), tungsten (W), molybdenum (Mo), hafnium (Hf), ruthenium (Ru), etc., of the plurality of separate, vertical access lines, 640-1, 640-2, . . . , 640-N, 640-(N+1), . . . , 640-(Z−1), and 640-Z. Pulses of water vapor may also be used to return structure of the gate dielectric 638 region 651 to an intended stoichiometry and surface bond termination.

In some embodiments, annealing or doping may be used to initiate the repair of the gate dielectric 638. In some embodiments, atomic layer deposition (ALD) of a liner 651 may be followed by a post deposition anneal, or doping may be used to flow precursor to contact a first side 645 of the gate dielectric 638. The precursors may include compounds, such as, silane, hydroxyl, ethyl, methyl, or oxysilane. Subsequently, the first side 645 of the gate dielectric 638 may be exposed to thermal energy, plasma energy, microwave, or other energy sources to generate gas mixes of at least one of hydrogen ($H_2$), oxygen ($O_2$), nitrogen ($N_2$), helium (He), silane, carbonyl, metal organics, peroxide, forms of hydrazine, ammonia ($NH_3$), and/or a halide. According to some embodiments, contacting the first side 645 of the gate dielectric 638 with the precursor and gas mixtures generated by thermal energy, plasma energy, microwave, or other energy sources may repair the damage on the first side 645 of the gate dielectric 638 caused by the selective, isotropic etchant process used to remove the conductive material, 540-1, 540-2, . . . , 540-4 in FIG. 5B and form the plurality of separate, vertical access lines, 640-1, 640-2, . . . , 640-N, 640-(N+1), . . . , 640-(Z−1), and 640-Z.

FIG. 6B illustrates a cross sectional view, taken along cut-line A-A' in FIG. 6A, showing another view of the semiconductor structure at this particular point in one example semiconductor fabrication process of an embodiment of the present disclosure. The cross sectional view shown in FIG. 6B is away from the plurality of separate, vertical access lines, 640-1, 640-2, . . . , 640-N, 640-(N+1), . . . , 640-(Z−1), and shows the repeating iterations of alternating layers of a dielectric material, 630-1, 630-2, . . . , 630-N, and a sacrificial semiconductor material, 632-1, 632-2, . . . , 632-N, on a semiconductor substrate 400 to form the vertical stack, e.g. 401 as shown in FIG. 4. As shown in FIG. 6B, a vertical direction 611 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 609. In the example embodiment of FIG. 6B, the dielectric material 641 is shown filling the vertical openings on the residual gate dielectric 638 deposition. The hard mask 637, described above, caps the illustrated structure.

FIG. 6C illustrates a cross sectional view, taken along cut-line B-B' in FIG. 6A, showing another view of the semiconductor structure at this particular point in one example semiconductor fabrication process of an embodiment of the present disclosure. The cross sectional view shown in FIG. 6C is illustrated extending in the second direction (D2) 605 along an axis of the repeating iterations of alternating layers of a dielectric material, 630-1, 630-2, . . . , 630-N, and a sacrificial semiconductor material, 632-1, 632-2, . . . , 632-N, along and in which the horizontally oriented access devices and horizontally oriented storage nodes, e.g., capacitor cells, can be formed within the layers of sacrificial semiconductor material, 632-1, 632-2, . . . , 632-N. In FIG. 6C, a neighboring, opposing vertical access line 640-3 is illustrated by a dashed line indicating a location set in from the plane and orientation of the drawing sheet.

FIG. 6D illustrates a cross sectional view, taken along cut-line C-C' in FIG. 6A, showing another view of the semiconductor structure at this particular point in one example semiconductor fabrication process of an embodiment of the present disclosure. The cross sectional view shown in FIG. 6D is illustrated extending in the second direction (D2) 605 along an axis of the repeating iterations of alternating layers of a dielectric material, 630-1, 630-2, . . . , 630-N, and a sacrificial semiconductor material, 632-1, 632-2, . . . , 632-N, outside of a region in which the horizontally oriented access devices and horizontally oriented storage nodes, e.g., capacitor cells, will be formed within the layers of sacrificial semiconductor material, 632-1, 632-2, . . . , 632-N. In FIG. 6C, the dielectric material 641 is shown filling the space between the horizontally oriented access devices and horizontally oriented storage nodes, which can be spaced along a first direction (D1), extending into and out from the plane of the drawings sheet, for a three-dimensional array of vertically oriented memory cells. At the left end of the drawing sheet is shown the repeating iterations of alternating layers of a dielectric material, 630-1, 630-2, . . . , 630-(N+1), and a sacrificial semiconductor material, 632-1, 632-2, . . . , 632-N, at which location a horizontally oriented digit line, e.g., digit lines 107-1, 107-2, . . . , 107-P shown in FIG. 1, et. seq., can be integrated to form electrical contact with the second source/drain regions, described in more detail below.

FIG. 6E illustrates a cross sectional view, taken along cut-line D-D' in FIG. 6A, showing another view of the semiconductor structure at this particular point in one example semiconductor fabrication process of an embodiment of the present disclosure. The cross sectional view shown in FIG. 6E is illustrated, right to left in the plane of the drawing sheet, extending in the first direction (D1) 609 along an axis of the repeating iterations of alternating layers of a dielectric material, 630-1, 630-2, . . . , 630-N, and a sacrificial semiconductor material, 632-1, 632-2, . . . , 632-N, intersecting across the plurality of separate, vertical access lines, 640-1, 640-2, . . . , 640-N, 640-(N+1), . . . , 640-(Z−1), and intersecting regions of the sacrificial semiconductor material, 632-1, 632-2, . . . , 632-N, in which a channel region may be formed, separated from the plurality of separate, vertical access lines, 640-1, 640-2, . . . , 640-N, 640-(N+1), . . . , 640-(Z−1), by the gate dielectric 638. In FIG. 6E, the first dielectric fill material 639 is shown separating the space between neighboring horizontally oriented access devices and horizontally oriented storage nodes, which may be formed extending into and out from the plane of the drawing sheet as described in more detail below, and can be spaced along a first direction (D1) 609 and stacked vertically in arrays extending in the third direction (D3) 611 in the three-dimensional (3D) memory.

Figure 7A:
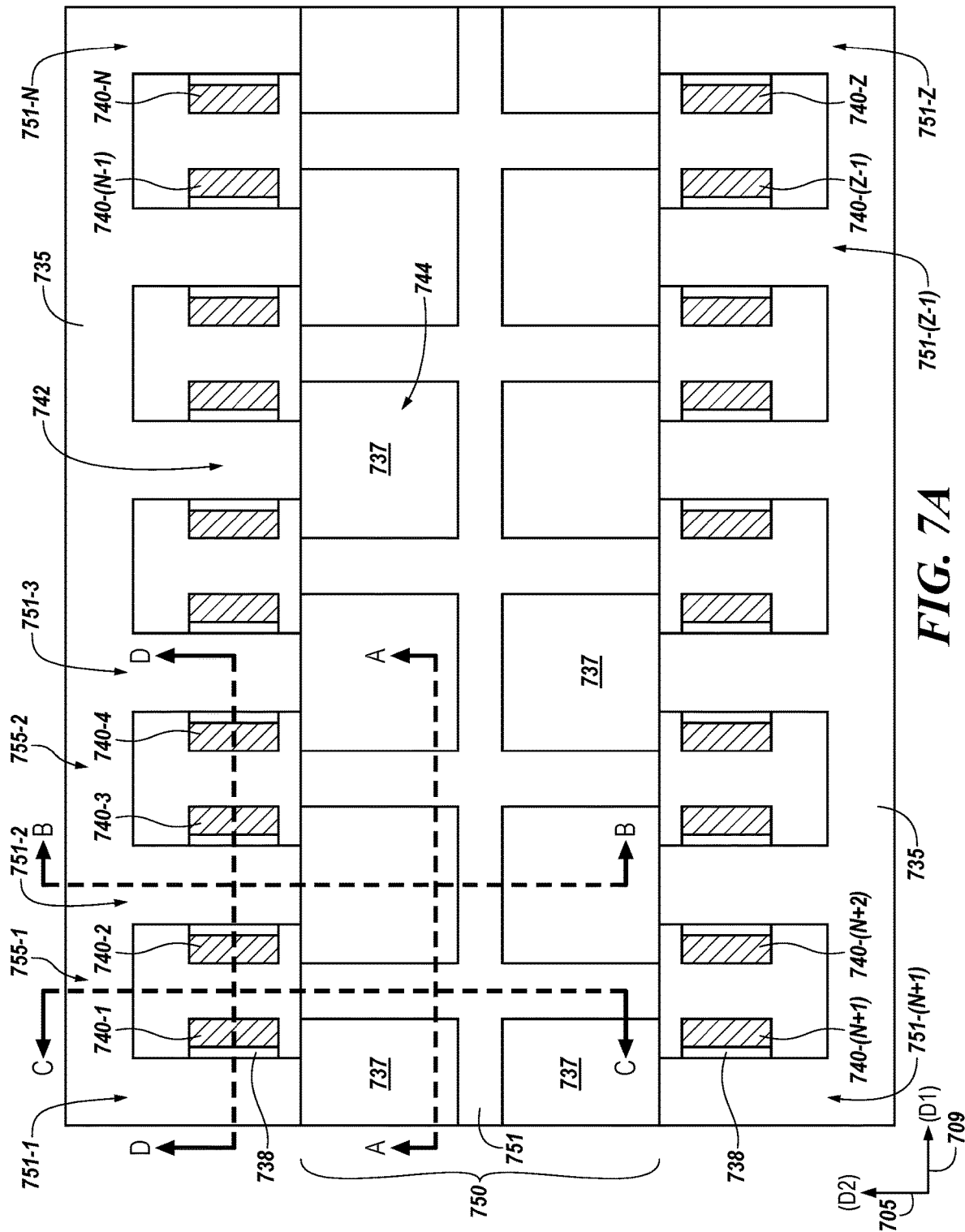

FIG. 7A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 7A illustrates a top down view of a semiconductor structure, at a particular point in time, in a semiconductor fabrication process, according to one or more embodiments. In the example embodiment of FIG. 7A, the method comprises using a photolithographic process to pattern the photolithographic masks 735, 736 and/or 737, e.g., 635, 636, and/or 637 in FIGS. 6A-6E. The method in FIG. 7A, further illustrates using one or more etchant processes to form a vertical opening 751 in a storage node region 750 (and 744 in FIGS. 7A and 7C) through the vertical stack and extending predominantly in the first horizontal direction (D1) 709. The one or more etchant processes forms a vertical opening 751 to expose third sidewalls in the repeating iterations of alternating layers of a dielectric material, 730-1, kj730-2, . . . , 730-N, and a sacrificial semiconductor material, 732-1, 732-2, . . . , 732-N, in the vertical stack, shown in FIGS. 7B-7E, adjacent a second region of the sacrificial semiconductor material. Other numerated components may be analogous to those shown and discussed in connection with FIG. 6.

According to embodiments, a second region of the sacrificial semiconductor material, 732-1, 732-2, . . . , 732-N, may be removed from the repeating iterations of alternating layers of a dielectric material, 730-1, 730-2, . . . , 730-N, and a sacrificial semiconductor material, 732-1, 732-2, . . . , 732-N, in the vertical stack to form a storage node. In some embodiments, this process is performed before selectively removing an access device region, e.g., transistor region, of the sacrificial semiconductor material in which to form a first source/drain region, channel region, and second source/drain region of the horizontally oriented access devices. In other embodiments, this process is performed after selectively removing an access device region of the sacrificial semiconductor material in which to form a first source/drain region, channel region, and second source/drain region of the horizontally oriented access devices. According to an example embodiment, shown in FIGS. 7B-7E, the method comprises selectively etching the second region of the sacrificial semiconductor material, 732-1, 732-2, . . . , 732-N, to form a second horizontal opening a second horizontal distance back from a vertical opening 751 in the vertical stack. In some embodiments, as shown in FIGS. 7B-7E, the method comprises forming capacitor cell as the storage node in the second horizontal opening. By way of example, and not by way of limitation, forming the capacitor comprises using an atomic layer deposition (ALD) process, chemical vapor deposition, and combinations thereof to sequentially deposit, in the second horizontal opening, a first electrode 761 and a second electrode 756 separated by a cell dielectric 763. Other suitable semiconductor fabrication techniques and/or storage nodes structures may be used. In some embodiments, the first electrode 761 and the second electrode 756 may include one or more of tantalum (Ta), titanium (Ti), tungsten (W), molybdenum (Mo), hafnium (Hf), ruthenium (Ru), platinum (Pt), palladium (Pd), germanium (Ge), silicon (Si), nitrogen ($N_2$), oxygen ($O_2$), and/or carbon (C). The first electrode 761 and the second electrode 756 may be formed at temperatures ranging from about 25° C. to about 700° C., preferably from about 180° C. to about 400° C.

FIG. 7B illustrates a cross sectional view, taken along cut-line A-A' in FIG. 7A, showing another view of the semiconductor structure at this particular point in one example semiconductor fabrication process of an embodiment of the present disclosure. The cross sectional view shown in FIG. 7B is away from the plurality of separate, vertical access lines, 740-1, 740-2, . . . , 740-N, 740-(N+1), 740-(Z−1), and shows repeating iterations of alternating layers of a dielectric material, 730-1, 730-2, . . . , 730-(N+1), separated by horizontally oriented capacitor cells having first electrodes 761, e.g., bottom cell contact electrodes, cell dielectrics 763, and second electrodes 756, e.g., top, common node electrodes, on a semiconductor substrate 700 to form the vertical stack. As shown in FIG. 7B, a vertical direction 711 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 709. In the example embodiment of FIG. 7B, the first electrodes 761, e.g., bottom electrodes to be coupled to source/drain regions of horizontal access devices, and second electrodes 756 are illustrated separated by a cell dielectric material 763 extending into and out of the plane of the drawing sheet in second direction (D2) and along an axis of orientation of the horizontal access devices and horizontal storage nodes of the arrays of vertically stacked memory cells of the three-dimensional (3D) memory.

FIG. 7C illustrates a cross sectional view, taken along cut-line B-B' in FIG. 7A, showing another view of the semiconductor structure at this particular point in one example semiconductor fabrication process of an embodiment of the present disclosure. The cross sectional view shown in FIG. 7C is illustrated extending in the second direction (D2) 705, left and right along the plane of the drawing sheet, along an axis of the repeating iterations of alternating layers of a dielectric material, 730-1, 730-2, . . . , 730-(N+1), and a sacrificial semiconductor material, 732-1, 732-2, . . . , 732-N, along and in which the horizontally oriented access devices and horizontally oriented storage nodes, e.g., capacitor cells, can be formed within the layers of sacrificial semiconductor material, 732-1, 732-2, . . . , 732-N. In the example embodiment of FIG. 7C, the horizontally oriented storage nodes, e.g., capacitor cells, are illustrated as having been formed been formed in this semiconductor fabrication process and first electrodes 761, e.g., bottom electrodes to be coupled to source/drain regions of horizontal access devices, and second electrodes 756, e.g., top electrodes to be coupled to a common electrode plane such as a ground plane, separated by cell dielectrics 763, are shown. However, embodiments are not limited to this example. In other embodiments the first electrodes 761, e.g., bottom electrodes to be coupled to source/drain regions of horizontal access devices, and second electrodes 756, e.g., top electrodes to be coupled to a common electrode plane such as a ground plane, separated by cell dielectrics 763, may be formed subsequent to forming a first source/drain region, a channel region, and a second source/drain region in a region of the sacrificial semiconductor material, 732-1, 732-2, . . . , 732-N, intended for location, e.g., placement formation, of the horizontally oriented access devices, described next.

In the example embodiment of FIG. 7C, the horizontally oriented storage nodes having the first electrodes 761, e.g., bottom electrodes to be coupled to source/drain regions of horizontal access devices, and second electrodes 756, e.g., top electrodes to be coupled to a common electrode plane such as a ground plane, are shown formed in a second horizontal opening extending in second direction (D2), left and right in the plane of the drawing sheet, a second distance for the vertical opening formed in the vertical stack and along an axis of orientation of the horizontal access devices and horizontal storage nodes of the arrays of vertically stacked memory cells of the three-dimensional (3D) memory. In FIG. 7C, a neighboring, opposing vertical access line 740-3 is illustrated by a dashed line indicating a location set inward from the plane and orientation of the drawing sheet.

Figure 7D:
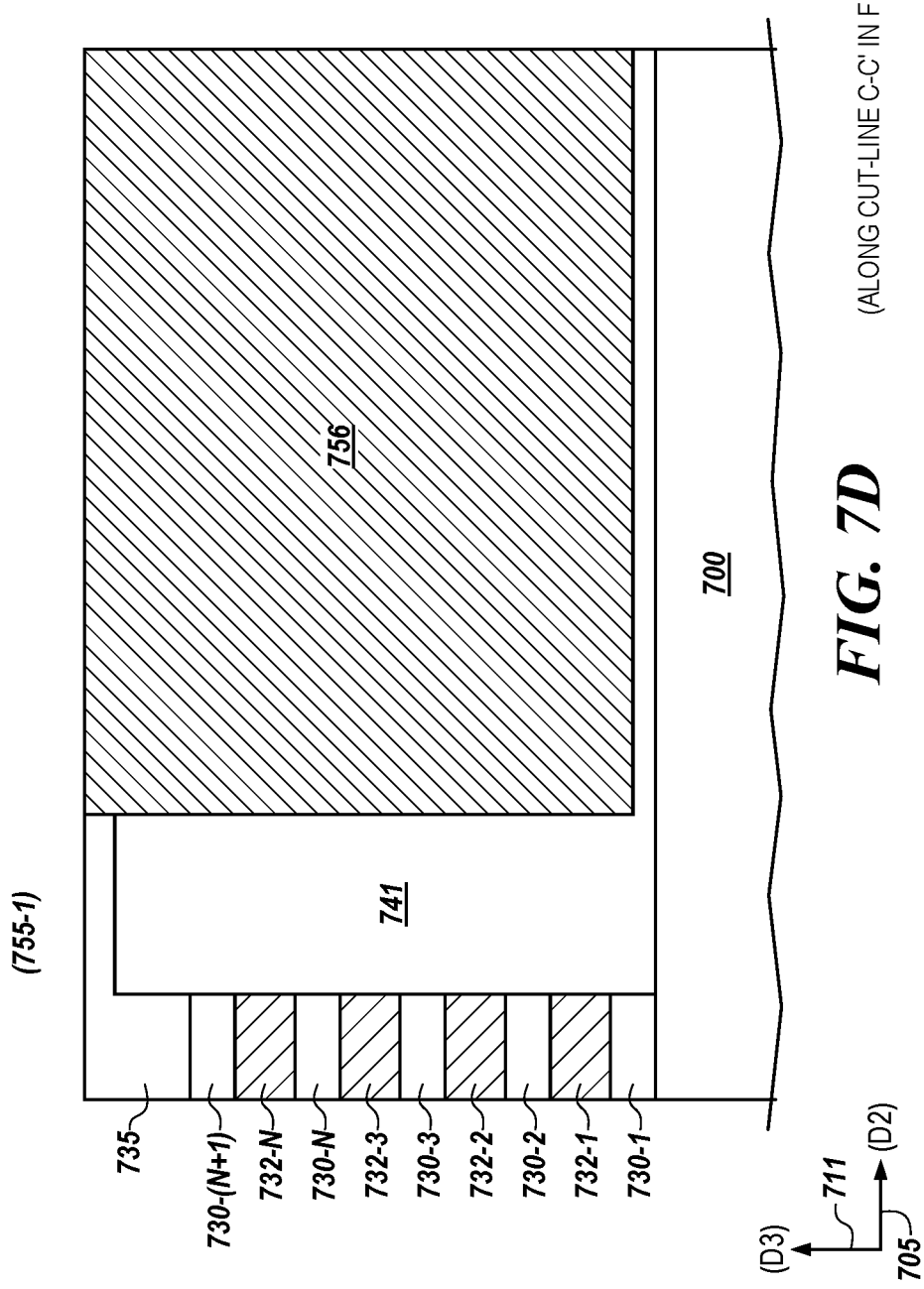

FIG. 7D illustrates a cross sectional view, taken along cut-line C-C' in FIG. 7A, showing another view of the semiconductor structure at this particular point in one example semiconductor fabrication process of an embodiment of the present disclosure. The cross sectional view shown in FIG. 7D is illustrated extending in the second direction (D2) 705, left and right in the plane of the drawing sheet, along an axis of the repeating iterations of alternating layers of a dielectric material, 730-1, 730-2, . . . , 730-N, 730-(N+1) and a sacrificial semiconductor material, 732-1, 732-2, . . . , 732-N, outside of a region in which the horizontally oriented access devices and horizontally oriented storage nodes, e.g., capacitor cells, will be formed within the layers of sacrificial semiconductor material, 732-1, 732-2, . . . , 732-N. In FIG. 7C, the dielectric material 741 is shown filling the space between the horizontally oriented access devices, which can be spaced along a first direction (D1), extending into and out from the plane of the drawings sheet, for a three-dimensional array of vertically oriented memory cells. However, in the cross sectional view of FIG. 7D, the second electrode 756, e.g., top, common electrode to the capacitor cell structure, is additionally shown present in the space between horizontally neighboring devices. At the left end of the drawing sheet is shown the repeating iterations of alternating layers of a dielectric material, 730-1, 730-2, . . . , 730-(N+1), and a sacrificial semiconductor material, 732-1, 732-2, . . . , 732-N, at which location a horizontally oriented digit line, e.g., digit lines 107-1, 107-2, . . . , 107-P shown in FIG. 1, et. seq., can be integrated to form electrical contact with the second source/drain region, described in more detail below.

FIG. 7E illustrates a cross sectional view, taken along cut-line D-D' in FIG. 7A, showing another view of the semiconductor structure at this particular point in one example semiconductor fabrication process of an embodiment of the present disclosure. The cross sectional view shown in FIG. 7E is illustrated, right to left in the plane of the drawing sheet, extending in the first direction (D1) 709 along an axis of the repeating iterations of alternating layers of a dielectric material, 730-1, 730-2, . . . , 730-(N+1), and a sacrificial semiconductor material, 732-1, 732-2, . . . , 732-N, intersecting across the plurality of separate, vertical access lines, 740-1, 740-2, . . . , 740-4, and intersecting regions of the sacrificial semiconductor material, 732-1, 732-2, . . . , 732-N, in which a channel region may be formed, separated from the plurality of separate, vertical access lines, 740-1, 740-2, . . . , 740-4, by the gate dielectric 738. In FIG. 7E, the first dielectric fill material 739 is shown separating the space between neighboring horizontally oriented access devices and horizontally oriented storage nodes, which may be formed extending into and out from the plane of the drawing sheet as described in more detail below, and can be spaced along a first direction (D1) 709 and stacked vertically in arrays extending in the third direction (D3) 711 in the three-dimensional (3D) memory.

Figure 8A:
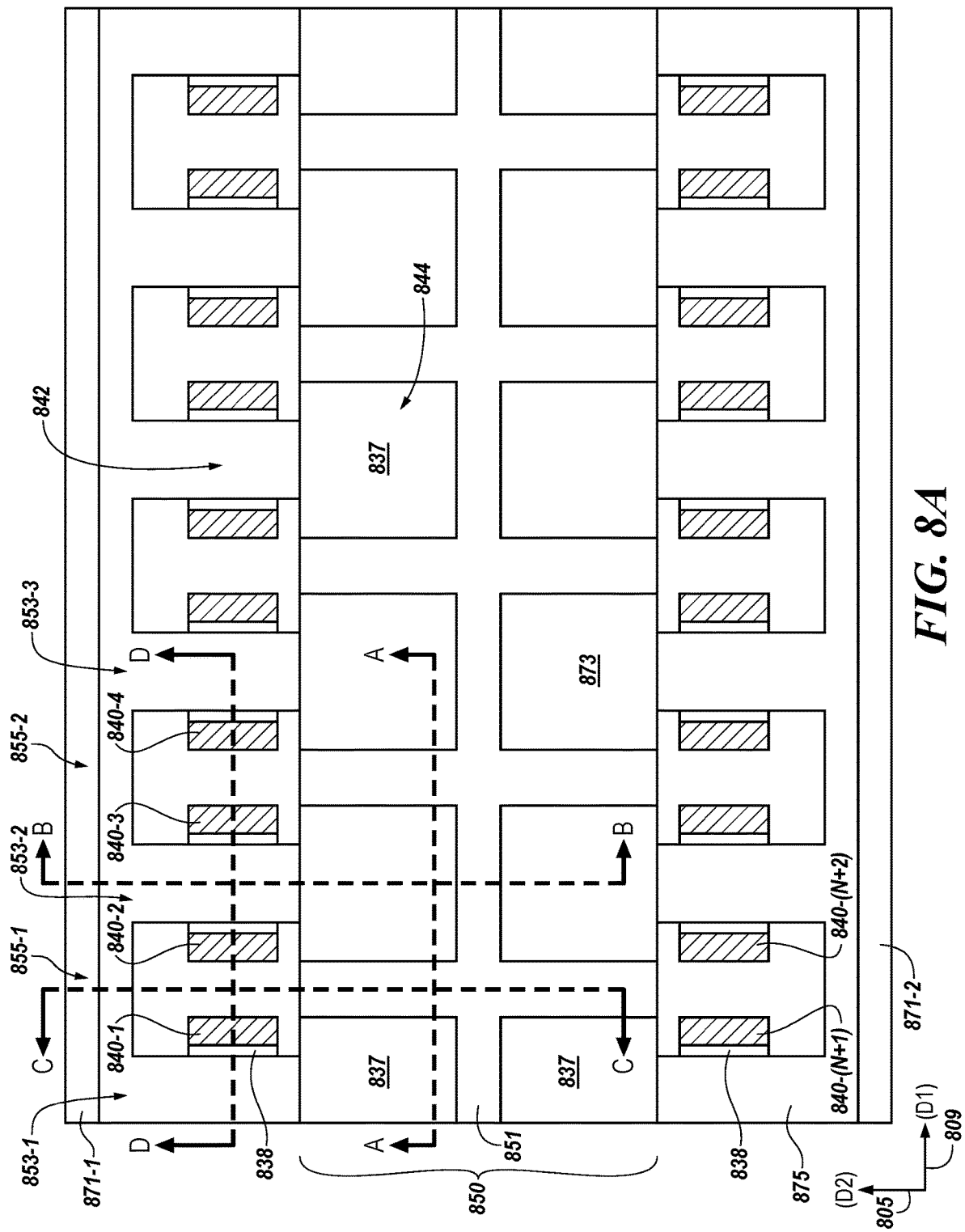

FIG. 8A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 8A illustrates a top down view of a semiconductor structure, at a particular point in time, in a semiconductor fabrication process, according to one or more embodiments. In the example embodiment of FIG. 8A, the method comprises using a photolithographic process to pattern the photolithographic masks 835, 836 and/or 837, etc. as described in FIGS. 6 and 7. The method in FIG. 8A, further illustrates using one or more etchant processes to form a vertical opening, 871-1 and 871-2, in access device regions, e.g., 742 in FIG. 7C and 842 in FIG. 8C for replacement channel and source/drain transistor regions, through the vertical stack. The vertical openings 871-1 and 871-2 are illustrated extending predominantly in the first horizontal direction (D1) 709. The one or more etchant processes forms a vertical openings, 871-1 and 871-2, to expose third sidewalls in the repeating iterations of alternating layers of a dielectric material, 830-1, 830-2, . . . , 830-(N+1), and a sacrificial semiconductor material, e.g., sacrificial material 732-1, 732-2, . . . , 732-N described in connection with FIG. 7, in the vertical stack, shown in FIGS. 8B-8E, adjacent a first region of the sacrificial semiconductor material. Other numerated components may be analogous to those shown and discussed in connection with FIGS. 6 and 7.

According to embodiments, an access device region (842 in FIGS. 8A and 8C), e.g., transistor region, of the sacrificial semiconductor material, 732-1, 732-2, . . . , 732-N, may be removed from the repeating iterations of alternating layers of a dielectric material, 830-1, 830-2, . . . , 830-(N+1), and a sacrificial semiconductor material, 732-1, 732-2, . . . , 732-N, in the vertical stack to form an access device, e.g. transistor. In some embodiments, this process is performed before selectively removing a storage node region of the sacrificial semiconductor material in which to form a capacitor cell. In other embodiments, this process is performed after selectively removing a storage node region of the sacrificial semiconductor material in which to form a capacitor cell. According to an example embodiment, shown in FIGS. 8B-8E, the method comprises selectively etching the access device region of the sacrificial semiconductor material, 732-1, 732-2, . . . , 732-N, to form a first horizontal opening a first horizontal distance back from a vertical openings, 871-1 and 871-2 in the vertical stack. In some embodiments, as shown in FIGS. 8B-8E, the method comprises forming a transistor having a first source/drain region, channel region, and second source/drain region as the access device in the first horizontal opening. By way of example, and not by way of limitation, forming the first source/drain region, the channel region, and the second source/drain region comprises using an atomic layer deposition (ALD) process to sequentially deposit, in the first horizontal opening, the first source/drain region, the channel region, and the second source/drain region. Other suitable semiconductor fabrication techniques and/or storage nodes structures may be used.

FIG. 8B illustrates a cross sectional view, taken along cut-line A-A' in FIG. 8A, showing another view of the semiconductor structure at this particular point in one example semiconductor fabrication process of an embodiment of the present disclosure. The cross sectional view shown in FIG. 8B is away from the plurality of separate, vertical access lines, 840-1, 840-2, . . . , 840-N, 840-(N+1), . . . , 840-(Z−1), and shows repeating iterations of alternating layers of a dielectric material, 830-1, 830-2, . . . , 830-(N+1), separated by capacitor cells having first electrodes 861, e.g., bottom cell contact electrodes, cell dielectrics 863, and second electrodes 856, e.g., top, common node electrode, on a semiconductor substrate 800 to form the vertical stack. As shown in FIG. 8B, a vertical direction 811 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 809. In the example embodiment of FIG. 8B, the first electrodes 861, e.g., bottom electrodes to be coupled to source/drain regions of horizontal access devices, and second electrodes 856 are illustrated separated by a cell dielectric material 863 extending into and out of the plane of the drawing sheet in second direction (D2) and along an axis of orientation of the horizontal access devices and horizontal storage nodes of the arrays of vertically stacked memory cells of the three-dimensional (3D) memory.

FIG. 8C illustrates a cross sectional view, taken along cut-line B-B' in FIG. 8A, showing another view of the semiconductor structure at this particular point in one example semiconductor fabrication process of an embodiment of the present disclosure. The cross sectional view shown in FIG. 8C is illustrated extending in the second direction (D2) 805, left and right along the plane of the drawing sheet, along an axis of the repeating iterations of alternating layers of a dielectric material, 830-1, 830-2, . . . , 830-(N+1). However, now is shown that the sacrificial semiconductor material has been removed in a access device region 842 of the alternating layers of the vertical stack to form horizontal openings, 833-1, 833-2, . . . , 833-N, in which the horizontally oriented access devices having a first source/drain region, channel region, and second source/drain region can be formed between the vertical alternating layers of a dielectric material, 830-1, 830-2, . . . , 830-(N+1). In the example embodiment of FIG. 8C, the horizontally oriented storage nodes, e.g., capacitor cells, are illustrated as having been formed in this semiconductor fabrication process in the storage node region 844 and first electrodes 861, e.g., bottom electrodes to be coupled to source/drain regions of horizontal access devices, and second electrodes 856, e.g., top electrodes to be coupled to a common electrode plane such as a ground plane, separated by a cell dielectric 863, are shown. However, embodiments are not limited to this example. In other embodiments the first electrodes 861, e.g., bottom electrodes to be coupled to source/drain regions of horizontal access devices, and second electrodes 856, e.g., top electrodes to be coupled to a common electrode plane such as a ground plane, separated by cell dielectrics 863, may be formed subsequent to forming a first source/drain region, a channel region, and a second source/drain region in an access device region 842 where the sacrificial semiconductor material, 732-1, 732-2, . . . , 732-N has been removed.

In the example embodiment of FIG. 8C, the horizontally openings 833-1, 833-2, . . . , 833-N, in which to form the access devices having a first source/drain region, channel region, and second source/drain region, are shown extending in second direction 805 (D2), left and right in the plane of the drawing sheet, a distance from the vertical openings 871-1 and 871-2 formed in the vertical stack and along an axis of orientation of the horizontal access devices and horizontal storage nodes of the arrays of vertically stacked memory cells of the three-dimensional (3D) memory. In FIG. 8C, a neighboring, opposing vertical access line 840-3 is illustrated by a dashed line indicating a location set inward from the plane and orientation of the drawing sheet and the gate dielectric 838 is visible.

According to embodiments, removal of the sacrificial semiconductor material in a access device region 842 of the alternating layers of the vertical stack to form horizontal openings, 833-1, 833-2, . . . , 833-N, in which the horizontally oriented access devices having a first source/drain region, channel region, and second source/drain region can be formed between the vertical alternating layers of a dielectric material, 830-1, 830-2, . . . , 830-(N+1) presents another point in the semiconductor fabrication process when there is potential damage to the gate dielectric 838 on a second side 846, region, in the horizontal openings, 833-1, 833-2, . . . , 833-N. For example, the second side 846 of the gate dielectric 838 may have reduced insulative properties due to the potential damaged caused by a selective etching process used to remove the sacrificial semiconductor material, 732-1, 732-2, . . . , 732-N to form the horizontal openings, 833-1, 833-2, . . . , 833-N. Similar to the potential damage to a first side of the gate dielectric 838, e.g., side 645 shown in FIG. 6A, a second side 846 of the gate dielectric 838, within the horizontal openings, 833-1, 833-2, . . . , 833-N, may be repaired to improve the dielectric properties and performance on the second side 846 of the gate dielectric 838. According to embodiments, a process to repair the potential damage to the second side 846 of the gate dielectric may be performed prior to potential repair and/or treatment of first electrodes 861, e.g., bottom electrodes, and prior to forming the first source/drain regions, channel regions, and second source/drain regions, described below in connection with FIG. 9C.

For example, prior to the formation of the first source/drain regions, channel regions, and second source/drain regions, the second side 846 of the gate dielectric 838 may be treated to repair and/or improve a dielectric quality and/or surface bond termination on the second side 846 of the gate dielectric 838. In one example embodiment, the second side 846 of the gate dielectric 838, may be repaired using an atomic layer deposition (ALD). Embodiments, however, are not limited to this example. In one example embodiment, repair and/or improvement of the second side 846 of the gate dielectric 838 may consist of remote ionization of gases or precursors, oxygen or oxygen containing species or mixes of gases in ratios that preferentially repair the gate dielectric 838 while minimizing oxidation of materials that form the first electrodes 861, e.g., metal materials tantalum (Ta), titanium (Ti), tungsten (W), molybdenum (Mo), hafnium (Hf), ruthenium (Ru), platinum (Pt), palladium (Pd), etc. Combinations that provide a mix of molecular oxygen and ionized species may be most effectively formed in temperatures ranging from 150° C. to 600° C. As with treatment of the first side 645 in FIG. 6A, short pulses of a metal atom, e.g., hafnium (Hf), aluminum (Al), scandium (Sc), lanthanum (La), zirconium (Zr), etc., in precursor form, of the gate dielectric 638 may be included to return the second side 846 of the gate dielectric to an intended stoichiometry and/or surface bond terminations. Such treatments may be performed ex-situ, frame in-situ, or chamber in-situ with the formation of the first source/drain regions, channel regions, and second source drain regions described in connection with FIGS. 9A-9E.

In some embodiments, atomic layer deposition (ALD), post deposition anneal, or doping may be used to flow a precursor to contact a second side 846 of the gate dielectric 838 to initiate the repair process of the second side 846. The precursors may include compounds, such as, silane, hydroxyl, ethyl, methyl, or oxysilane. Embodiments, however, are not limited to these examples. Subsequently, the second side 846 of the dielectric 838 may be exposed to thermal energy, plasma energy, microwave, or other energy sources to generate a mixture of gas of at least one of hydrogen ($H_2$), oxygen ($O_2$), nitrogen ($N_2$), helium (He), silane, carbonyl, metal organics, peroxide, forms of hydrazine, ammonia ($NH_3$), and/or a halide. Accordingly, the process described herein may repair and/or improve the dielectric properties and/or quality of the second side 646 of the gate dielectric 838 within a process flow for formation of three-node access devices for vertical three-dimensional (3D) memory.

FIG. 8D illustrates a cross sectional view, taken along cut-line C-C' in FIG. 8A, showing another view of the semiconductor structure at this particular point in one example semiconductor fabrication process of an embodiment of the present disclosure. The cross sectional view shown in FIG. 8D is illustrated extending in the second direction (D2) 805, left and right in the plane of the drawing sheet, along an axis of the repeating iterations of alternating layers of a dielectric material, 830-1, 830-2, . . . , 830-N, 830-(N+1) and horizontal openings 833-1, 833-2, . . . , 833-N, outside of a region in which the horizontally oriented access devices and horizontally oriented storage nodes, e.g., capacitor cells, will be formed. In FIG. 8D, the dielectric material 841 is shown filling the space between the horizontally oriented access devices, which can be spaced along a first direction (D1), extending into and out from the plane of the drawings sheet, for a three-dimensional array of vertically oriented memory cells. However, in the cross sectional view of FIG. 8D, the second electrode 856, e.g., top, common electrode to the capacitor cell structure, is additionally shown present in the space between horizontally neighboring devices. At the left end of the drawing sheet is shown the repeating iterations of alternating layers of a dielectric material, 830-1, 830-2, . . . , 830-(N+1), and horizontal openings, 833-1, 833-2, . . . , 833-N, at which location a horizontally oriented digit line, e.g., digit lines 107-1, 107-2, . . . , 107-P shown in FIG. 1, et. seq., can be integrated to form electrical contact with the second source/drain regions, of the formed horizontal access devices.

FIG. 8E illustrates a cross sectional view, taken along cut-line D-D' in FIG. 8A, showing another view of the semiconductor structure at this particular point in one example semiconductor fabrication process of an embodiment of the present disclosure. The cross sectional view shown in FIG. 8E is illustrated, right to left in the plane of the drawing sheet, extending in the first direction (D1) 809 along an axis of the repeating iterations of alternating layers of a dielectric material, 830-1, 830-2, . . . , 830-(N+1), and horizontal openings, 833-1, 833-2, . . . , 833-N, in which channel regions will be formed separated from the plurality of separate, vertical access lines, 840-1, 840-2, . . . , 840-4, by the gate dielectric 838. In FIG. 8E, the first dielectric fill material 839 is shown separating the space between neighboring horizontally oriented access devices and horizontally oriented storage nodes, which may be formed extending into and out from the plane of the drawing sheet as described in more detail below, and can be spaced along a first direction (D1) 809 and stacked vertically in arrays extending in the third direction (D3) 811 in the three-dimensional (3D) memory.

Figure 9A:
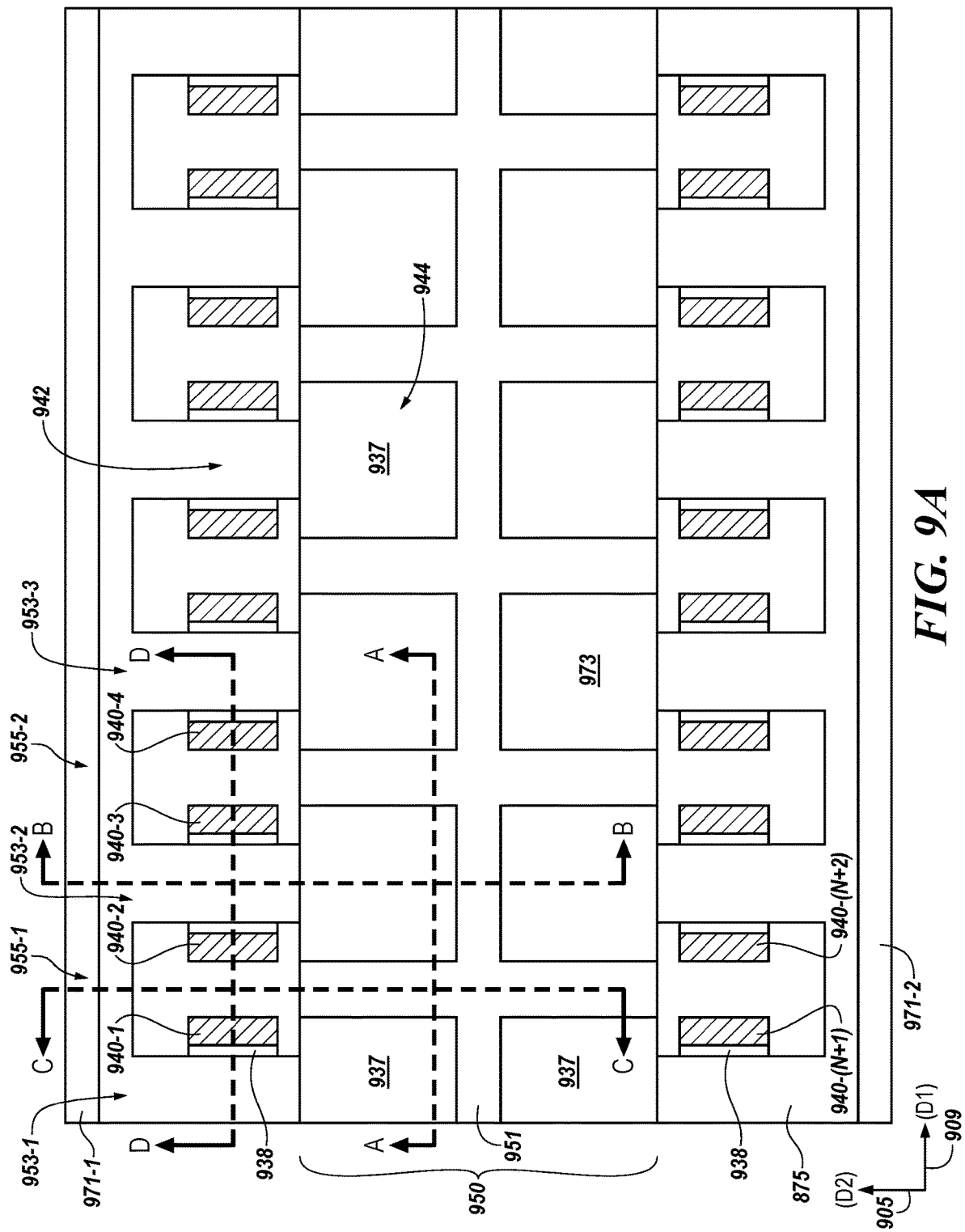

FIG. 9A illustrates an example method, at another stage of a semiconductor fabrication process, for forming arrays of vertically stacked memory cells, having horizontally oriented access devices and vertically oriented access lines, such as illustrated in FIGS. 1-3, and in accordance with a number of embodiments of the present disclosure. FIG. 9A illustrates a top down view of a semiconductor structure, at a particular point in time, in a semiconductor fabrication process, according to one or more embodiments. In the example embodiment of FIG. 9A, the vertical openings 971-1 and 971-2 remain present from FIG. 8A-8E. However, in FIGS. 9A-9E, horizontal access devices, 998-1, 998-2, . . . , 998-N, having first source/drain regions, channel regions, and second source/drain regions, shown respectively as 998-1A, 998-1B, and 998-1C, in FIG. 9C, have been formed in the horizontal openings, 833-1, 833-2, . . . , 833-N shown in FIGS. 8C and 8D. The horizontal access devices, 998-1, 998-2, 998-N, are formed extending in the second direction 905 (D2) in the horizontal access device regions 942 of the vertical stack. Additionally, horizontal digit lines, 999-1, 999-2, 999-N, have been formed and integrated in contact with the second source/drain regions, e.g., 998-1C, as shown in FIGS. 9C and 9D. Other numerated components may be analogous to those shown and discussed in connection with FIGS. 6, 7, and 8.

According to embodiments, in the access device region 942, e.g., transistor region, the sacrificial semiconductor material, 732-1, 732-2, . . . , 732-N, in FIGS. 8A-8E, has been removed to leave the repeating iterations of alternating layers of a dielectric material, 830-1, 830-2, . . . , 830-(N+1), and horizontal openings, 833-1, 833-2, . . . , 833-N, in the vertical stack of FIG. 8 to form an access device, e.g. transistor. In some embodiments, this process is performed before selectively removing a storage node region 944 of the sacrificial semiconductor material in which to form a capacitor cell. In other embodiments, this process is performed after selectively removing a storage node region 944 of the sacrificial semiconductor material in which to form a capacitor cell. According to an example embodiment, shown in FIGS. 9B-9E, the method comprises selectively depositing, using an atomic layer deposition (ALD) process, or other suitable deposition technique, a first source/drain region 938-1A, channel region 938-1B, and second source/drain region 938-1C in each of the horizontal openings, 833-1, 833-2, ..., 833-N, in FIGS. 8A-8E. By way of example, and not by way of limitation, forming the first source/drain region, the channel region, and the second source/drain region comprises using an atomic layer deposition (ALD) process to sequentially deposit, in the first horizontal opening, the first source/drain region, the channel region, and the second source/drain region according to a process and techniques described herein. Other suitable semiconductor fabrication techniques and/or storage nodes structures may be used.

FIG. 9B illustrates a cross sectional view, taken along cut-line A-A' in FIG. 9A, showing another view of the semiconductor structure at this particular point in one example semiconductor fabrication process of an embodiment of the present disclosure. The cross sectional view shown in FIG. 9B is away from the plurality of separate, vertical access lines, 940-1, 940-2, ..., 940-N, 940-(N+1), ..., 940-(Z–1), and shows repeating iterations of alternating layers of a dielectric material, 930-1, 930-2, ..., 930-(N+1), separated by capacitor cells having first electrodes 961, e.g., bottom cell contact electrodes, cell dielectrics 963, and second electrodes 956, e.g., top, common node electrode, on a semiconductor substrate 900 to form the vertical stack. As shown in FIG. 9B, a vertical direction 911 is illustrated as a third direction (D3), e.g., z-direction in an x-y-z coordinate system, analogous to the third direction (D3) 111, among first, second and third directions, shown in FIGS. 1-3. The plane of the drawing sheet, extending right and left, is in a first direction (D1) 909. In the example embodiment of FIG. 9B, the first electrodes 961, e.g., bottom electrodes to be coupled to source/drain regions of horizontal access devices, and second electrodes 956 are illustrated separated by a cell dielectric material 963 extending into and out of the plane of the drawing sheet in second direction (D2) and along an axis of orientation of the horizontal access devices and horizontal storage nodes of the arrays of vertically stacked memory cells of the three-dimensional (3D) memory.

FIG. 9C illustrates a cross sectional view, taken along cut-line B-B' in FIG. 9A, showing another view of the semiconductor structure at this particular point in one example semiconductor fabrication process of an embodiment of the present disclosure. The cross sectional view shown in FIG. 9C is illustrated extending in the second direction (D2) 905, left and right along the plane of the drawing sheet, along an axis of the repeating iterations of alternating layers of a dielectric material, 930-1, 930-2, ..., 930-(N+1). However, now is shown that the first source/drain region material, channel region material, and second source/drain region material, 998-1, 998-2, ..., 998-N have been deposited in the horizontal openings, 833-1, 833-2, ..., 833-N, in FIGS. 8A-8E, extending in the second direction 905 (D2). As one example, a first source/drain region 998-1, a channel region 998-1B, and 998-1C are illustrated distinctly. Further, horizontal digit line, 999-1, 999-2, ..., 999-N, integration is achieved in contact with the second source/drain regions, e.g., 998-1C, extending in a first direction (D1), e.g., extending into and out from the plane of the drawing sheet in alternating layers vertically with the dielectric material, 930-1, 930-2, ..., 930-(N+1) in direction (D3) 911.

Hence, three-node horizontal access devices, 938-1, 938-2, ..., 938-N, have been formed and integrated to vertical access lines, 940-1, 940-2, ..., 940-(Z+1) and integrated to digit lines, 999-1, 999-2, ..., 999-N, without body contacts. Advantages to the structure and process described herein can include a lower off-current (Ioff) for the access devices, as compared to silicon based (Si-based) access devices. The channel region, e.g., 938-1B, may be free from minority carriers for the access devices and thus removing the need to control a body potential to a body region of the access device, and/or reduced gate/drain induced leakage (GIDL) for the access devices. In some embodiments, channel and/or source/drain region replacement fabrication steps may be performed after a capacitor cell formation process, thus reducing a thermal budget. The digit line integration may be more easily achieved in the fabrication process since a body contact to a body region of the access device is not used. Additionally, the embodiments described herein may achieve a better lateral scaling path than achieved with doped polysilicon based channel regions due to less channel length and lower source/drain semiconductor fabrication process formation overhead.

In one example the first source/drain region (e.g., 998-1C), the channel region (e.g., 998-1B), and the second source/drain region (e.g., 998-1A) of the horizontal access devices, 998-1, 998-2, ..., 998-N, and the horizontal digit line, 999-1, 999-2, ..., 999-N, integration may be performed according to processes and techniques described herein and in co-pending, U.S. patent application Ser. No. 16/986,466, having at least one common inventor and titled "Channel Integration in a Three-Node Access Device for Vertical Three-Dimensional (3D) Memory," filed on Aug. 6, 2020, and incorporated herein by reference. Other suitable semiconductor fabrication techniques may be used.

In the example embodiment of FIG. 9C, the horizontal access devices having a first source/drain region, channel region, and second source/drain region, 998-1, 998-2, ..., 989-N, are shown extending in second direction 905 (D2), left and right in the plane of the drawing sheet, a distance from the vertical openings 971-1 and 971-2 formed in the vertical stack and along an axis of orientation of the horizontal access devices and horizontal storage nodes of the arrays of vertically stacked memory cells of the three-dimensional (3D) memory. As shown in FIG. 10, as dielectric material may be deposited to fill the vertical openings 971-1 and 971-3. In FIG. 9C, a neighboring, opposing vertical access line 940-3 is illustrated by a dashed line indicating a location set inward from the plane and orientation of the drawing sheet.

As noted above, in some embodiments, a first electrode 961 to a storage node in a storage node region 944 may be formed prior to the formation of the first source/drain region, channel region, and second source drain region. As such, a surface 947 of the first electrode 961 may be damaged by the removal of the sacrificial semiconductor material (e.g., 732-1, 732-2, ..., 732-N in FIG. 7C) as described in FIGS. 8A-8E to form the horizontal openings, 833-1, 833-2, ..., 833-N. A surface 947 of the first electrode 961, interior to the horizontal openings, 833-1, 833-2, ..., 833-N described in FIGS. 8A-8E, may serve as the electrical contact to the first source/drain region, e.g., 998-1C.

Thus, according to embodiments, prior to the deposition of the first source/drain region (e.g., 998-1C), channel region (e.g., 998-1B), and second source/drain region (e.g., 998-1A of the horizontal access devices), 998-1, 998-2, ..., 998-N a surface 947 of the first electrode 961, e.g., bottom electrode, may be treated to repair and/or improve its electrical conduction properties and performance of its electrical contact to the first source/drain regions, e.g., 998-1C. As noted, the first electrode 961 may be damaged during the forming of the horizontal openings, 833-1, 833-2, ..., 833-N, in FIGS. 8A-8E. A surface 947 of the first electrode 961 may undergo a process, as described herein, that can heal the damaged caused by forming the horizontal openings, 833-1, 833-2, . . . , 833-N, in FIGS. 8A-8E. For example, the first electrode 961 may be repaired by a treatment used to restore the conductive quality of a surface 947 of the first electrode 961.

In one embodiment, an atomic layer deposition (ALD), post deposition anneal, or doping may be used to initiate the repair of the first electrode 961. In this process, precursors may flow in to contact the first electrode 961. Precursors may be used before a mixture of gases to prepare the surface of the first electrode 961 for subsequent gases that will contact the first electrode 961. In one example embodiment, the precursors may include compounds, such as, silane, hydroxyl, ethyl, methyl, or oxysilane. The first electrode 961 may then be exposed to a mixture of gases of at least one of hydrogen ($H_2$), oxygen ($O_2$), nitrogen ($N_2$), helium (He), silane, carbonyl, metal organics, peroxide, forms of hydrazine, ammonia ($NH_3$), and/or a halide generated by thermal energy, plasma energy, microwave, or other energy sources. As such, prior to the deposition of the first source/drain (e.g., 998-1C), channel region (e.g., 998-1B), and second source/drain region (e.g., 998-1A) of the horizontal access devices, 998-1, 998-2, . . . , 998-N a surface 947 of the first electrode 961 will first be reduced to remove metal oxide therefrom. In some embodiments such reduction may be completed using ionized hydrogen, ammonia, forms of hydrazine (and/or derivatives thereof) as well as mixes with molecular forms of the same.

As described herein, interfacial and free surface bond terminations may be controlled using combinations of oxidizing, reducing or passivation conditions. Inherent and inhibited methods can be used to achieve distinct conditions on one surface and not another. Silanes, thiols, carbonyls, siloxanes, and others with head groups that will attach to one surface bond termination and not another are used to affect inhibited methods. Inherent methods are those that the precursor used to deposit a material already has the characteristic to attach to specific bond terminations on the particular surface. Accordingly, repairing the conductive quality of a surface 947 of the first electrode 961 with the processes described herein may repair and/or improve the conductive properties of an electrical contact, e.g., interface, between the first electrode 961 and a first source/drain region (e.g., 998-1C) before the first source/drain region (e.g., 998-1C), channel region (e.g., 998-1B), and second source/drain region (e.g., 998-1A) of the horizontal access devices, 998-1, 998-2, . . . , 998-N are deposited.

FIG. 9D illustrates a cross sectional view, taken along cut-line C-C' in FIG. 9A, showing another view of the semiconductor structure at this particular point in one example semiconductor fabrication process of an embodiment of the present disclosure. The cross sectional view shown in FIG. 9D is illustrated extending in the second direction (D2) 905, left and right in the plane of the drawing sheet, along an axis of the repeating iterations of alternating layers of a dielectric material, 930-1, 930-2, . . . , 930-N, 930-(N+1) and horizontal digit lines, 999-1, 999-2, . . . , 999-N, extending into and out from the plane of the drawing sheet in a first direction (D1), outside of a region in which the horizontally oriented access devices, 938-1, 938-2, . . . , 938-N, and horizontally oriented storage nodes, e.g., capacitor cells, in access device region 942 and storage node region 944 are formed. In FIG. 9D, the dielectric material 941 is shown filling the space between the horizontally oriented access devices, which can be spaced along a first direction (D1), extending into and out from the plane of the drawings sheet, for a three-dimensional array of vertically oriented memory cells. However, in the cross sectional view of FIG. 9D, the second electrode 956, e.g., top, common electrode to the capacitor cell structure, is additionally shown present in the space between horizontally neighboring devices. At the left end of the drawing sheet is shown the repeating iterations of alternating layers of a dielectric material, 930-1, 930-2, . . . , 930-(N+1), and horizontal digit lines, 999-1, 999-2, . . . , 999-N, e.g., digit lines 107-1, 107-2, . . . , 107-P shown in FIG. 1, et. seq., integrated to form electrical contact with the second source/drain regions, e.g., 938-1C, of the formed horizontal access devices.

FIG. 9E illustrates a cross sectional view, taken along cut-line D-D' in FIG. 9A, showing another view of the semiconductor structure at this particular point in one example semiconductor fabrication process of an embodiment of the present disclosure. The cross sectional view shown in FIG. 9E is illustrated, right to left in the plane of the drawing sheet, extending in the first direction (D1) 909 along an axis of the repeating iterations of alternating layers of a dielectric material, 930-1, 930-2, . . . , 930-(N+1), and channel regions of the horizontal access devices, 998-1, 998-2, . . . , 998-N, separated from the plurality of separate, vertical access lines, 940-1, 940-2, . . . , 940-4, by the gate dielectric 938. In FIG. 9E, the first dielectric fill material 939 is shown separating the space between neighboring horizontally oriented access devices and horizontally oriented storage nodes, which may be formed extending into and out from the plane of the drawing sheet as described in more detail below, and can be spaced along a first direction (D1) 909 and stacked vertically in arrays extending in the third direction (D3) 911 in the three-dimensional (3D) memory.

Figures 10A, 10B:
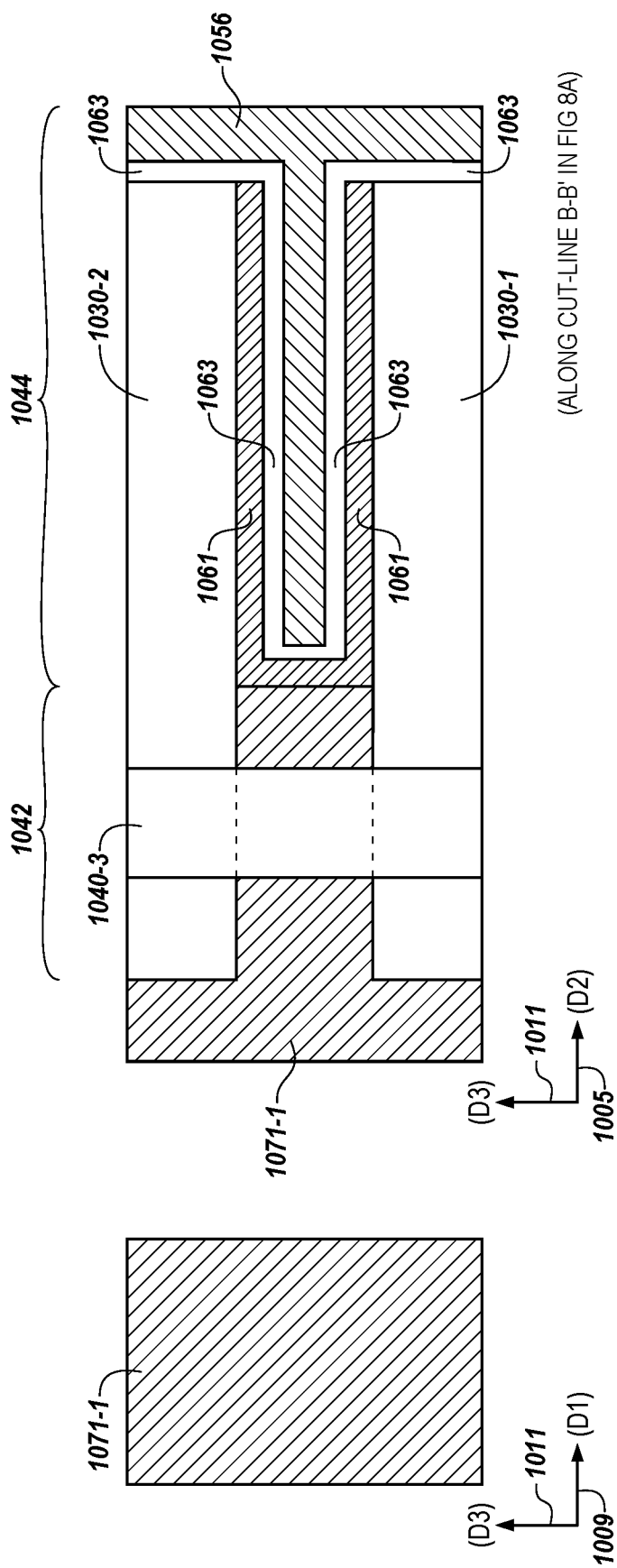
FIGS. 10A-10D illustrate an example method for source/drain integration in a three-node horizontally oriented access device coupled to a horizontally oriented storage node, at a particular point in time in a semiconductor fabrication process, in accordance with a number of embodiments of the present disclosure.
Figures 10C, 10D:
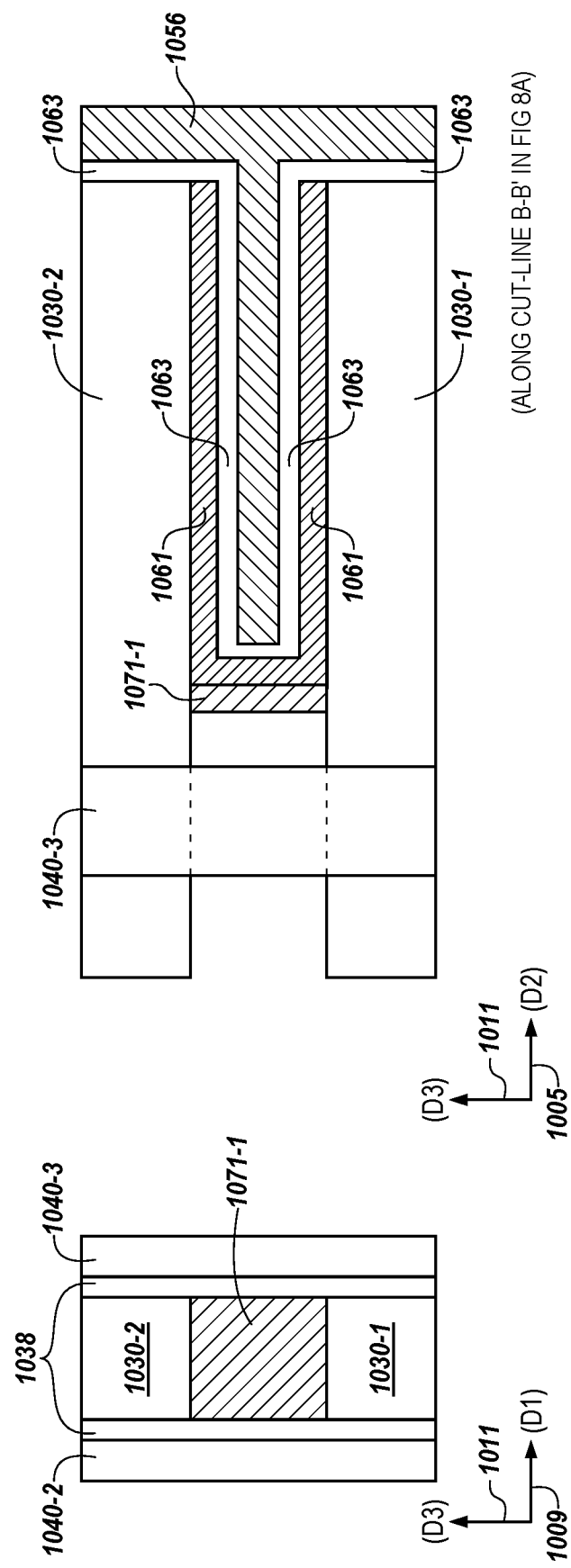

FIGS. 10A-10D illustrate an example method for source/drain integration in three-node horizontally oriented access device, at a particular point in time in a semiconductor fabrication process, in accordance with a number of embodiments of the present disclosure. FIGS. 10A and 10C are cross sectional side views of source/drain integration in a horizontal access device region 1042 after storage node, e.g., capacitor cell, formation in a storage node region 1044 extending in a second direction 1005 (D2), left and right along the plane of the drawing sheet, such as along cut-line B-B' in FIG. 8A. FIGS. 10B and 10D are end-on views of the source/drain integration in the three-node horizontally oriented access device formation, at the particular point in time in a semiconductor fabrication process.

As shown in FIGS. 10A-10D, a storage node, e.g., capacitor cell, has been formed in storage node region 1044. In this example, the storage node is a horizontally oriented storage node extending in the second direction (D2) 1005 adjacent a horizontal access device region 1042 for a vertical three-dimensional (3D) memory, having vertically oriented vertically oriented access lines. The storage node, e.g., capacitor, includes a first electrode 1061, e.g., bottom electrode, and a second electrode 1065, e.g., top electrode and/or common node electrode, separated by a cell dielectric material 1063. As described above, herein, the structure may be formed in repeating, alternating layers of a dielectric material, 1030-1 and 1030-2, and a sacrificial material (not shown) that has been removed to form the respective storage node region 1044 and now source/drain integration in the horizontal access device region 1042. As also has been described above, a first etchant process may be used to form a first vertical opening, e.g., 871 in FIG. 8A, exposing sidewalls in the vertical stack adjacent a first portion of the sacrificial material and a first portion of the sacrificial material removed by a selective etch process to form a horizontal opening, e.g., 833 in FIG. 8C, in the access device region 1042, adjacent the cell side region 1044.

The example in FIGS. 10A and 10B illustrate forming a multilayer source/drain region 1071-1 by depositing a first conductive material 1071-1 in the first horizontal opening to form electrical contact with a storage node at a distal end of the first horizontal opening, 833 in FIG. 8C, a first horizontal distance (D1 opening) back from the first vertical opening, 871 in FIG. 8A. In one example, depositing the first conductive material 1071-1 comprises depositing a metal material, e.g., layer, which does not oxidize in contact with an oxide semiconductor material. In the example described here, the storage node, e.g., capacitor, has already been formed. In this example the first electrode 1061 may provide an etch stop during removal of the sacrificial material, e.g., 732 in FIG. 7C, to form the first horizontal opening, 833 in FIG. 8C. In other embodiments, however, the storage node, e.g., capacitor, may be formed subsequent to the three-node horizontal access device formation, including the source/drain integration described herein. In such an example embodiment, the first conductive material 1071-1 may be chosen to serve as an etch stop to removal of the sacrificial material, e.g., 732 in FIG. 7C, during formation of a second horizontal opening, 833 in FIG. 8C, in the storage node region 1044 for storage node formation and to provide electrical, ohmic contact to the first electrode 1061 of the storage node.

In one example embodiment, depositing the first conductive metal material 1071-1 comprises depositing a material containing ruthenium (Ru). In one example, depositing the first conductive metal material 1071-1 comprises depositing a material containing molybdenum (Mo). In one example, depositing the first conductive metal material 1071-1 comprises depositing a material containing nickel (Ni). In one example, depositing the first conductive metal material 1071-1 comprises depositing a material containing titanium (Ti). In one example, depositing the first conductive metal material 1071-1 comprises depositing a material containing copper (Cu). In one example, depositing the first conductive metal material 1071-1 comprises depositing a material containing tin (Sn). Embodiments, however, are not limited to these examples.

In another example depositing the first conductive material 1071-1 comprises depositing a metal material, e.g., layer, which forms a conductive oxide in contact with an oxide semiconductor material. For example, in one embodiment, depositing the first conductive material 1071-1 comprises depositing a highly doped degenerate semiconductor. In one example, depositing the first conductive material 1071-1 comprises depositing an indium oxide ($In_2O_3$) composition as the first conductive material 1071-1. In one example, depositing the first conductive material 1071-1 comprises depositing an indium tin oxide ($In_{2-x}Sn_xO_3$) composition as the first conductive material 1071-1. Embodiments, however, are not limited to these examples.

The conductive material 1071-1 may be deposited such that the conductive material 1071-1 fills the entire opening and is deposited on an area beside the opening, e.g., in the first vertical opening 871 in FIG. 8A. FIG. 10B illustrates and end-on view of the three-node horizontal access device formation at this particular stage the semiconductor fabrication process.

In one example, depositing the first conductive material 1071-1 comprises using an atomic layer deposition (ALD) process to fill the first horizontal opening to the distal end to form electrical, ohmic contact with a first electrode 1061. As shown in FIGS. 10A and 10B, the ALD deposition process of the first conductive contact material 1071-1 may also fill the first vertical opening.

As shown in FIGS. 10C and 10D, the method includes removing a portion of the first conductive contact material 1071-1 to recess the first conductive contact material 1071-1 to remain only at the distal end of the horizontal opening in electrical, ohmic contact with the first electrode 1061. In one example, the removal process may be performed using an atomic layer etching (ALE) process. Embodiments, however, are not limited to this example. In one example, the first conductive material 1071-1 may be recessed back in the horizontal opening, 833 in FIG. 8C, to have a thickness of approximately ten (10) nanometers (nm) and to form electrical, ohmic contact with the first electrode 1061. Embodiments, however, are not limited to this example, and other thickness may by appropriate according to a particular design rule and/or dimensional sizing of the three-node horizontal access devices. FIG. 10D illustrates an end-on view of the three-node horizontal access device formation at this particular stage the semiconductor fabrication process.

FIGS. 11A-11D illustrate an example method for source/drain integration in three-node horizontally oriented access device, at a particular point in time in a semiconductor fabrication process, in accordance with a number of embodiments of the present disclosure. FIGS. 11A and 11C are cross sectional side view of source/drain integration in a horizontal access device region 1042 after storage node, e.g., capacitor cell, formation in a storage node region 1044 extending in a second direction 1005 (D2), left and right along the plane of the drawing sheet, such as along cut-line B-B' in FIG. 8A. FIGS. 11B and 11D are end-on views of the source/drain integration in the three-node horizontally oriented access device formation, at the particular point in time in a semiconductor fabrication process. According to embodiments the point in time in a semiconductor fabrication process illustrated in FIGS. 11A-11D may follow next the structure and point in time illustrated in FIGS. 10A-10D. Embodiments, however, are not so limited.

As shown in FIGS. 11A and 11B, the method can include depositing a second conductive material 1173-1 in electrical contact with the first conductive material 1171-1, the first conductive material being in electrical, ohmic contact with the first electrode 1161 of the horizontally oriented storage node, e.g., capacitor cell. In one example, depositing the second conductive material 1173-1 comprises depositing a degenerate semiconductor material. As used herein, a degenerate semiconductor material is intended to mean a semiconductor material, such as polysilicon, containing a high level of doping with significant interaction between dopants, e.g., phosphorous (P), boron (B), etc. Non-degenerate semiconductors, by contrast, contain moderate levels of doping, where the dopant atoms are well separated from each other in the semiconductor host lattice with negligible interaction.

In one example, depositing the second conductive material 1173-1 comprises depositing a second conductive material having an electronic bandgap lower than that of a channel material. In one embodiment, depositing the second conductive material 1173-1 comprises depositing a second conductive material having a conduction band offset, e.g., offset from the injecting electrode's (first electrode 1161 of the capacitor cell) fermi level, that is intermediate between a conduction band offset of the first conductive material 1171-1 and that of a channel material. Further, in some embodiments, the conductive material 1173-1 may be a metal material. In some embodiments, the conductive material 1173-1 may comprise at least one of indium oxide ($In_2O_3$) or indium tin oxide ($In_{2-x}Sn_xO_3$). The conductive material 1173-1 may have an electronic bandgap that is lower than that of subsequent conductive material, e.g., channel material 1398 shown in connection with FIG. 13, and a conduction band offset that is lower than that of the subsequent conductive material. Further the conductive material 1173-1 may have an electronic bandgap lower than that of the conductive channel region.

For example, in one example, depositing the second conductive material 1173-1 comprises depositing a material containing ruthenium (Ru). In one example, depositing the second conductive material 1173-1 comprises depositing a material containing molybdenum (Mo). In one example, depositing the second conductive material 1173-1 comprises depositing a material containing nickel (Ni). In one example, depositing the second conductive material 1173-1 comprises depositing a material containing titanium (Ti). In one example, depositing the second conductive material 1173-1 comprises depositing a material containing copper (Cu). In one example, depositing the second conductive material 1173-1 comprises depositing a material containing tin (Sn).

In another example depositing the second conductive material 1173-1 comprises depositing a metal material, e.g., layer, which forms a conductive oxide in contact with an oxide semiconductor material. For example, in one embodiment, depositing the second conductive material 1173-1 comprises depositing a highly doped degenerate semiconductor. In one example, depositing the second conductive material 1173-1 comprises depositing an indium oxide ($In_2O_3$) composition as the second conductive material 1173-1. In one example, depositing the second conductive material 1173-1 comprises depositing an indium tin oxide ($In_{2-x}Sn_xO_3$) composition as the second conductive material 1173-1. Embodiments, however, are not limited to these examples.

The second conductive material 1173-1 may be deposited such that the second conductive material 1173-1 fills the entire opening and is deposited on an area beside the opening, e.g., in the first vertical opening 871 in FIG. 8A. FIG. 11B illustrates an end-on view of the three-node horizontal access device formation at this particular stage the semiconductor fabrication process.

In one example, depositing the second conductive material 1173-1 comprises using an atomic layer deposition (ALD) process to fill the first horizontal opening. As shown in FIGS. 11A and 11B, the ALD deposition process of the first conductive contact material 1173-1 may also fill the first vertical opening.

As shown in FIGS. 11C and 11D, the method includes removing a portion of the second conductive contact material 1173-1 to recess the second conductive contact material 1173-1. In one example, the removal process may be performed using an atomic layer etching (ALE) process. Embodiments, however, are not limited to this example. In one example, the second conductive material 1173-1 may be recessed back in the horizontal opening, 833 of FIG. 8C, and may have a thickness of approximately ten (10) nanometers (nm). Embodiments, however, are not limited to this example, and other thickness may by appropriate according to a particular design rule and/or dimensional sizing of the three-node horizontal access devices. FIG. 11D illustrates an end-on view of the three-node horizontal access device formation at this particular stage of the semiconductor fabrication process.

Figures 12C, 12D:
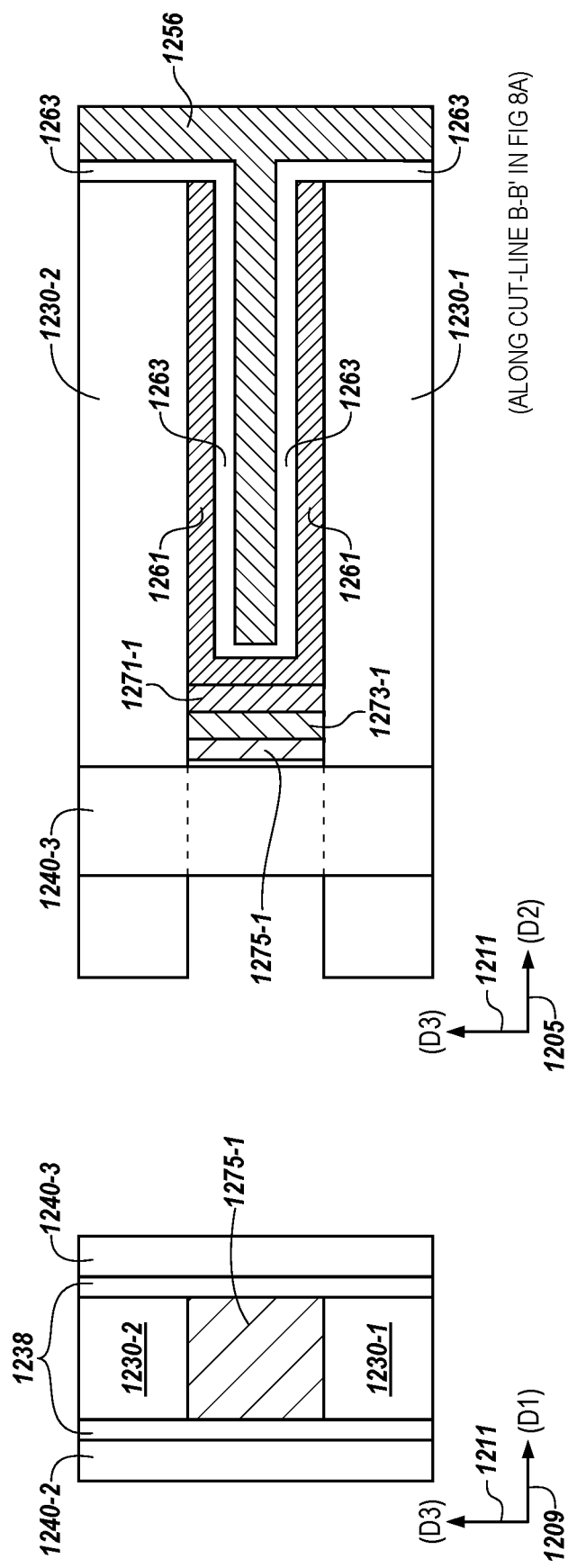

FIGS. 12A-12D illustrate an example method for source/drain integration in a three-node horizontally oriented access device, at a particular point in time in a semiconductor fabrication process, in accordance with a number of embodiments of the present disclosure. FIGS. 12A and 12C are cross sectional side views of source/drain integration in a horizontal access device region 1242 after storage node, e.g., capacitor cell, formation in a storage node region 1244 extending in a second direction 1205 (D2), left and right along the plane of the drawing sheet, such as along cut-line B-B' in FIG. 8A. FIGS. 12B and 12D are end-on views of the source/drain integration in the three-node horizontally oriented access device formation, at the particular point in time in a semiconductor fabrication process. According to embodiments at the point in time in a semiconductor fabrication process illustrated in FIGS. 12A-12D may follow next the structure and point in time illustrated in FIGS. 11A-11D. Embodiments, however, are not so limited.

As shown in FIGS. 12A and 12B, the method can include depositing an Nth, e.g., third, conductive material 1275-1 in electrical contact with an Nth−1, e.g., second, conductive material 1273-1, the second conductive material 1273-1 being in electrical contact with the first conductive material 1271-1. In one example, depositing the third conductive material 1275-1 comprises depositing a degenerate semiconductor material. As used herein, a degenerate semiconductor material is intended to mean a semiconductor material, such as polysilicon, containing a high level of doping with significant interaction between dopants, e.g., phosphorous (P), boron (B), etc. Non-degenerate semiconductors, by contrast, contain moderate levels of doping, where the dopant atoms are well separated from each other in the semiconductor host lattice with negligible interaction.

In one example, depositing the third conductive material 1275-1 comprises depositing a third conductive material having an electronic bandgap that is intermediate between a prior, e.g. second, conductive material 1171-1 and that of a channel material. In one embodiment, depositing the third conductive material 1275-1 comprises depositing a third conductive material 1275-1 having a conduction band offset, e.g., offset from the injecting electrode's (first electrode 1261 of the capacitor cell) fermi level, that is intermediate between a conduction band offset of the second conductive material 1273-1 and that of a channel material. Further, in some embodiments, the conductive material 1275-1 may be a metal material. In some embodiments, the conductive material 1275-1 may comprise at least one of indium oxide ($In_2O_3$) or indium tin oxide ($In_{2-x}Sn_xO_3$). The conductive material 1275-1 may have an electronic bandgap that is lower than that of subsequent conductive material, e.g., channel material 1398 shown in connection with FIG. 13, and a conduction band offset that is lower than that of the subsequent conductive material.

For example, in one example, depositing the third conductive material 1275-1 comprises depositing a material containing ruthenium (Ru). In one example, depositing the third conductive material 1275-1 comprises depositing a material containing molybdenum (Mo). In one example, depositing the third conductive material 1275-1 comprises depositing a material containing nickel (Ni). In one example, depositing the third conductive material 1275-1 comprises depositing a material containing titanium (Ti). In one example, depositing the third conductive material 1275-1 comprises depositing a material containing copper (Cu). In one example, depositing the third conductive material 1275-1 comprises depositing a material containing tin (Sn).

In another example depositing the third conductive material 1275-1 comprises depositing a metal material, e.g., layer, which forms a conductive oxide in contact with an oxide semiconductor material. For example, in one embodiment, depositing the third conductive material 1275-1 comprises depositing a highly doped degenerate semiconductor. In one example, depositing the third conductive material 1275-1 comprises depositing an indium oxide ($In_2O_3$) composition as the third conductive material 1275-1. In one example, depositing the third conductive material 1275-1 comprises depositing an indium tin oxide ($In_{2-x}Sn_xO_3$) composition as the third conductive material 1275-1. Embodiments, however, are not limited to these examples.

The third conductive material 1275-1 to the multilayer source/drain conductive contact may be deposited such that the third conductive material 1275-1 fills the entire opening and is deposited on an area beside the opening, e.g., in the first vertical opening 871 in FIG. 8A. FIG. 12B illustrates an end-on view of the three-node horizontal access device formation at this particular stage the semiconductor fabrication process.

In one example, depositing the third conductive material 1275-1 comprises using an ALD process to fill the first horizontal opening in contact with the second conductive material 1273-1. As shown in FIGS. 12A and 12B, the ALD deposition process of the third conductive material 1275-1 may also fill the first vertical opening. In some embodiments, the third conductive material 1275-1 may be deposited in conjunction with depositing a prior, e.g., second, conductive contact material to form a compositionally graded contact material.

As shown in FIGS. 12C and 12D, the method includes removing a portion of the third conductive contact material 1275-1 to recess the third conductive contact material 1275-1. In one example, the removal process may be performed using an ALE process. Embodiments, however, are not limited to this example. In one example, the third conductive material 1275-1 may be recessed back in the horizontal opening, 833 of FIG. 8C, to form electrical contact with the second conductive material 1273-1 and having a thickness of approximately ten (10) nanometers (nm). Embodiments, however, are not limited to this example, and other thickness may by appropriate according to a particular design rule and/or dimensional sizing of the three-node horizontal access devices.

Figures 13A, 13B:
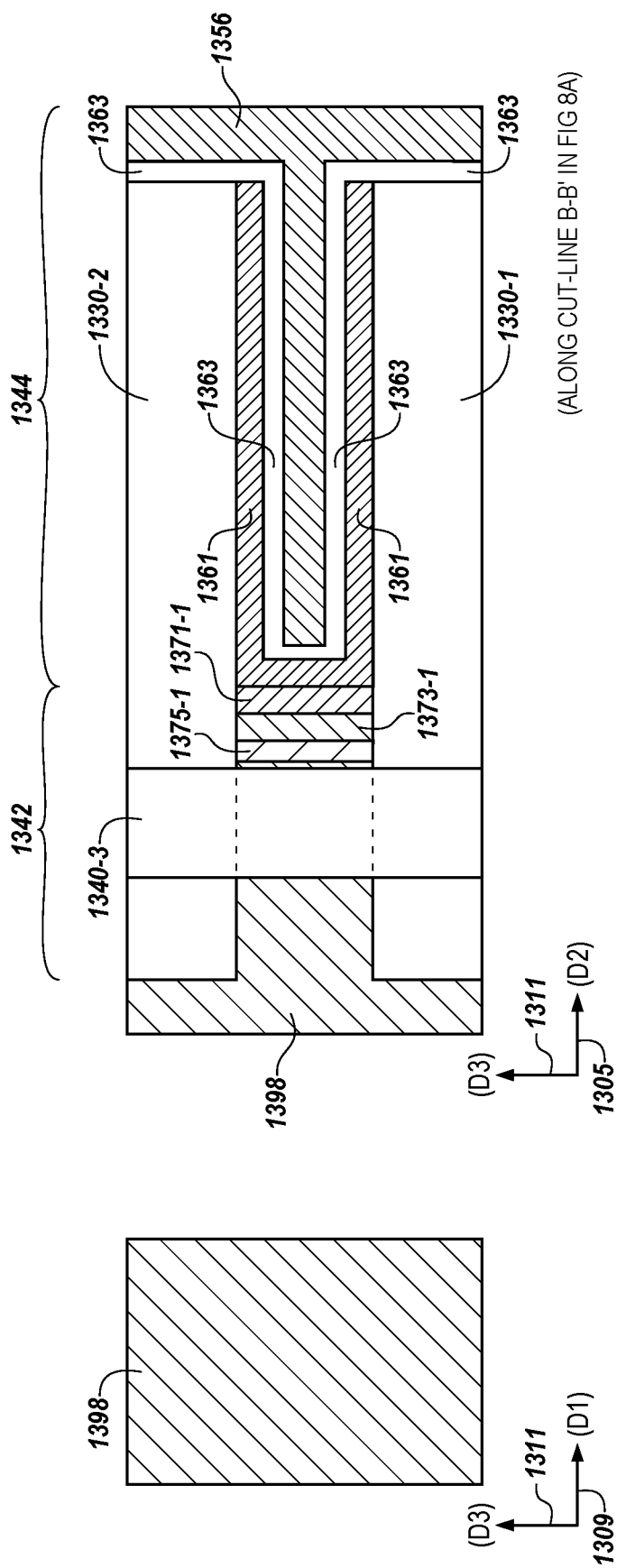

FIGS. 13A-13D illustrate an example method for source/drain integration in a three-node horizontally oriented access device, at a particular point in time in a semiconductor fabrication process, in accordance with a number of embodiments of the present disclosure. FIGS. 13A and 13C are cross sectional side views of source/drain integration in a horizontal access device region 1342 after storage node, e.g., capacitor cell, formation in a storage node region 1344 extending in a second direction 1305 (D2), left and right along the plane of the drawing sheet, such as along cut-line B-B' in FIG. 8A. FIGS. 13B and 13D are end-on views of the source/drain integration in the three-node horizontally oriented access device formation, at the particular point in time in a semiconductor fabrication process. According to embodiments the point in time in a semiconductor fabrication process illustrated in FIGS. 13A-13D may follow next the structure and point in time illustrated in FIGS. 12A-12D. Embodiments, however, are not so limited.

As shown in FIGS. 13A and 13B, the method can include depositing a conductive channel material 1398 in electrical contact with the third conductive material 1375-1, the third conductive material 1375-1 being in electrical contact with the second conductive material 1373-1. In one example, depositing the conductive channel material 1398 comprises depositing a degenerate semiconductor material. As used herein, a degenerate semiconductor material is intended to mean a semiconductor material, such as polysilicon, containing a high level of doping with significant interaction between dopants, e.g., phosphorous (P), boron (B), etc. Non-degenerate semiconductors, by contrast, contain moderate levels of doping, where the dopant atoms are well separated from each other in the semiconductor host lattice with negligible interaction.

In one example, depositing the conductive channel material 1398 comprises depositing a conductive channel material 1398 having an electronic bandgap higher than that of a subsequent conductive material. In one embodiment, depositing the conductive channel material 1398 comprises depositing a conductive channel material 1398 having a conduction band offset, e.g., offset from the injecting electrode's (first electrode 1361 of the capacitor cell) fermi level, that is higher than a conduction band offset of the third conductive material 1375-1 and higher than that of a subsequent conductive material. Further, in some embodiments, the conductive channel material 1398 may be a metal material. In some embodiments, the conductive channel material 1398 may comprise at least one of indium oxide ($In_2O_3$) or indium tin oxide ($In_{2-x}Sn_xO_3$). The conductive channel material 1398 may have an electronic bandgap that is higher than that of subsequent conductive material, e.g., conductive material 1475-2 shown in connection with FIG. 14, and a conduction band offset that is higher than that of the subsequent conductive material.

In some embodiments, a multilayer conductive channel material having backchannel passivation may be deposited as the conductive channel material 1398. For example, an indium (In) rich, indium gallium, zinc oxide (IGZO) conductive channel material 1398 is deposited to form a first layer of the conductive channel material 1398 and an indium (In) lean material, relative to the first layer, is deposited next as part of the IGZO conductive channel material to form a leakage suppression layer. In one example, a gallium (Ga) rich layer, relative to the first layer, is deposited as part of the IGZO conductive channel material to form a leakage suppression layer. In one example, a zinc (Zn) rich layer, relative to the first layer, is deposited as part of the IGZO conductive channel material to form a leakage suppression layer. In one example, gallium oxide ($GaO_x$) layer is deposited as part of the IGZO conductive channel material to form a leakage suppression layer. In one embodiment, the leakage suppression layer is an oxide layer. One example for using an ALD process channel region formation is disclosed in co-filed, co-pending, U.S. patent application Ser. No. 16/986,466, having at least one common inventor and titled "Channel Integration in Three-Node Access Device for Vertical Three-Dimensional (3D) Memory". The same is incorporated herein, by reference, in its entirety. Other suitable semiconductor fabrication techniques may be used to form the conductive channel material 1398.

The conductive channel material 1398 may be deposited such that the conductive channel material 1398 fills the entire opening and is deposited on an area beside the opening, e.g., in the first vertical opening 871 in FIG. 8A. FIG. 13B illustrates an end-on view of the three-node horizontal access device formation at this particular stage the semiconductor fabrication process.

In one example, depositing the conductive channel material 1398 comprises using an ALD process to fill the first horizontal opening to form electrical contact with third conductive material 1375-1. As shown in FIGS. 13A and 13B, the ALD deposition process of the conductive channel material 1398 may also fill the first vertical opening.

As shown in FIGS. 13C and 13D, the method includes removing a portion of the conductive channel material 1398 to recess the conductive channel material. In one example, the removal process may be performed using an ALE process. Embodiments, however, are not limited to this example. In one example, the conductive channel material 1398 may be recessed back in the horizontal opening, 833 of FIG. 8C, to form electrical contact with the third conductive material 1375-1 and having a length (L), e.g., 1778 in FIG. 17, of approximately fifty (50) nanometers (nm). Embodiments, however, are not limited to this example, and other lengths (L) for the conductive channel material 1375-1 may by appropriate according to a particular design rule and/or dimensional sizing of the three-node horizontal access devices.

Figure 14A:
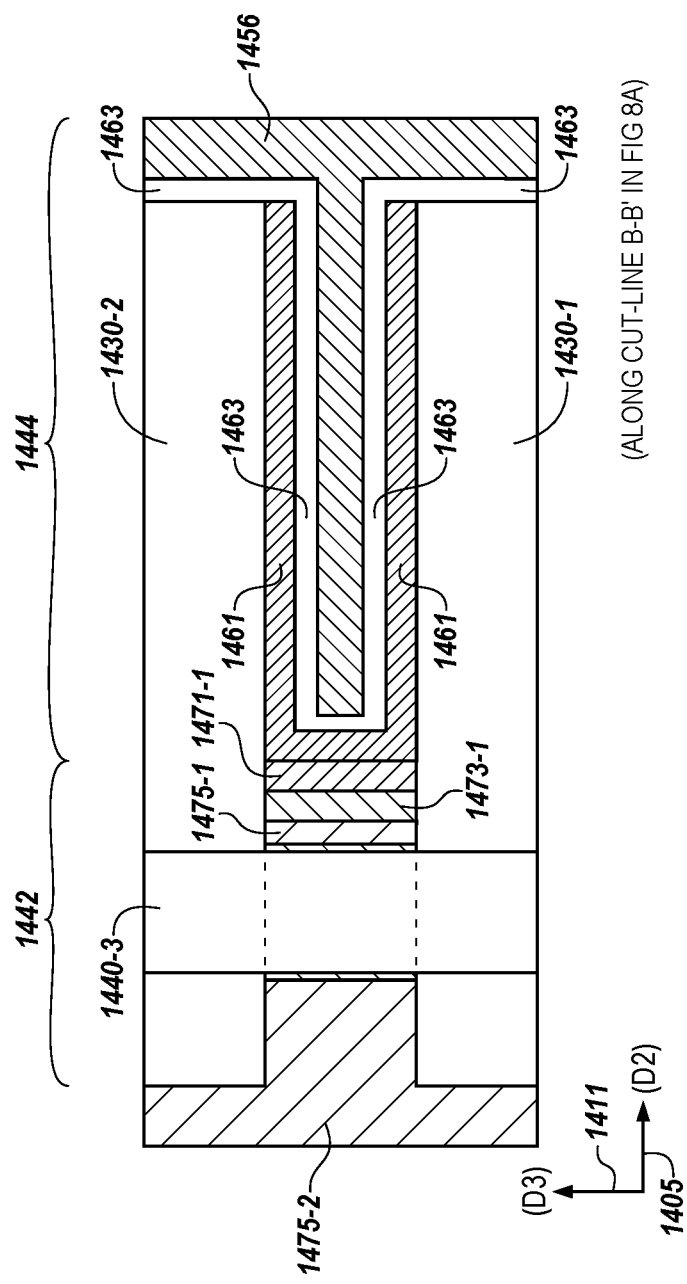
FIGS. 14A-14D illustrate an example method for source/drain integration in three-node horizontally oriented access device, at a particular point in time in a semiconductor fabrication process, in accordance with a number of embodiments of the present disclosure.
Figure 14B:
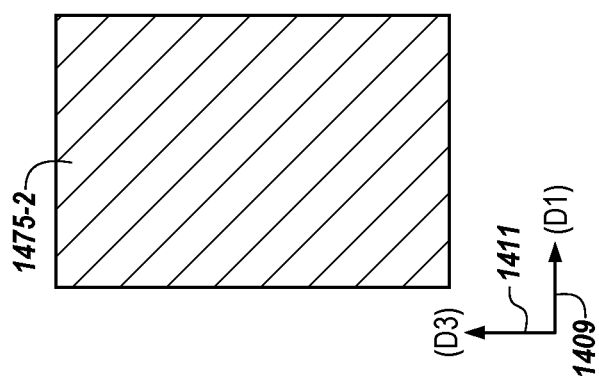
Figures 14C, 14D:
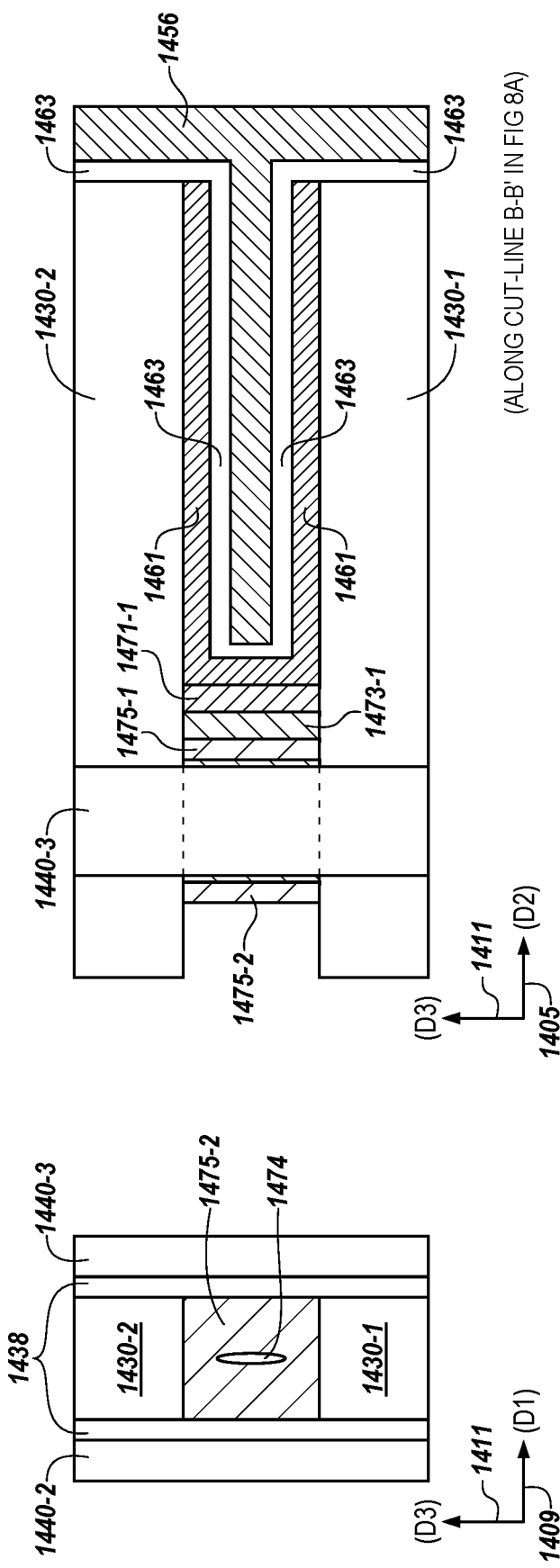

FIGS. 14A-14D illustrates an example method for source/drain integration in three-node horizontally oriented access device, at a particular point in time in a semiconductor fabrication process, in accordance with a number of embodiments of the present disclosure. FIGS. 14A and 14C are cross sectional side view of source/drain integration in a horizontal access device region 1442 after storage node, e.g., capacitor cell, formation in a storage node region 1444 extending in a second direction 1405 (D2), left and right along the plane of the drawing sheet, such as along cut-line B-B' in FIG. 8A. FIGS. 14B and 14D are end-on views of the source/drain integration in the three-node horizontally oriented access device formation, at the particular point in time in a semiconductor fabrication process. According to embodiments, the point in time in a semiconductor fabrication process illustrated in FIGS. 14A-14D may follow next the structure and point in time illustrated in FIGS. 13A-13D. Embodiments, however, are not so limited.

The method for source/drain integration illustrated in FIGS. 14A-14D, 15A-15D, 16A-16D may be for forming a second source/drain region associated with a digit line contact side of the three-node horizontal access device structure. As such, for convenience, and not by way of limitation, the discussion will refer to the second source/drain as a digit line contact conductive material.

As shown in FIGS. 14A and 14B, the method can include depositing a first digit line contact conductive material 1475-2 in electrical contact with the conductive channel material, e.g., channel material 1398 described in connection with FIGS. 13A-13D, the conductive channel material being in electrical contact with the third conductive material 1375-1 to the earlier formed source/drain integration, e.g., first source/drain region. In one example, depositing the first digit line contact conductive material 1475-2 comprises depositing a degenerate semiconductor material. As used herein, a degenerate semiconductor material is intended to mean a semiconductor material, such as polysilicon, containing a high level of doping with significant interaction between dopants, e.g., phosphorous (P), boron (B), etc. Non-degenerate semiconductors, by contrast, contain moderate levels of doping, where the dopant atoms are well separated from each other in the semiconductor host lattice with negligible interaction.

In one example, depositing the first digit line conductive material 1475-2 comprises depositing the first digit line conductive material having an electronic bandgap lower than that of a channel material, e.g., 1398 in FIGS. 13A-13D. In one embodiment, depositing the first digit line conductive material 1475-2 comprises depositing a first digit line contact conductive material 1475-2 having a conduction band offset, e.g., offset from an injecting electrode's fermi level (in this example, the digit line 1699 in FIGS. 16A-16D), that is intermediate between a conduction band offset of the conductive channel material 1498 and that of a subsequent digit line contact conductive material.

In some embodiments, the first digit line contact conductive material 1475-2 may comprise at least one of indium oxide ($In_2O_3$) or indium tin oxide ($In_{2-x}Sn_xO_3$). The digit line contact conductive material 1475-2 may have an electronic bandgap that is higher than that of a subsequent digit line contact conductive material, e.g., digit line contact conductive material 1573-2 shown in connection with FIGS. 15A-15D, and a conduction band offset that is higher than that of the subsequent digit line contact conductive material. In some embodiments, the electronic bandgap of the first digit line contact conductive material 1475-2 may be intermediate between that of the conductive channel material, e.g., 1398 in FIGS. 13A-13D, and a subsequent digit line contact conductive material formed in electrical contact with the first digit line conductive material 1475-2.

In one example depositing the first digit line contact conductive material 1475-2 comprises depositing a metal material, e.g., layer, which forms a conductive oxide in contact with an oxide semiconductor material. For example, in one embodiment, depositing the first digit line contact conductive material 1475-2 comprises depositing a highly doped degenerate semiconductor. In one example, depositing the first digit line contact conductive material 1475-2 comprises depositing an indium oxide ($In_2O_3$) composition as the first digit line contact conductive material 1475-2. In one example, depositing the first digit line contact conductive material 1475-2 comprises depositing an indium tin oxide ($In_{2-x}Sn_xO_3$) composition as the first digit line contact conductive material 1475-2. Embodiments, however, are not limited to these examples.

The first digit line contact conductive material 1475-2 may be deposited such that the first digit line contact conductive material 1475-2 fills the entire opening and is deposited on an area beside the opening, e.g., in the first vertical opening 871 in FIG. 8A. FIG. 14B illustrates and end-on view of the three-node horizontal access device formation at this particular stage the semiconductor fabrication process.

In one example, depositing the first digit line contact conductive material 1475-2 comprises using an ALD process to fill the first horizontal opening. As shown in FIGS. 14A and 14B, the ALD deposition process of the first digit line contact conductive material 1475-2 may also fill the first vertical opening. In some embodiments, the digit line contact conductive material 1475-2 may have a composition which comprises one or more of an In, Zn, and a Ga combination in a varying ratio or a varying stoichiometry to the IGZO channel material.

As shown in FIGS. 14C and 14D, the method includes removing a portion of the first digit line contact conductive material 1475-2 to recess the first conductive contact material. In one example, the removal process may be performed using an ALE process. Embodiments, however, are not limited to this example. In one example, the first digit line contact conductive material 1475-2 may be recessed back in the horizontal opening, 833 of FIG. 8C, to form electrical contact with the conductive channel material and having a thickness of approximately ten (10) nanometers (nm). Embodiments, however, are not limited to this example, and other thickness may by appropriate according to a particular design rule and/or dimensional sizing of the three-node horizontal access devices.

Figures 15A, 15B:
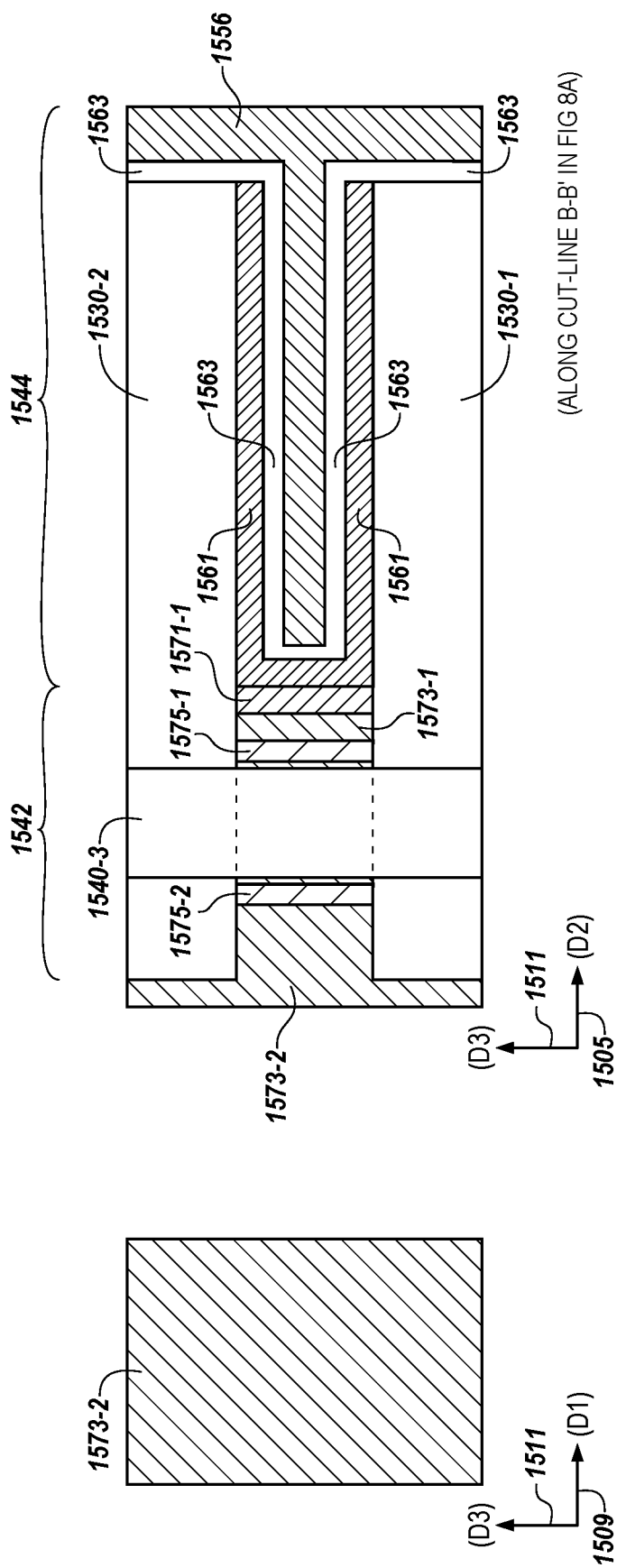

FIGS. 15A-15D illustrate an example method for source/drain integration (e.g., digit line contact conductive material) in three-node horizontally oriented access device, at a particular point in time in a semiconductor fabrication process, in accordance with a number of embodiments of the present disclosure. FIGS. 15A and 15C are cross sectional side views of source/drain integration in a horizontal access device region 1542 after storage node, e.g., capacitor cell, formation in a storage node region 1544 extending in a second direction 1505 (D2), left and right along the plane of the drawing sheet, such as along cut-line B-B' in FIG. 8A. FIGS. 15B and 15D are end-on views of the source/drain integration in the three-node horizontally oriented access device formation, at the particular point in time in a semiconductor fabrication process. According to embodiments at the point in time in a semiconductor fabrication process illustrated in FIGS. 15A-15D may follow next the structure and point in time illustrated in FIGS. 14A-14D. Embodiments, however, are not so limited.

As shown in FIGS. 15A and 15B, the method can include depositing a second digit line contact conductive material 1573-2 in electrical contact with the first digit line contact conductive material 1575, the first digit line contact conductive material 1575 being in electrical contact with the conductive channel material, 1398 in FIGS. 13A-13D. In one example, depositing the second digit line contact conductive material 1573-2 comprises depositing a degenerate semiconductor material. As used herein, a degenerate semiconductor material is intended to mean a semiconductor material, such as polysilicon, containing a high level of doping with significant interaction between dopants, e.g., phosphorous (P), boron (B), etc. Non-degenerate semiconductors, by contrast, contain moderate levels of doping, where the dopant atoms are well separated from each other in the semiconductor host lattice with negligible interaction.

In one example, depositing the second digit line conductive material 1573-2 comprises depositing the second digit line contact conductive material 1573-2 having an electronic bandgap lower than that of first digit line contact conductive material 1575. In one embodiment, depositing the second digit line contact conductive material 1573-2 comprises depositing the second conductive material 1573-2 having a conduction band offset, e.g., offset from the injecting electrode's fermi level (in this example, the digit line 1699 in FIGS. 16A-16D), that is intermediate between a conduction band offset of the first digit line contact conductive material 1575 and that of a subsequent digit line material. Further, in some embodiments, the second digit line contact conductive material 1573-2 may be a metal composition material. In some embodiments, the digit line contact conductive material 1573-2 may comprise at least one of indium oxide ($In_2O_3$) or indium tin oxide ($In_{2-x}Sn_xO_3$). The second digit line contact conductive material 1573-2 may have an electronic bandgap that is higher than that of subsequent digit line material, e.g., digit line material 1699 shown in connection with FIG. 16, and a conduction band offset that is higher than that of the subsequent digit line material.

In one example depositing the second digit line contact conductive material 1573-2 comprises depositing a metal composition material, e.g., layer, which forms a conductive oxide in contact with an oxide semiconductor material. For example, in one embodiment, depositing the second digit line contact conductive material 1573-2 comprises depositing a highly doped degenerate semiconductor. In one example, depositing the second digit line contact conductive material 1573-2 comprises depositing an indium oxide ($In_2O_3$) composition as the second digit line contact conductive material 1573-2. In one example, depositing the second digit line contact conductive material 1573-2 comprises depositing an indium tin oxide ($In_{2-x}Sn_xO_3$) composition as the second digit line contact conductive material 1573-2. Embodiments, however, are not limited to these examples.

The second digit line contact conductive material 1573-2 may be deposited such that the second digit line contact conductive material 1573-2 fills the entire opening and is deposited on an area beside the opening, e.g., in the first vertical opening 871 in FIG. 8A. FIG. 15B illustrates an end-on view of the three-node horizontal access device formation at this particular stage the semiconductor fabrication process.

In one example, depositing the second digit line contact conductive material 1573-2 comprises using an ALD process to fill the first horizontal opening to form electrical contact with a first digit line contact conductive material 1575. As shown in FIGS. 15A and 15B, the ALD deposition process of the second digit line contact conductive material 1573-2 may also fill the first vertical opening.

As shown in FIGS. 15C and 15D, the method includes removing a portion of the second digit line contact conductive material 1573-2 to recess the second digit line contact conductive material 1573-2. In one example, the removal process may be performed using an ALE process. Embodiments, however, are not limited to this example. In one example, the second digit line contact conductive material 1573-2 may be recessed back in the horizontal opening, 833 if FIG. 8C, to form electrical contact with the first digit line contact conductive material 1575-2 and having a thickness of approximately ten (10) nanometers (nm). Embodiments, however, are not limited to this example, and other thickness may by appropriate according to a particular design rule and/or dimensional sizing of the three-node horizontal access devices.

FIGS. 16A-16D illustrate an example method for source/drain integration in a three-node horizontally-oriented access device, at a particular point in time in a semiconductor fabrication process, in accordance with a number of embodiments of the present disclosure. In one example, FIGS. 16A-16D illustrate an example method for forming a digit line contact 1699 to the second digit line contact conductive material. Digit line 1699 may form a horizontally oriented digit line to the three-node horizontally oriented access device analogous to digit lines digit lines, 107, 207, and 307 shown in FIGS. 1-3.

Figures 16A, 16B:
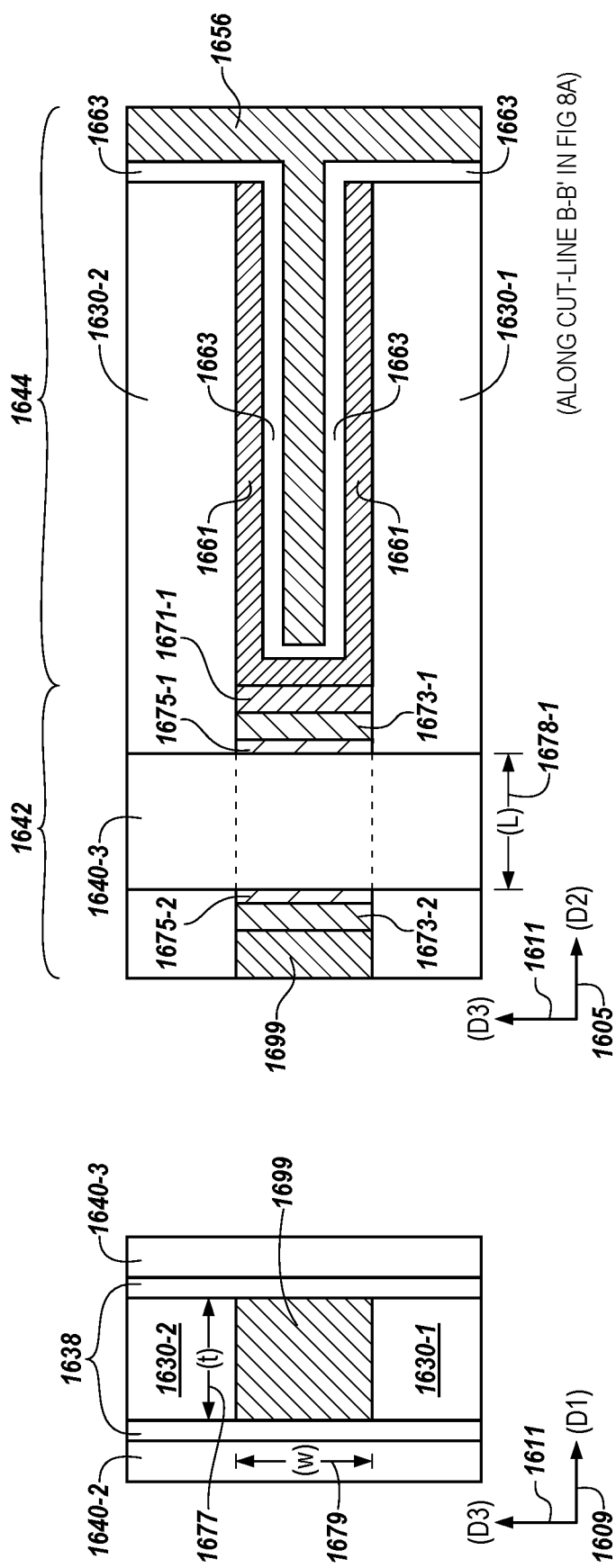

FIGS. 16A and 16C are cross sectional side views of source/drain integration in a horizontal access device region 1642 after storage node, e.g., capacitor cell, formation in a storage node region 1644 extending in a second direction 1605 (D2), left and right along the plane of the drawing sheet, such as along cut-line B-B' in FIG. 8A. FIGS. 16B and 16D are end-on views of the source/drain integration in the three-node horizontally-oriented access device formation, at the particular point in time in a semiconductor fabrication process. According to embodiments, the point in time in a semiconductor fabrication process illustrated in FIGS. 16A-16D may follow next the structure and point in time illustrated in FIGS. 15A-15D. Embodiments, however, are not so limited.

As shown in FIGS. 16A and 16B, the method can include depositing a digit line material 1699 in electrical contact with the second digit line contact conductive material 1673-2, the second digit line contact conductive material 1673-2 being in electrical contact with the first digit line contact conductive material 1675-2. In one example, depositing a digit line material 1699 comprises depositing a metal digit line material 1699.

For example, depositing the digit line material 1699 can comprise depositing a digit line material 1699 containing ruthenium (Ru). In one example, depositing the digit line material 1699 comprises depositing a material containing molybdenum (Mo). In one example, depositing the digit line material 1699 comprises depositing a material containing nickel (Ni). In one example, depositing the digit line material 1699 comprises depositing a material containing titanium (Ti). In one example, depositing the digit line material 1699 comprises depositing a material containing copper (Cu). In one example, depositing the digit line material 1699 comprises depositing a material containing tin (Sn). Embodiments, however, are not limited to these examples.

In one example, depositing the digit line material 1699 comprises using an ALD process to fill the remaining, first horizontal opening, e.g., 833 in FIG. 8C, to form electrical contact with a second digit line contact conductive material 1673-2. As shown in FIGS. 16A-16D, the ALD deposition process of the digit line material 1699 may also fill the first vertical opening, e.g., 871 in FIG. 8A.

In some embodiments, the vertically oriented access line 1640-3 may be formed to have a width (W) 1679 that is greater than a horizontal length (L) 1678, extending horizontally in a second direction (D2) 1605, of the vertically oriented access lines 1640-3. In some embodiments, such as shown in FIG. 16C, the length (L) 1678-2 of the vertically oriented access line 1640-3 may overlap both the multilayer digit line contact conductive material, e.g., 1675-2 and the multilayer source/drain region, e.g., 1675-1 on the cell side, horizontally. In some embodiments, the digit line material 1699 is integrated to form electrical contact with the digit line contact conductive material 1673-2. The vertical access line 1640-3, e.g., wordline (WL), may be integrated opposing the conductive channel material and separated therefrom by a gate dielectric to form the three-node access device for the memory cell without a body contact.

According to the source/drain integration embodiments described herein, the vertically oriented access lines 1640-3, analogous to access lines 103, 203, and 303 shown in FIGS. 1-3, may be formed to have a shorter length 1678-1 (L) due to the materials and techniques providing a lower off-current (Ioff) for the three-node horizontally oriented access device. In the example embodiment shown in FIG. 16A, the vertical access line 1640-3 may have a length 1678-1 (L) that is less than the horizontal length, extending in the second direction (D2) 1605, of the channel material, e.g., channel material 1398 shown in connection with FIG. 13. Hence, the vertically oriented access line 1640-3 may underlap both the multilayer digit line contact conductive material 1675-2 and the Nth layer of a multilayer source/drain region 1675-1 (on the capacitor cell side) horizontally.

FIG. 17 illustrates a three-node horizontally oriented access device 1042 coupled to a horizontally oriented storage node 1744 for vertical three-dimensional (3D) memory, according to embodiments of the present disclosures. In FIG. 17, the three-node horizontally oriented access device 1742 is illustrated extending in a second direction (D2) 1705, left and right in the plane of the drawing sheet. The horizontally oriented access device 1742 is illustrated having a first multilayer source/drain region 1798-1A in electrical contact with a first electrode 1761, e.g., bottom electrode, of the horizontally oriented storage node 1744, e.g., capacitor cell. The storage node 1744 may comprise a capacitor cell having a first horizontally oriented electrode 1761 electrically coupled to the first source/drain region 1798-1A of the three-node access device 1742 and a second electrode 1756 separated from the first horizontally oriented electrode 1761 by a cell dielectric 1763. In some embodiments, the horizontally oriented storage nodes 1744 are in direct electrical contact with the first source/drain regions 1798-1A of the three-node access device 1742 on a same plane, level with the first source/drain region 1798-1A.

A channel region 1798-1B is illustrated in electrical contact with the first source/drain region 1798-1A. A vertically oriented access line 1740-3 opposes the channel region 1798-1B and is separated therefrom by a gate dielectric. The vertically oriented access line 1740-2 is illustrated by dashed lines indicating that the vertically oriented access line is set into and/or out from the plane of the drawing sheet. The vertically oriented access line 1740 may extend longer and/or shorter than the channel region in the second direction (D2) 1705, e.g., having source/drain overlap and/or underlap, according to particular design rules.

A second source/drain region 1798-1C, e.g., multilayer digit line contact conductive material, is illustrated in electrical contact with the channel region 1798-1B and in electrical contact with and integrated to a horizontally oriented digit line 1799 extending into and out from a plane of the drawing sheet. In some embodiments, a first and a second source/drain regions 1798-1A/C may be formed from one or more of an indium (In), a zinc (Zn), and a gallium (Ga) combination in a varying ratio or a varying stoichiometry to the IGZO channel material.

As shown in FIG. 17, the horizontally oriented access device 1742 and horizontally oriented storage node 1744 may be spaced horizontally from neighboring memory cells by an interlayer dielectric material 1780 along the second direction (D2) 1705 and may be spaced vertically from stacked, neighboring cells in a three-dimensional (3D) memory by dielectric layers 1730-1 and 1730-2. In some embodiments, a horizontally oriented digit line 1799 may be integrated to form electrical contact with the multilayer second source/drain region 1798-1C. The multi-layer first source/drain region 1798-1A may include a first conductive material to form electrical contact with a storage node of the three-node access device 1742. In some embodiments, a vertically oriented access line opposing the channel material 1798-1B and separated therefrom by a gate dielectric may be integrated to form the three-node access device 1742 for the memory cell without a body contact. In some embodiments, the horizontally oriented digit lines 1799 are in direct electrical contact with the second source/drain regions 1798-1C of the three-node access devices 1742 on a same plane, level with the second source/drain regions 1798-1C.

Figure 18:
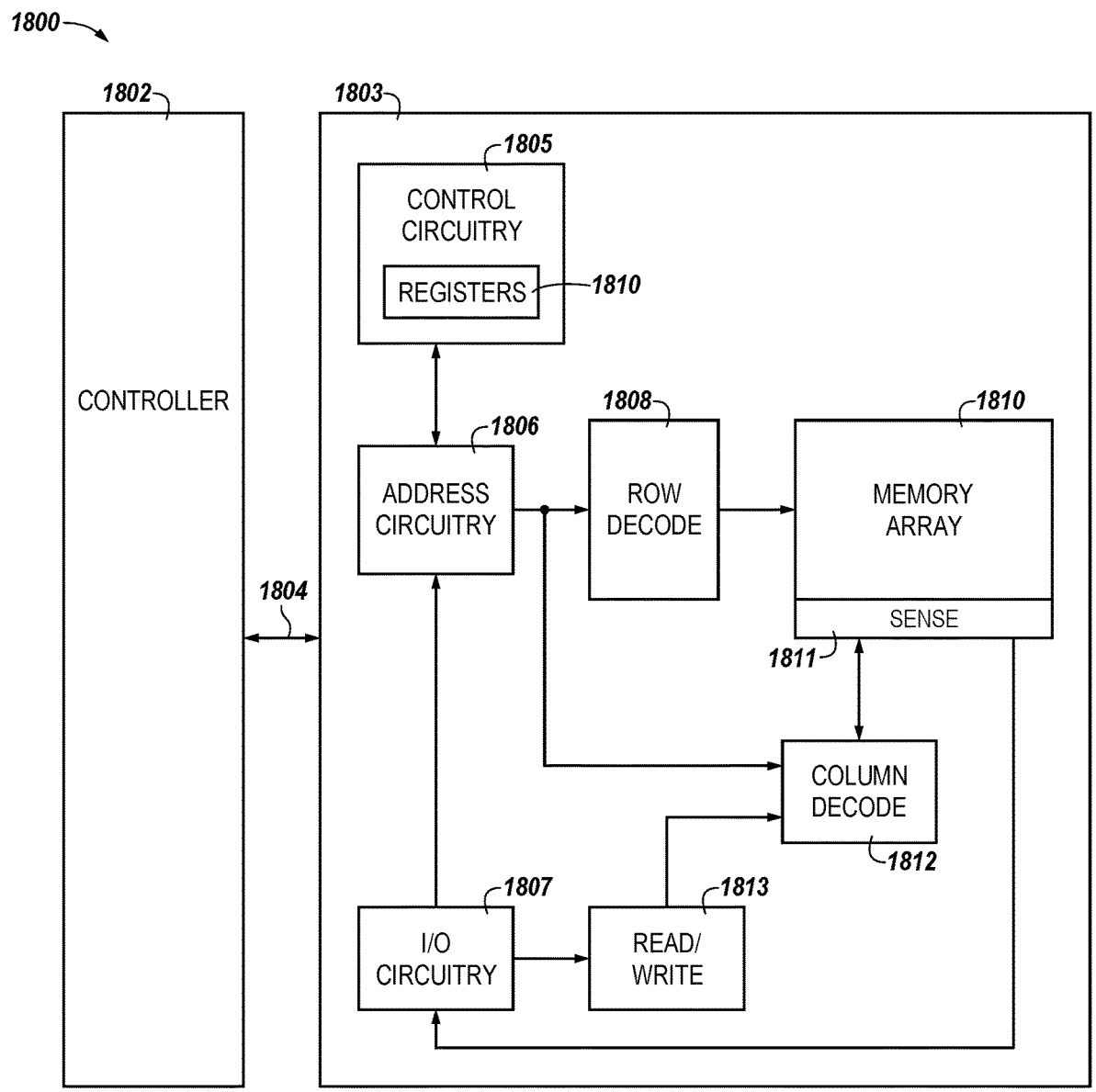
FIG. 18 is a block diagram of an apparatus in the form of a computing system including a memory device in accordance with a number of embodiments of the present disclosure.

FIG. 18 is a block diagram of an apparatus in the form of a computing system 1800 including a memory device 1803 in accordance with a number of embodiments of the present disclosure. As used herein, a memory device 1803, a memory array 1810, and/or a host 1802, for example, might also be separately considered an "apparatus." According to embodiments, the memory device 1802 may comprise at least one memory array 1810 having a three-node access device for vertical three-dimensional (3D) memory, as has been described herein.

In this example, system 1800 includes a host 1802 coupled to memory device 1803 via an interface 1804. The computing system 1800 can be a personal laptop computer, a desktop computer, a digital camera, a mobile telephone, a memory card reader, or an Internet-of-Things (IoT) enabled device, among various other types of systems. Host 1802 can include a number of processing resources (e.g., one or more processors, microprocessors, or some other type of controlling circuitry) capable of accessing memory 1803. The system 1800 can include separate integrated circuits, or both the host 1802 and the memory device 1803 can be on the same integrated circuit. For example, the host 1802 may be a system controller of a memory system comprising multiple memory devices 1803, with the system controller 1805 providing access to the respective memory devices 1803 by another processing resource such as a central processing unit (CPU).

In the example shown in FIG. 18, the host 1802 is responsible for executing an operating system (OS) and/or various applications (e.g., processes) that can be loaded thereto (e.g., from memory device 1803 via controller 1805). The OS and/or various applications can be loaded from the memory device 1803 by providing access commands from the host 1802 to the memory device 1803 to access the data comprising the OS and/or the various applications. The host 1802 can also access data utilized by the OS and/or various applications by providing access commands to the memory device 1803 to retrieve said data utilized in the execution of the OS and/or the various applications.

For clarity, the system 1800 has been simplified to focus on features with particular relevance to the present disclosure. The memory array 1810 can be a DRAM array, SRAM array, STT RAM array, PCRAM array, TRAM array, RRAM array, NAND flash array, and/or NOR flash array, comprising at least one three-node access device for three dimension (3D) memory. For example, the memory array 1810 can be an unshielded DL 4F2 array such as a 3D-DRAM memory array. The array 1810 can comprise memory cells arranged in rows coupled by word lines (which may be referred to herein as access lines or select lines) and columns coupled by digit lines (which may be referred to herein as sense lines or data lines). Although a single array 1810 is shown in FIG. 1, embodiments are not so limited. For instance, memory device 1803 may include a number of arrays 1810 (e.g., a number of banks of DRAM cells).

The memory device 1803 includes address circuitry 1806 to latch address signals provided over an interface 1804. The interface can include, for example, a physical interface employing a suitable protocol (e.g., a data bus, an address bus, and a command bus, or a combined data/address/command bus). Such protocol may be custom or proprietary, or the interface 1804 may employ a standardized protocol, such as Peripheral Component Interconnect Express (PCIe), Gen-Z, CCIX, or the like. Address signals are received and decoded by a row decoder 1808 and a column decoder 1812 to access the memory array 1810. Data can be read from memory array 1810 by sensing voltage and/or current changes on the sense lines using sensing circuitry 1811. The sensing circuitry 1811 can comprise, for example, sense amplifiers that can read and latch a page (e.g., row) of data from the memory array 1810. The I/O circuitry 1807 can be used for bi-directional data communication with the host 1802 over the interface 1804. The read/write circuitry 1813 is used to write data to the memory array 1810 or read data from the memory array 1810. As an example, the circuitry 1813 can comprise various drivers, latch circuitry, etc.

Control circuitry 1805 decodes signals provided by the host 1802. The signals can be commands provided by the host 1802. These signals can include chip enable signals, write enable signals, and address latch signals that are used to control operations performed on the memory array 1810, including data read operations, data write operations, and data erase operations. In various embodiments, the control circuitry 1805 is responsible for executing instructions from the host 1802. The control circuitry 1805 can comprise a state machine, a sequencer, and/or some other type of control circuitry, which may be implemented in the form of hardware, firmware, or software, or any combination of the three. In some examples, the host 1802 can be a controller external to the memory device 103. For example, the host 1802 can be a memory controller which is coupled to a processing resource of a computing device.

The term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor can include the underlying materials containing such regions/junctions.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical can correspond to the z-direction. As used herein, when a particular element is "adjacent to" another element, the particular element can cover the other element, can be over the other element or lateral to the other element and/or can be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method for forming arrays of vertically stacked memory cells, having horizontally oriented access devices and vertically oriented access lines, comprising:
   depositing alternating layers of a dielectric material and a sacrificial material to form a vertical stack;
   forming a plurality of first vertical openings, having a first horizontal direction and a second horizontal direction, through the vertical stack to the substrate and extending predominantly in the second horizontal direction to form elongated vertical, pillar columns with sidewalls in the vertical stack;
   conformally depositing a gate dielectric in the plurality of first vertical openings;
   forming a conductive material on the gate dielectric;
   removing portions of the conductive material to form a plurality of separate, vertical access lines along the sidewalls of the elongated vertical, pillar columns;
   repairing a first side of the gate dielectric exposed where the conductive material was removed;
   forming a second vertical opening through the vertical stack and extending predominantly in the first horizontal direction to expose sidewalls adjacent a first region of the sacrificial material;
   selectively removing the sacrificial material in the first region a first horizontal distance from the second vertical opening to form first horizontal openings; and
   depositing a first source/drain region, a channel region, and a second source/drain region in the first horizontal openings.

2. The method of claim 1, wherein repairing the first side of the gate dielectric exposed where the conductive material was removed comprises:
   ionizing oxygen or oxygen containing species or mixes of gases in ratios that preferentially repair the gate dielectric while minimizing oxidation of the plurality of separate, vertical access lines.

3. The method of claim 1, further comprising performing a surface treatment on the gate dielectric to deposit a liner thereon, the liner having combinations that provide a mix of molecular oxygen and ionized species.

4. The method of claim 3, wherein performing the surface treatment comprises performing the surface treatment in temperatures ranging from about 150 degrees Celsius (° C.) to 600° C.

5. The method of claim 1, wherein repairing the first side of the gate dielectric comprises pulsing an ionized metal atom, used to form the gate dielectric, into contact with a surface of the first side by plasma vapor deposition to return the first side of the gate dielectric to an intended stoichiometry.

6. The method of claim 1, wherein repairing the first side of the gate dielectric comprises flowing ozone to react with a surface on the first side while limiting ozone interaction with the conductive material the forms the plurality of separate, vertical access lines.

7. The method of claim 1, further comprising repairing a second side of the gate dielectric exposed where the sacrificial material was removed in the first region.

8. The method of claim 1, further comprising using an atomic layer deposition (ALD) process to sequentially deposit:
   the source/drain region;
   the channel region; and
   the second source/drain region of the three-node access device.

9. A method for forming arrays of vertically stacked memory cells, having horizontally oriented access devices and vertically oriented access lines, comprising:
   depositing alternating layers of a dielectric material and a sacrificial material to form a vertical stack;
   forming a plurality of first vertical openings, having a first horizontal direction and a second horizontal direction, through the vertical stack and extending predominantly in the second horizontal direction to form elongated vertical pillar columns with sidewalls in the vertical stack;
   conformally depositing a gate dielectric in the plurality of first vertical openings;
   forming a conductive material on the gate dielectric;
   removing portions of the conductive material to form a plurality of separate, vertical access lines;
   repairing a first side of the gate dielectric exposed where the conductive material was removed;
   forming a second vertical opening through the vertical stack and extending predominantly in the first horizontal direction to expose sidewalls adjacent a first region of the sacrificial material;
   selectively removing the sacrificial material in the first region a first horizontal distance from the second vertical openings to form first horizontal openings;
   repairing a second side of the gate dielectric exposed where the sacrificial material was removed in the first region; and
   sequentially depositing a first source/drain region, a channel region, and a second source/drain region in the first horizontal opening to form a horizontally oriented three-node access device.

10. The method of claim 9, further comprising repairing the second side of the gate dielectric from within the first horizontal openings prior to sequentially depositing the first source/drain region, a channel region, and a second source/drain region in the first horizontal opening.

11. The method of claim 9, wherein repairing the second side of the gate dielectric comprises repairing surface bond terminations on a surface of the second side of the gate dielectric.

12. The method of claim 11, wherein repairing surface bond terminations comprises flowing a mix of molecular oxygen and ionized species to a surface of the second side at temperatures ranging from about 150 degrees Celsius (° C.) TO 600° C.

13. The method of claim 9, wherein repairing the second side of the gate dielectric comprises flowing ionized gases or precursors, oxygen or oxygen containing species or mixes of gases to a surface of the second side in ratios that preferentially repair the second side while minimizing oxidation of materials used to form the first electrode.

14. The method of claim 9, wherein repairing the second side of the gate dielectric comprises pulsing an ionized metal atom, used in depositing the gate dielectric, to a surface of the second side by plasma vapor deposition to return the gate dielectric to an intended stoichiometry and intended surface bond terminations.

15. A method for forming arrays of vertically stacked memory cells, having horizontally oriented access devices and vertically oriented access lines, comprising:
    depositing alternating layers of a dielectric material and a sacrificial material to form a vertical stack
    forming a plurality of first vertical openings, having a first horizontal direction and a second horizontal direction, through the vertical stack and extending predominantly in the second horizontal direction to form elongated vertical, pillar columns with sidewalls in the vertical stack;
    conformally depositing a gate dielectric material in the plurality of first vertical openings;
    forming a conductive material on the gate dielectric;
    removing portions of the conductive material to form a plurality of separate, vertical access lines along the sidewalls of the elongated vertical, pillar columns;
    repairing a first side of the gate dielectric material exposed where the conductive material was removed;
    forming a second vertical opening through the vertical stack and extending predominantly in the first horizontal direction to expose sidewalls adjacent a first region of the sacrificial material;
    selectively removing the sacrificial material in the first region a first horizontal distance from the second vertical openings to form first horizontal openings to a first electrode in a second region of the vertical stack;
    repairing a second side of the gate dielectric exposed where the sacrificial material was removed in the first region;
    repairing a surface of the first electrode in the second region; and
    depositing a first source/drain region, a channel region, and a second source/drain region in the first horizontal openings.

16. The method of claim 15, further comprising:
    forming a third vertical opening through the vertical stack and extending predominantly in the first horizontal direction to expose sidewalls adjacent a second region of the sacrificial material;
    selectively removing the sacrificial material in the second region a second horizontal distance from the third vertical openings to form second horizontal openings; and
    depositing the first electrode, a dielectric material, and a second electrode to form a storage node in the second region.

17. The method of claim 15, wherein repairing the surface of the first electrode in the second region comprises repairing surface bond terminations of the surface of the first electrode from within the first horizontal openings prior to sequentially depositing the first source/drain region, a channel region, and a second source/drain region in the first horizontal opening.

18. The method of claim 15, wherein repairing the surface of the first electrode in the second region comprises flowing precursors to contact the surface of the first electrode, using an atomic layer deposition (ALD) process, to prepare the surface of the first electrode before flowing a mixture of gases to contact the surface as treatment to restore a conductive quality of the surface of the first electrode.

19. The method of claim 18, wherein the precursors comprises compounds of silane, hydroxyl, ethyl, methyl, or oxysilane.

20. The method of claim 18, wherein the mixture of gases comprises at least one of hydrogen ($H_2$), oxygen ($O_2$), nitrogen ($N_2$), helium (He), silane, carbonyl, metal organics, peroxide, forms of hydrazine, ammonia ($NH_3$), and/or a halide generated by thermal energy, plasma energy, or microwave energy sources.

21. The method of claim 15, wherein repairing the surface of the first electrode in the second region comprises reducing the surface of the first electrode to remove metal oxide therefrom before sequentially depositing the first source/drain region, a channel region, and a second source/drain region in the first horizontal opening.

22. The method of claim 21, wherein reducing the surface of the first electrode to remove metal oxide therefrom comprises flowing ionized hydrogen, ammonia, forms of hydrazine or derivatives thereof, as well as mixes with molecular forms, in contact with the surface.

23. The method of claim 15, wherein repairing the second side of the gate dielectric and the surface of the first electrode comprises performing the repair ex-situ, frame in-situ, or chamber in-situ with the deposition of the first source/drain region, a channel region, and a second source/drain region in the first horizontal opening.

* * * * *